(12) United States Patent
Glover

(10) Patent No.: US 12,331,586 B2
(45) Date of Patent: Jun. 17, 2025

(54) DOOR ASSEMBLY AND COMPONENTS FOR PROVIDING ELECTROMAGNETIC COMPATIBILITY (EMC) SHIELDING

(71) Applicant: AADG, INC., New Haven, CT (US)

(72) Inventor: Daniel Brian Glover, Franklin, TN (US)

(73) Assignee: AADG, INC., New Haven, CT (US)

( * ) Notice: Subject to any disclaimer, the term of this patent is extended or adjusted under 35 U.S.C. 154(b) by 10 days.

(21) Appl. No.: 18/228,182

(22) Filed: Jul. 31, 2023

(65) Prior Publication Data

US 2024/0044202 A1 Feb. 8, 2024

Related U.S. Application Data

(60) Provisional application No. 63/394,817, filed on Aug. 3, 2022.

(51) Int. Cl.
*E06B 7/22* (2006.01)
*E06B 5/18* (2006.01)

(52) U.S. Cl.
CPC . *E06B 7/22* (2013.01); *E06B 5/18* (2013.01)

(58) Field of Classification Search
None
See application file for complete search history.

(56) References Cited

U.S. PATENT DOCUMENTS

| | | | | |
|---|---|---|---|---|
| 1,695,073 A | * | 12/1928 | Wirfs, Jr. | E06B 7/22 280/153.5 |
| 1,883,815 A | * | 10/1932 | Nolan | E06B 7/22 49/490.1 |
| 2,608,728 A | * | 9/1952 | Montgomery | B61D 19/00 49/506 |
| 3,055,969 A | * | 9/1962 | Schaller, Jr. | E05G 1/04 174/371 |
| 4,145,827 A | * | 3/1979 | Katsufrakis | A47G 1/065 40/729 |

(Continued)

FOREIGN PATENT DOCUMENTS

| | | | |
|---|---|---|---|
| CH | 663445 A5 | * | 12/1987 |
| EP | 0265676 A1 | * | 5/1988 |

(Continued)

*Primary Examiner* — Catherine A Kelly
(74) *Attorney, Agent, or Firm* — Moore & Van Allen PLLC; Jeffrey R. Gray

(57) ABSTRACT

A door assembly provides EMC shielding to provide EMI/RFI protection. The door assembly has an EMC door frame, an EMC door, and EMC seals for maintaining a circuit between the door frame, the floor (e.g., threshold, flooring, etc.), and/or the door. The door assembly may also utilize one or more EMC elements (e.g., EMC tape, paint, adhesive, coatings, caulk, etc.) that may be used to create the circuits between the components of the door assembly and/or with other components of the building (e.g., between the door frame and the wall). The EMC shielding is used to reduce (e.g., limit, block, etc.) the levels of electrogenic interference (EMI)/radio frequency interference (RFI) radiation that is able to pass by the shielding. Moreover, the door assembly also provides improve additional door assembly performance (e.g., sound, weather, air flow, heat, cold, or the like abatement, energy harvesting, or other performance benefits).

17 Claims, 49 Drawing Sheets

(56) References Cited

U.S. PATENT DOCUMENTS

| | | | | |
|---|---|---|---|---|
| 4,520,562 A * | 6/1985 | Sado | ................... | B29C 70/885 |
| | | | | 439/492 |
| 4,691,483 A * | 9/1987 | Anderson | ................. | E04H 9/10 |
| | | | | 49/400 |
| 4,705,916 A * | 11/1987 | Wadhera | ............. | H05K 9/0015 |
| | | | | 361/818 |
| 4,716,683 A * | 1/1988 | Minter | ................. | E06B 7/2316 |
| | | | | 49/489.1 |
| 4,760,214 A * | 7/1988 | Bienia | ................. | H05K 9/0016 |
| | | | | 174/368 |
| 4,786,758 A * | 11/1988 | Zielinski | ............. | H05K 9/0016 |
| | | | | 174/388 |
| 4,910,920 A * | 3/1990 | Nichols | ............... | H05K 9/0016 |
| | | | | 49/495.1 |
| 5,045,636 A * | 9/1991 | Johnasen | ............ | C07K 14/811 |
| | | | | 174/375 |
| 5,097,885 A * | 3/1992 | Kitagawa | ................. | E06B 9/24 |
| | | | | 160/84.01 |
| 5,241,132 A * | 8/1993 | McCormack | ........... | E06B 7/232 |
| | | | | 174/368 |
| 6,294,729 B1 * | 9/2001 | Kaplo | ................. | H05K 9/0016 |
| | | | | 174/394 |
| 6,519,899 B1 * | 2/2003 | Hurzeler | ............. | H05K 9/0001 |
| | | | | 49/504 |
| 6,992,246 B2 * | 1/2006 | Christou | ............. | H05K 9/0001 |
| | | | | 174/374 |
| 7,498,524 B2 * | 3/2009 | Brench | ................ | H05K 9/0016 |
| | | | | 174/355 |
| 7,624,538 B2 * | 12/2009 | Hautmann | ........... | H05K 9/0015 |
| | | | | 277/921 |
| 7,870,701 B2 * | 1/2011 | Tammaro | ............... | F16J 15/064 |
| | | | | 49/501 |
| 8,677,688 B2 * | 3/2014 | Skibinski | ................ | E06B 7/16 |
| | | | | 49/501 |
| 8,925,251 B1 * | 1/2015 | Rust | ......................... | E06B 7/18 |
| | | | | 49/495.1 |
| 9,447,629 B2 * | 9/2016 | Schlueter | ............. | E06B 7/2312 |
| 9,617,783 B2 * | 4/2017 | Yahata | ................... | F16J 15/027 |
| 10,537,048 B2 * | 1/2020 | Bodette | ............... | H05K 9/0088 |
| 10,612,293 B1 * | 4/2020 | Nordgaard | ........... | E06B 3/2605 |
| 10,701,847 B2 * | 6/2020 | Kato | ........................ | H05B 6/76 |
| 11,277,947 B2 * | 3/2022 | Warnock | .................. | A61N 5/10 |
| 11,352,822 B2 * | 6/2022 | Brown | .................... | E05F 1/063 |
| 11,499,366 B1 * | 11/2022 | Palmer | ..................... | E06B 1/70 |
| 11,767,707 B2 * | 9/2023 | Warnock | ................. | E06B 5/18 |
| | | | | 49/307 |
| 11,980,300 B2 * | 5/2024 | Eget | ....................... | A47F 3/0482 |
| 2007/0007037 A1 * | 1/2007 | Diaferia | ............... | H05K 9/0001 |
| | | | | 174/382 |
| 2009/0084041 A1 * | 4/2009 | Foster | ...................... | E06B 7/23 |
| | | | | 156/60 |
| 2016/0176497 A1 * | 6/2016 | Coppola | ................ | B64D 37/04 |
| | | | | 174/358 |
| 2020/0275586 A1 * | 8/2020 | Warnock | .............. | H05K 9/0003 |
| 2023/0167672 A1 * | 6/2023 | Nau | ........................ | E06B 7/14 |
| | | | | 52/209 |

FOREIGN PATENT DOCUMENTS

| | | | | |
|---|---|---|---|---|
| EP | 0328952 A1 * | 8/1989 | | |
| EP | 0486886 A1 * | 5/1992 | | |
| FR | 2636666 A1 * | 3/1990 | | |
| GB | 2194579 A * | 3/1988 | .............. | E06B 5/18 |
| KR | 20160027435 A * | 3/2016 | | |
| SE | 1050492 A1 * | 11/2011 | | |
| WO | WO-2004053275 A1 * | 6/2004 | .............. | E06B 7/22 |
| WO | WO-2005106153 A1 * | 11/2005 | .............. | B41M 3/00 |
| WO | WO-2009049627 A1 * | 4/2009 | .............. | A47G 1/17 |

* cited by examiner

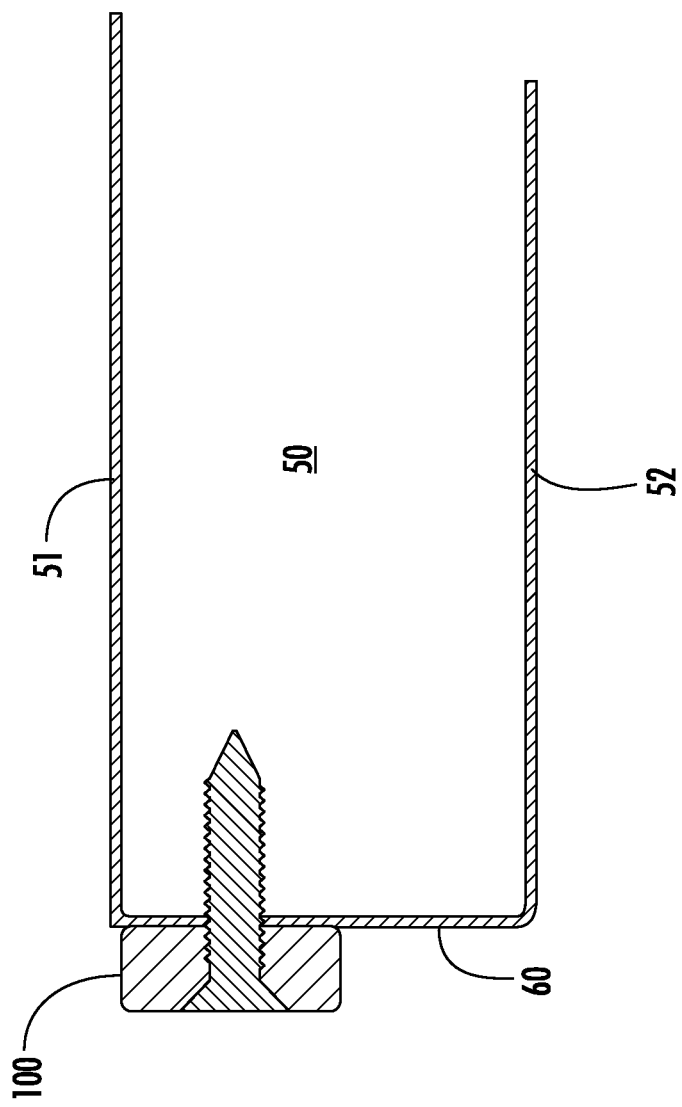

DOOR ASSEMBLY AND COMPONENTS FOR PROVIDING ELECTROMAGNETIC COMPATIBILITY (EMC) SHIELDING

CROSS REFERENCE AND PRIORITY CLAIM UNDER 35 U.S.C. § 119

This application claims priority to U.S. Provisional Application No. 63/394,817 entitled "DOOR ASSEMBLY AND COMPONENTS FOR PROVIDING ELECTROMAGNETIC COMPATIBILITY (EMC) SHIELDING" filed on Aug. 3, 2022, which is assigned to the assignee hereof and the entirety of which is incorporated by reference herein.

FIELD

Embodiments of the present disclosure generally relate to electromagnetic compatibility (EMC) shielding that provides electromagnetic interference (EMI)/radio frequency interference (RFI) shielding, and more particularly, to a door assembly that provides EMC shielding between an ingress and egress area of structure, including structures that may or may not include fenestration.

BACKGROUND

Electronic technology is expanding. All electronic devices, including computer systems, such as mobile devices, servers, and/or other computer systems, and/or used within other equipment, which may be used in commercial, industrial, personal, and/or military applications, radiate certain frequencies of digital signals, and magnetic and radio wave signals through the air. The signals can be received by surveillance equipment, which potentially compromise privacy, or such signals may affect or interfere with other equipment in the vicinity.

SUMMARY

As will be described herein, embodiments of the invention comprise a door assembly (e.g., with or without fenestration of windows) that provides EMC shielding to provide EMI/RFI protection. The door assembly (e.g., EMC door assembly) may comprise a door frame (e.g., otherwise described as an EMC door frame, or the like), a door (e.g., otherwise described as an EMC door, or the like), conductive seals (e.g., otherwise described as EMC seals, or the like) for completing circuits (e.g., for providing EMC shielding protection) between the door frame, floor (e.g., threshold, flooring, or the like), and/or door. The EMC door assembly may further have windows and window framing, sidelights, borrowed lights, transoms, or the like, which includes transparent material (e.g., glass, or the like) that may also have EMC shielding. The EMC door assembly may further comprise one or more EMC elements (e.g., EMC tape, fabrics, mesh, paint, adhesive, coatings, caulk, glazing, or the like) that may be used to create the circuits (e.g., EMC shielding circuits) between the components of the door assembly and/or with other components of the building (e.g., between the door frame, wall, ceiling, floor, or the like).

The door assembly described herein provides electromagnetic compatibility (EMC) shielding between two areas of a structure. It should be understood that EMC shielding is used to reduce (e.g., limit, block, or the like) the levels of electrogenic interference (EMI)/radio frequency interference (RFI) radiation that is able to pass by the shielding. While EMI and RFI are often used interchangeably, EMI covers any frequency of electrical noise, while RFI is a specific subset of electrical noise within the radio frequency spectrum. As such, the EMC shielding may be used within building enclosures to reduce the transmission of electric or magnetic fields from one area to another. In particular, the EMC shielding provides improved security by reducing interference with electrical devices (e.g., telecommunications, hospital equipment, or the like) and reduces unauthorized surveillance of sensitive electronic data (e.g., confidential information, trade secrets, personal identifiable information (PII), health information, or the like). Specifically, the EMC door assembly of the present disclosure may be designed to provide EMC shielding effectiveness (SE) of 40-100+ dB per IEEE 299-2006 (9 kHz-18 GHz) (as of the date of this filing, or potentially as updated in the future) and may be used in any commercial, industrial, or governmental applications, such as NSA, Military Standards, Transient Electromagnetic Pulse Emanation (TEMPEST) standard applications depending on project requirements, which limits electric or electromagnetic radiation. The EMC door assembly of the present disclosure provides improved structures, materials, assembly processes, or like, or combinations thereof to enhance the EMC shielding performance, and in some embodiments, to improve additional door assembly performance (e.g., sound, weather, air flow, heat, or the like abatement, fire ratings, energy harvesting, or other performance benefits).

Embodiments of the invention comprise a door assembly for providing electromagnetic compatibility (EMC) shielding. The door assembly comprises a door frame operatively coupled to a door opening and a door comprising a first face, a second face, and edges between the faces, wherein one edge is operatively coupled to the door frame. The door assembly further comprises a seal assembly comprising one or more EMC seals operatively coupled to the door frame or the door.

In further accord with embodiments, the seal assembly comprises a gasket seal assembly and the one or more EMC seals comprise one or more EMC gasket seals.

In other embodiments, the EMC gasket seal comprises a cover, wherein the cover comprises a fabric made of an EMC material, and a core, wherein the core comprises a foam core. The cover is operatively coupled over the core.

In yet other embodiments, the cover is operatively coupled to the core through a heat shrink adhesive.

In still other embodiments, the one or more EMC seals comprise two or more EMC seals. The two or more EMC seals comprise a first EMC seal comprising a proximal end having a first notch extending at least partially into a first body of the first EMC seal. The two or more EMC seals further comprise a second EMC seal comprising at least one distal end having a second notch extending at least partially into the second EMC seal. The first notch of the first EMS seal receives a second body portion of the second EMC seal and the second notch of the second EMC seal receives a first body portion of the second EMC seal. The first EMC seal and the second EMC seal overlap to aid in restricting separation of the first EMC seal and the second EMC seal when compressed.

In other embodiments, the one or more EMC seals comprise two or more EMC seals, wherein the two or more seals comprise a first EMC seal comprising a first projection extending from a first body and a second EMC seal comprising a second projection extending from a second body.

In further accord with embodiments, the one or more EMC seals comprise one or more primary EMC seals, and wherein the gasket seal assembly further comprises one or more secondary EMC seals comprising a mount gasket leg, and a flexible gasket leg operatively coupled to the mount gasket leg. The mount portion of the mount gasket leg contacts a portion of the one or more primary EMC seals, and a flexible portion of the flexible gasket leg contacts another portion of the one or more primary EMC seals when the door is closed. Two points of contact are created between the one or more primary EMC seals and the one or more secondary EMC seals.

In other embodiments, the one or more secondary EMC seals comprise a first secondary EMC seal, and a second secondary EMC seal. A portion of the first secondary EMC seal overlaps a portion of the second secondary EMC seal.

In still other embodiments, the one or more secondary EMC seals comprise a secondary EMC seal having a mitered notch. The secondary EMC seal is bent around the mitered notch to form a continuous secondary EMC seal.

In yet other embodiments, the seal assembly comprises a finger seal assembly and wherein the one or more EMC seals comprise one or more finger stock seals.

In other embodiments, the one or more EMC finger stock seals comprise at least one EMC composite seal comprising an EMC finger stock seal, and an inner seal located within at least a portion of the EMC finger stock seal.

In further accord with embodiments, the EMC composite seal is used as an EMC threshold seal between the door and a threshold.

In other embodiments the inner seal comprises an o-seal, an oval seal, a D-shaped seal, a square seal, or a rectangle seal.

In yet other embodiments, the EMC finger stock seal comprises a first finger leg, and a second finger leg. The first finger leg and the second finger leg are operatively coupled at one end to form a V-shaped seal.

In still other embodiments the second finger leg comprises a plurality of fingers that create a plurality of slits between adjacent fingers, wherein the plurality of fingers are configured to flex with respect to each other.

In other embodiments the EMC finger stock seal further comprises a third finger leg extending from the second finger leg to form a triangular shaped finger stock seal with an opening formed by the end of the third finger leg and the end of the first finger leg.

In further accord with embodiments, the door assembly provides EMC shielding effectiveness of 40-100 dB per IEEE 299-2006 (9 k-z-18 GHz).

Other embodiments of the invention comprise a seal assembly for providing electromagnetic compatibility shielding (EMC) to a door assembly. The seal assembly comprises one or more EMC gasket seals comprising a cover, wherein the cover comprises a fabric made of an EMC material, and a core, wherein the core comprises a foam core. The cover is operatively coupled over the core, and the door assembly comprises a door frame operatively coupled to a door opening, and a door comprising a first face, a second face, and edges between the faces, wherein the door is operatively coupled to the door frame, and wherein seal assembly is configured to be operatively coupled to the door frame or the door.

In other embodiments, the one or more EMC seals comprise two or more EMC seals, wherein the two or more EMC seals comprise a first EMC seal and a second EMC steal. The first EMC seal comprises a proximal end having a first notch extending at least partially into a first body of the first EMC seal. The second EMC seal comprises at least one distal end having a second notch extending at least partially into the second EMC seal. The first notch of the first EMS seal receives a second body portion of the second EMC seal and the second notch of the second EMC seal receives a first body portion of the second EMC seal. The first EMC seal and the second EMC seal overlap to aid in restricting separation of the first EMC seal and the second EMC seal when compressed.

Another embodiment of the invention is a method of installing a door assembly that provides electromagnetic compatibility (EMC) shielding. The method comprises installing a door frame to a door opening, installing a door to the door frame, wherein the door comprises a first face, a second face, and edges between the faces, wherein the door is configured to be operatively coupled to the door frame. The method further comprises installing a seal assembly comprising one or more EMC seals to the door frame or the door.

To the accomplishment the foregoing and the related ends, the one or more embodiments comprise the features hereinafter described and particularly pointed out in the claims. The following description and the annexed drawings set forth certain illustrative features of the one or more embodiments. These features are indicative, however, of but a few of the various ways in which the principles of various embodiments may be employed, and this description is intended to include all such embodiments and their equivalents.

BRIEF DESCRIPTION OF THE DRAWINGS

Having thus described embodiments of the invention in general terms, reference will now be made to the accompanying drawings.

Figure 1A:
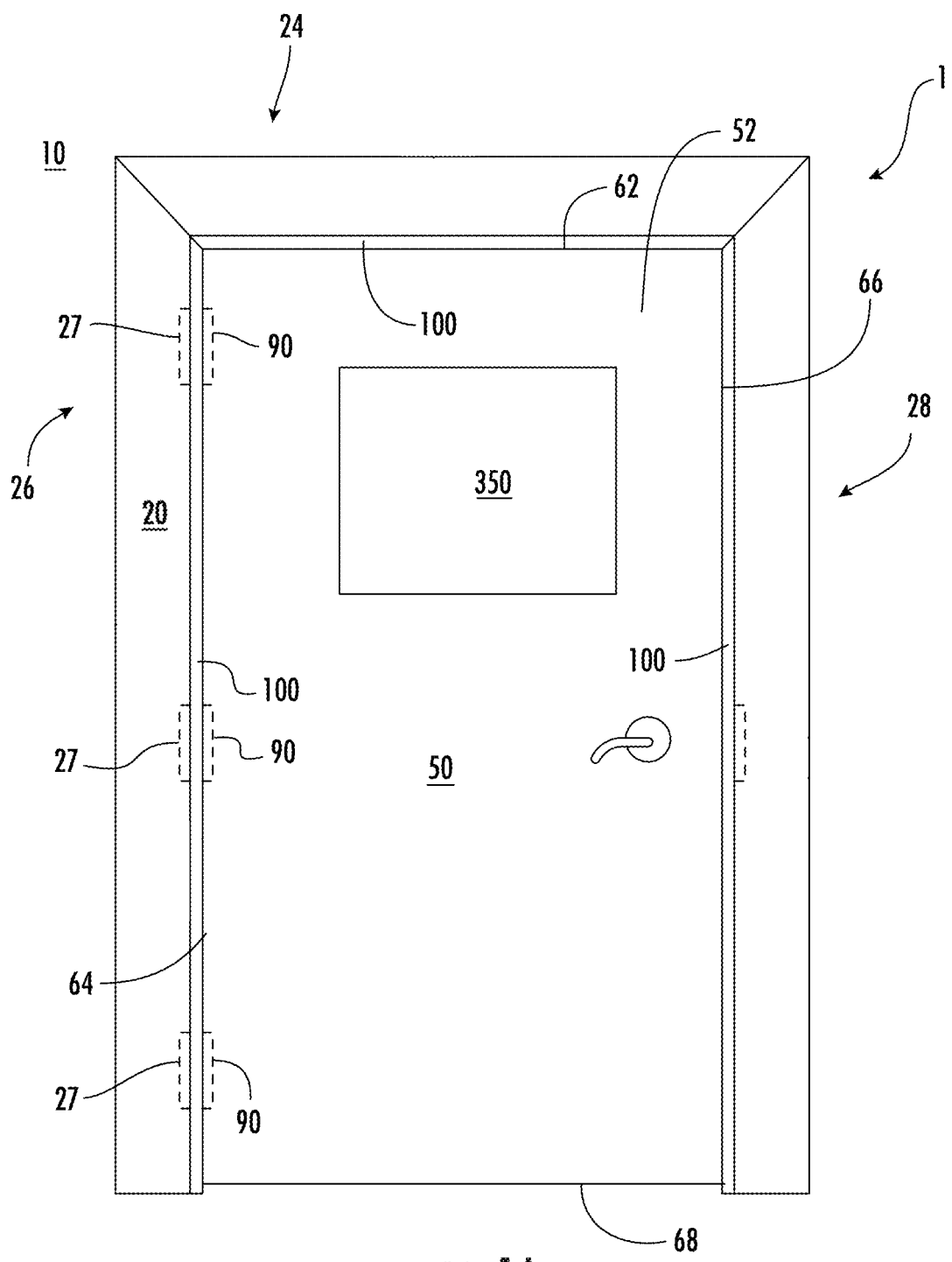

FIG. 1A is front view of one side of the door assembly, in accordance with some embodiments of the present disclosure.

Figure 1B:
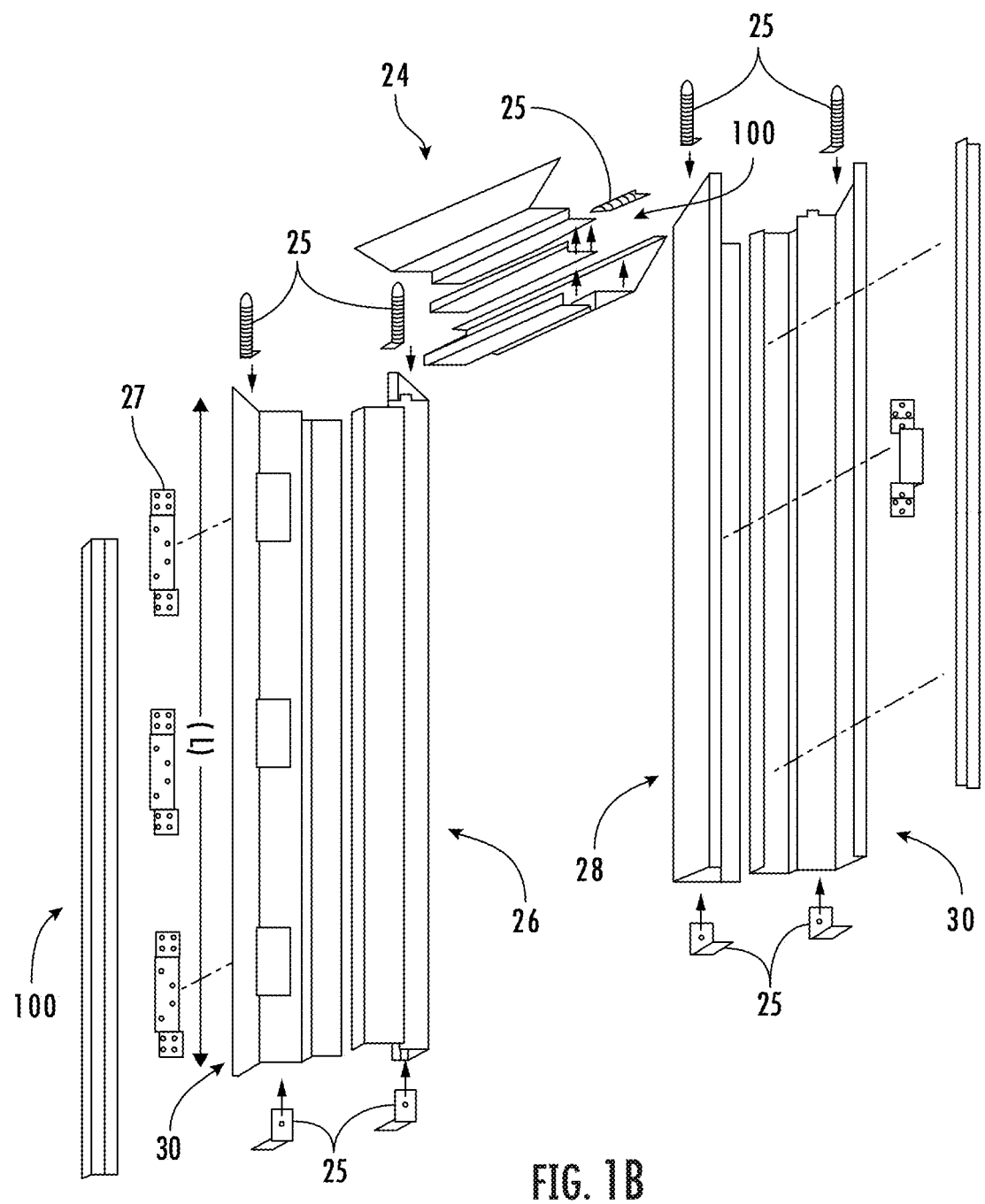

FIG. 1B is an exploded perspective view of a portion of a door frame of the door assembly, in accordance with some embodiments of the present disclosure.

Figure 1C:
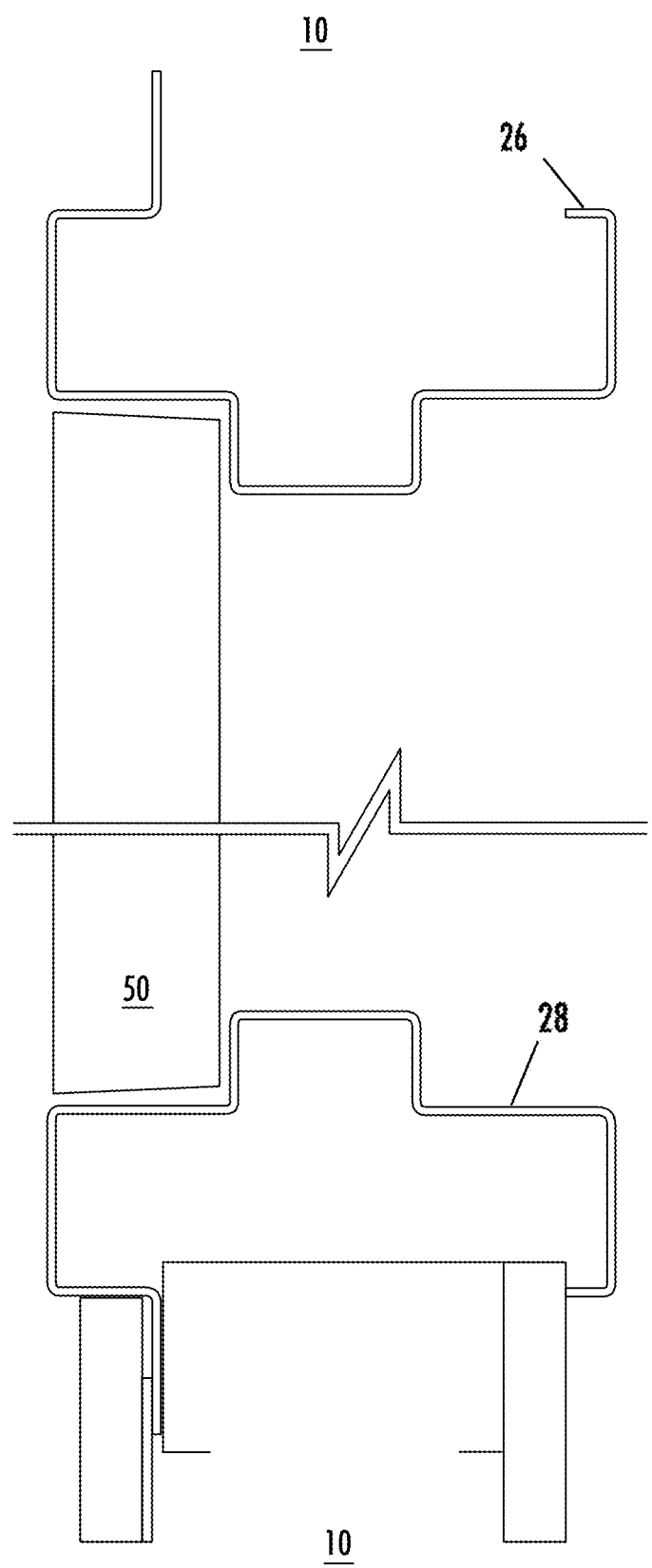

FIG. 1C is a horizontal cross-sectional view of the door assembly, in accordance with embodiments of the present disclosure.

Figure 1D:
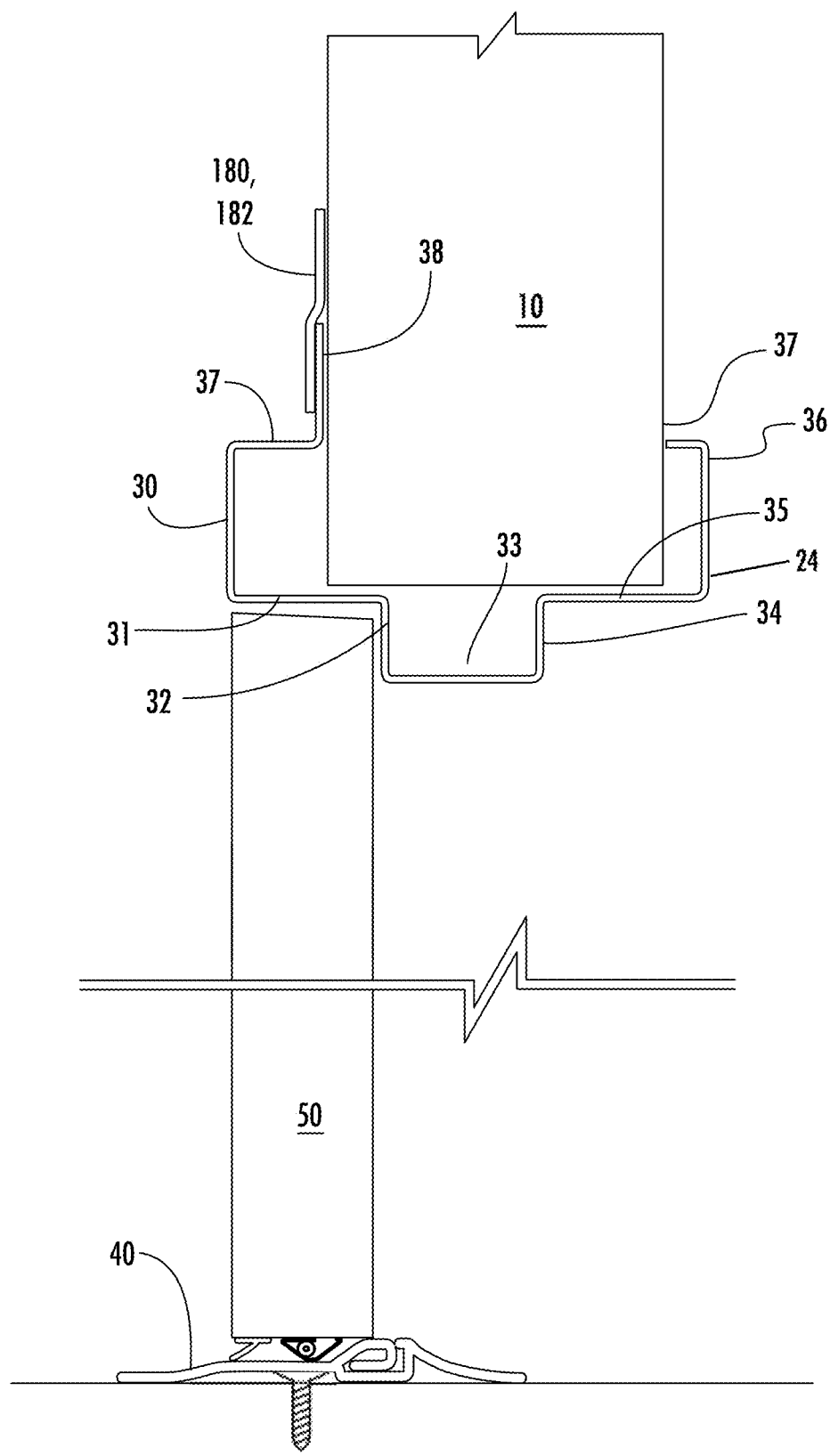

FIG. 1D is a vertical cross-sectional view of the door assembly with the addition of a threshold, in accordance with embodiments of the present disclosure.

Figure 1E:
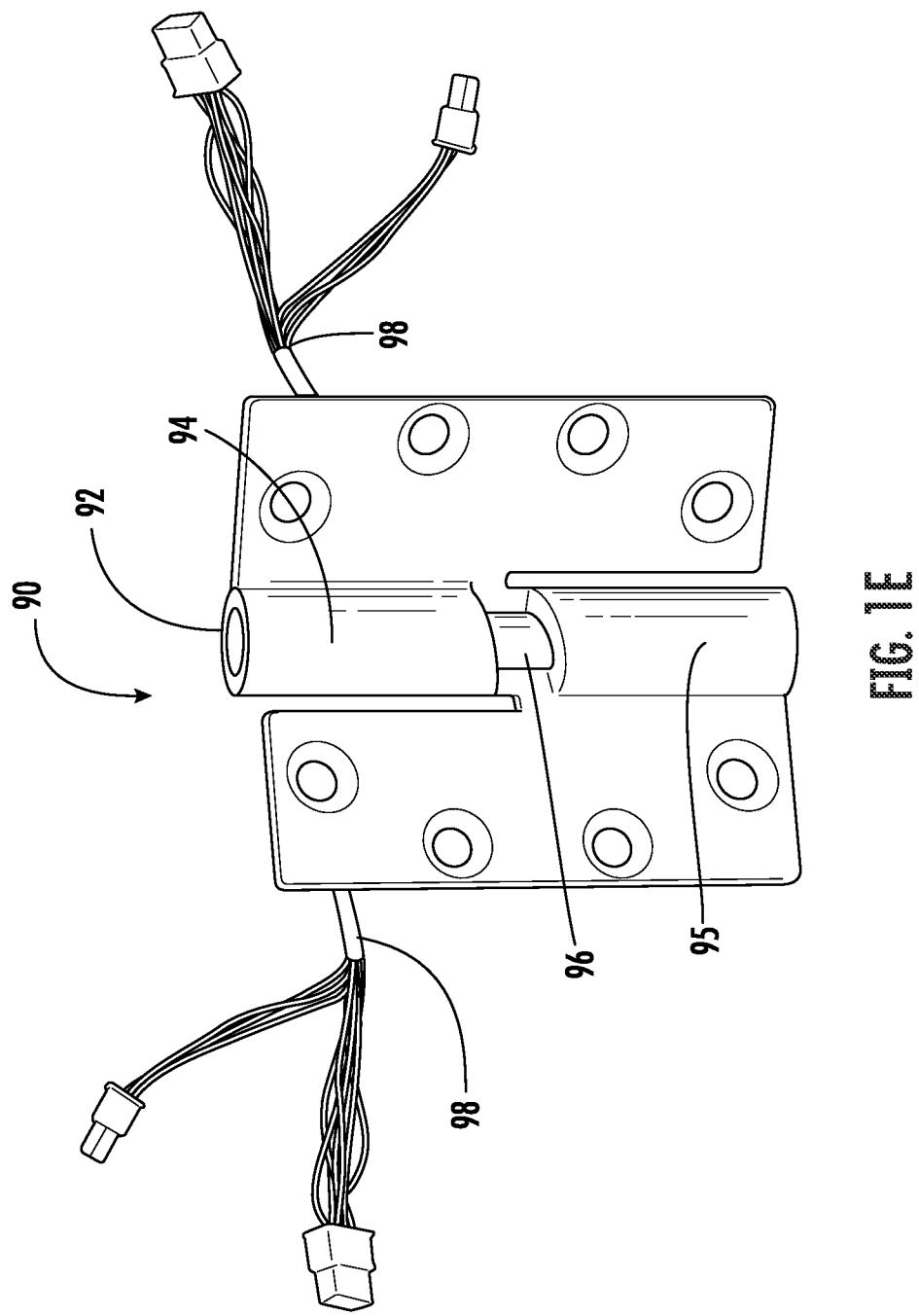

FIG. 1E is a perspective view of a cam hinge with wired connection, in accordance with embodiments of the present disclosure.

Figure 2A:
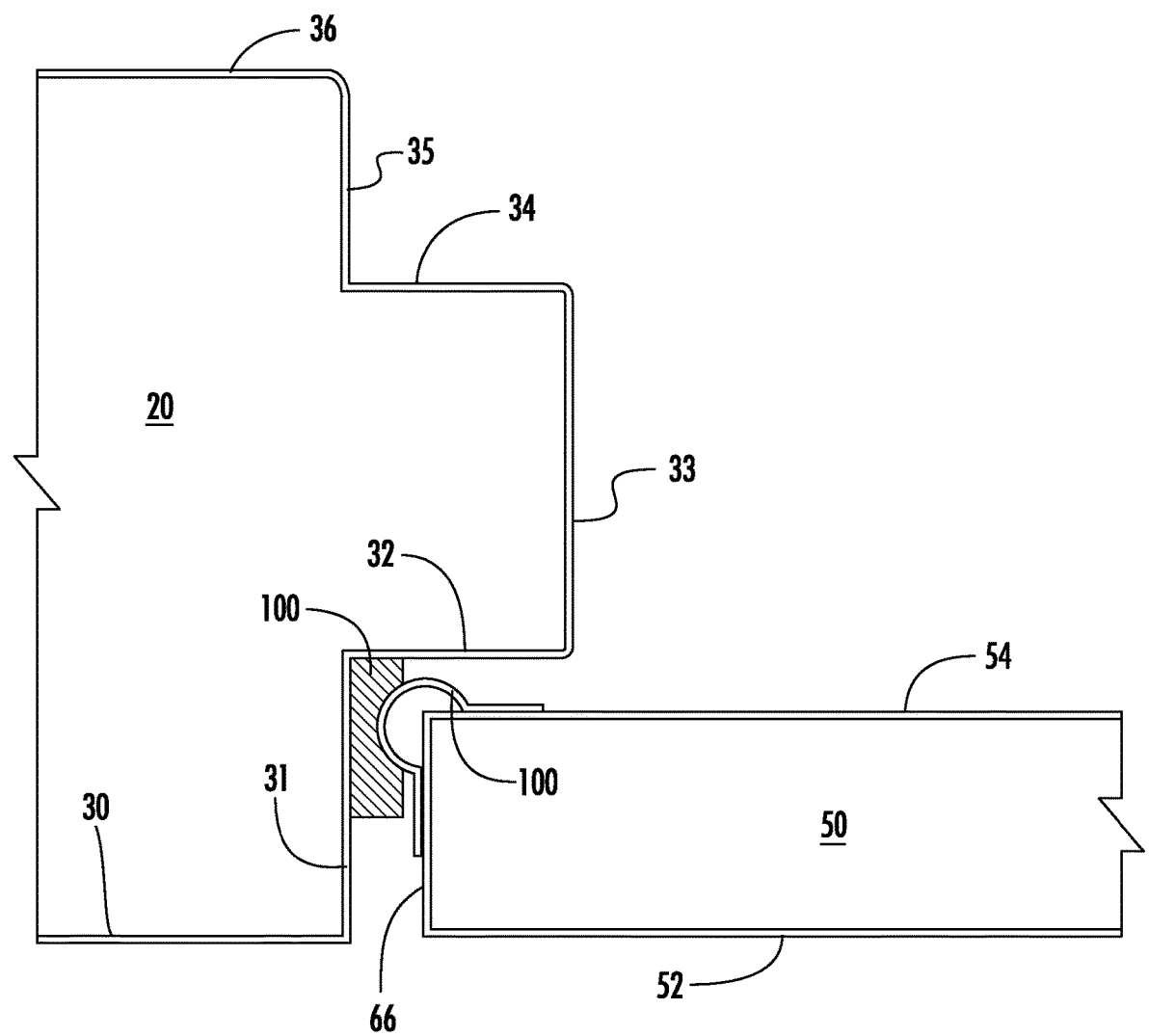

FIG. 2A is a horizontal cross-sectional view of a portion of the door assembly with seals, including an EMC seal, in accordance with embodiments of the present disclosure.

Figure 2C:
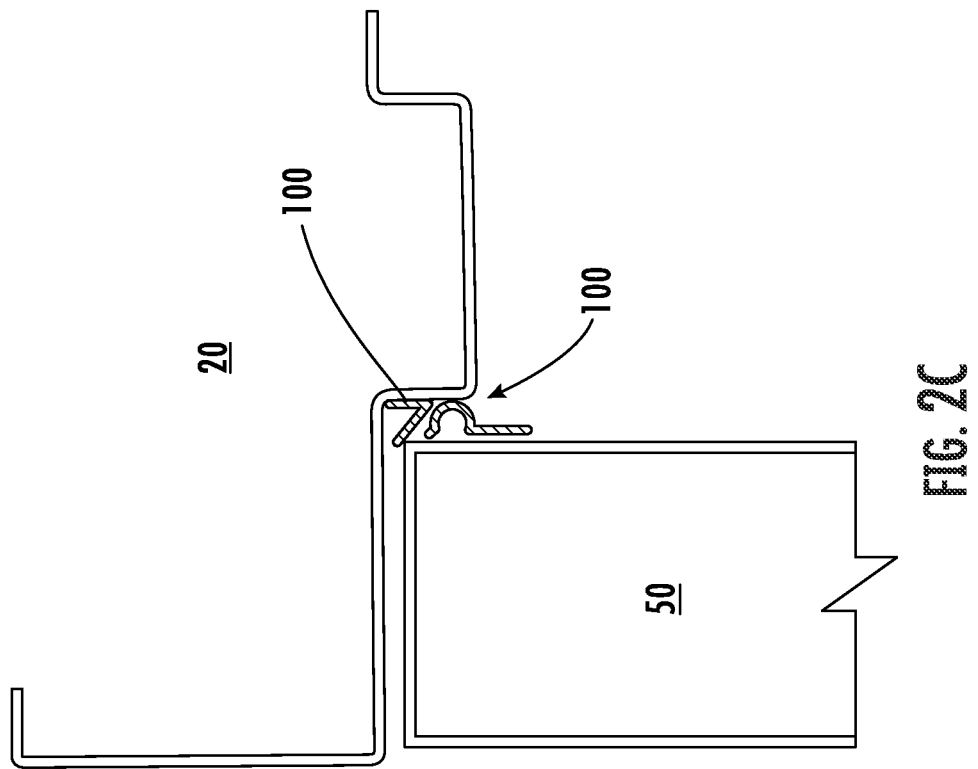
Figure 2B:
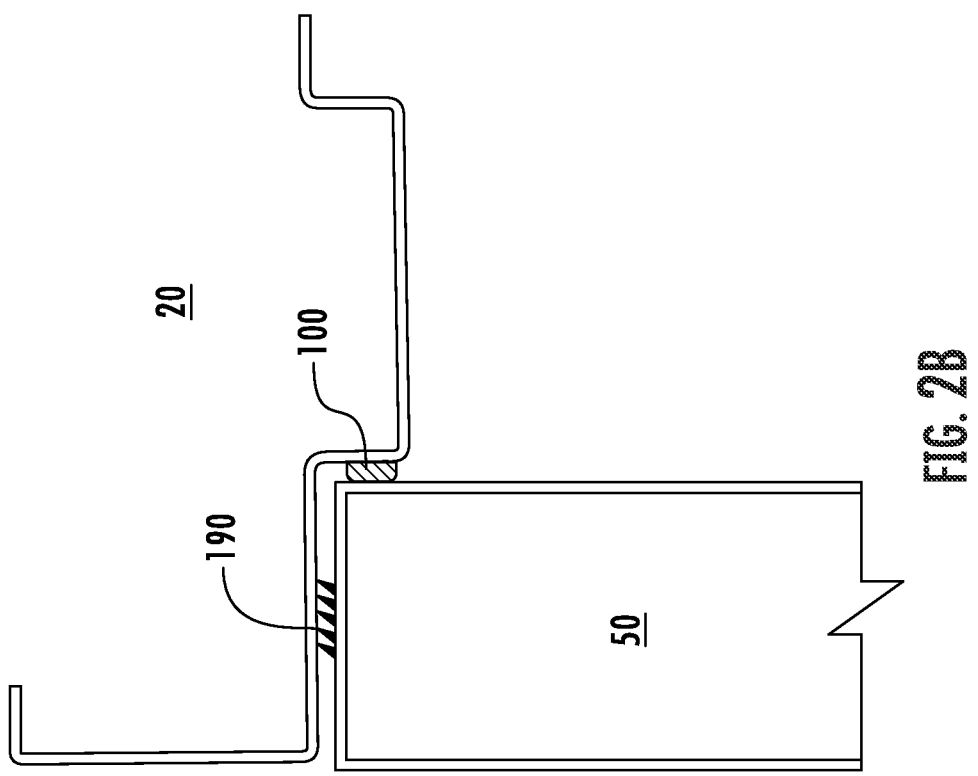

FIG. 2B is an enlarged horizontal cross-sectional view of the door assembly with a seals, including an EMC seal, in accordance with embodiments of the present disclosure.

FIG. 2C is an enlarged horizontal cross-sectional view of the door assembly with seals, including an EMC seal, in accordance with embodiments of the present disclosure.

FIG. 2D illustrates an enlarged view of a portion of a door having an EMC seal assembled, in accordance with embodiments of the present disclosure.

Figure 2E:
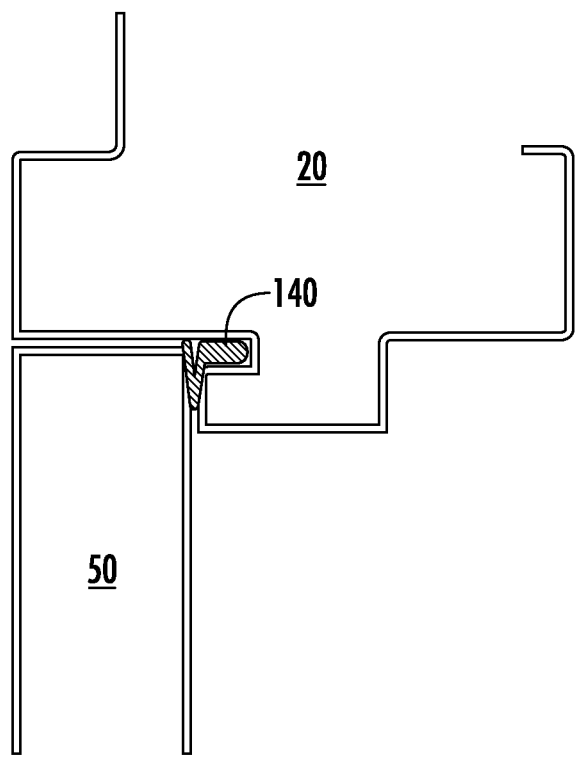

FIG. 2E is an enlarged horizontal cross-sectional view of the door assembly with an EMC kerf seal, in accordance with embodiments of the present disclosure.

Figure 2F:
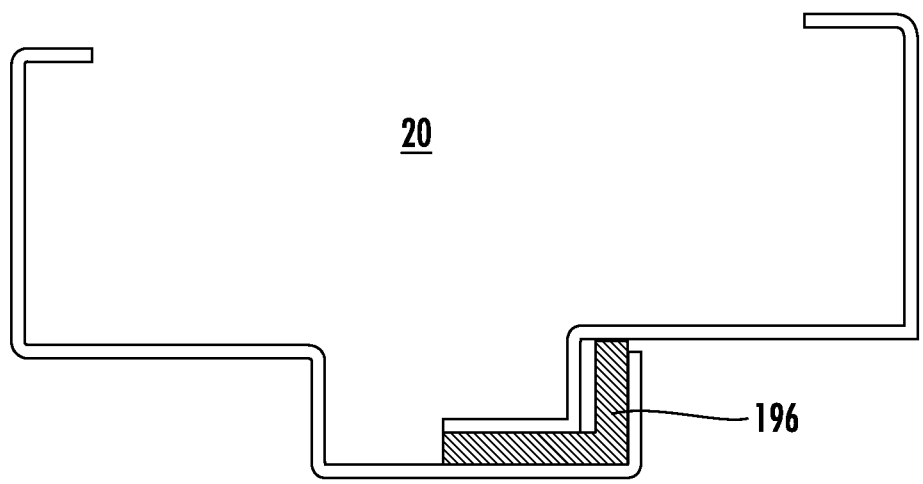

FIG. 2F is an enlarged horizontal cross-sectional view of an adjustable door frame, in accordance with embodiments of the present disclosure.

Figure 3:
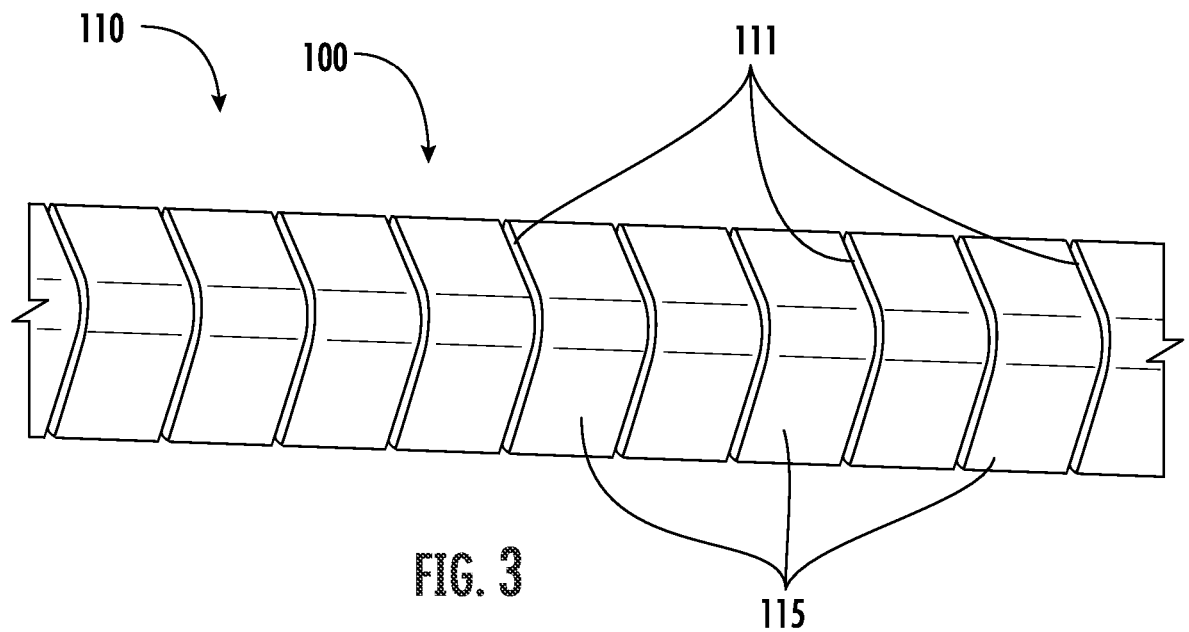

FIG. 3 illustrates a top view of an EMC finger stock seal, in accordance with embodiments of the present disclosure.

Figure 4:
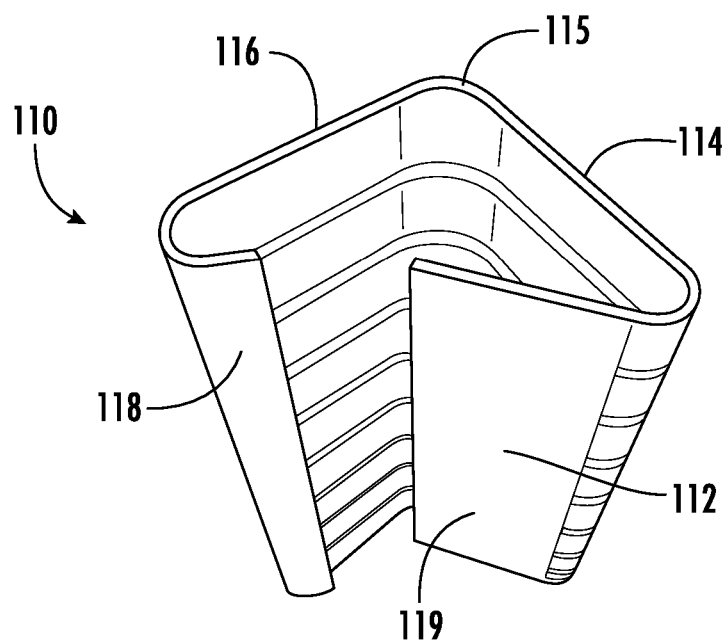

FIG. 4 illustrates a perspective end view of an EMC finger stock seal, in accordance with embodiments of the present disclosure.

Figure 5:
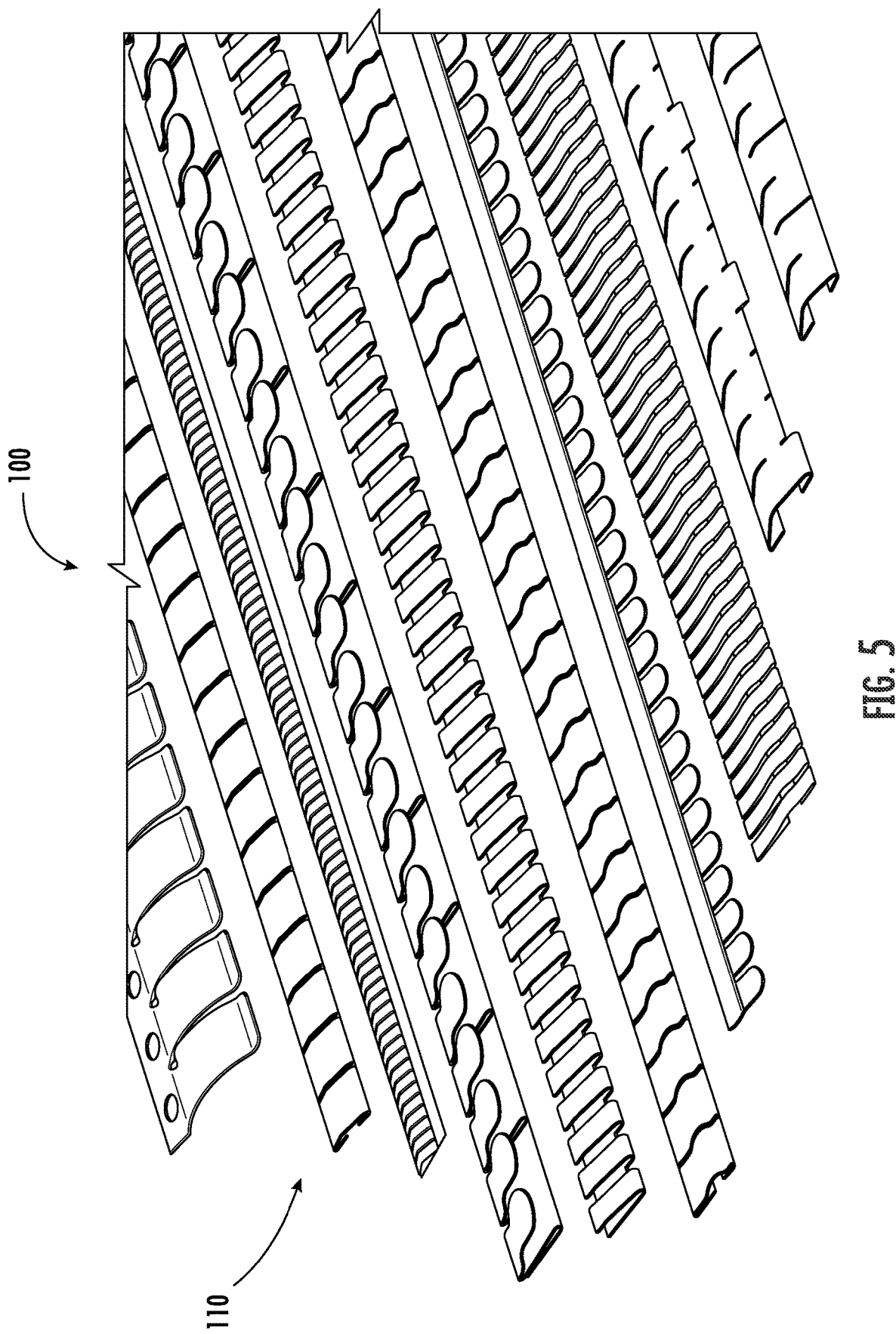

FIG. 5 illustrates different types of finger stock seals that may be utilized within the door assembly, in accordance with embodiments of the present disclosure.

Figure 6:
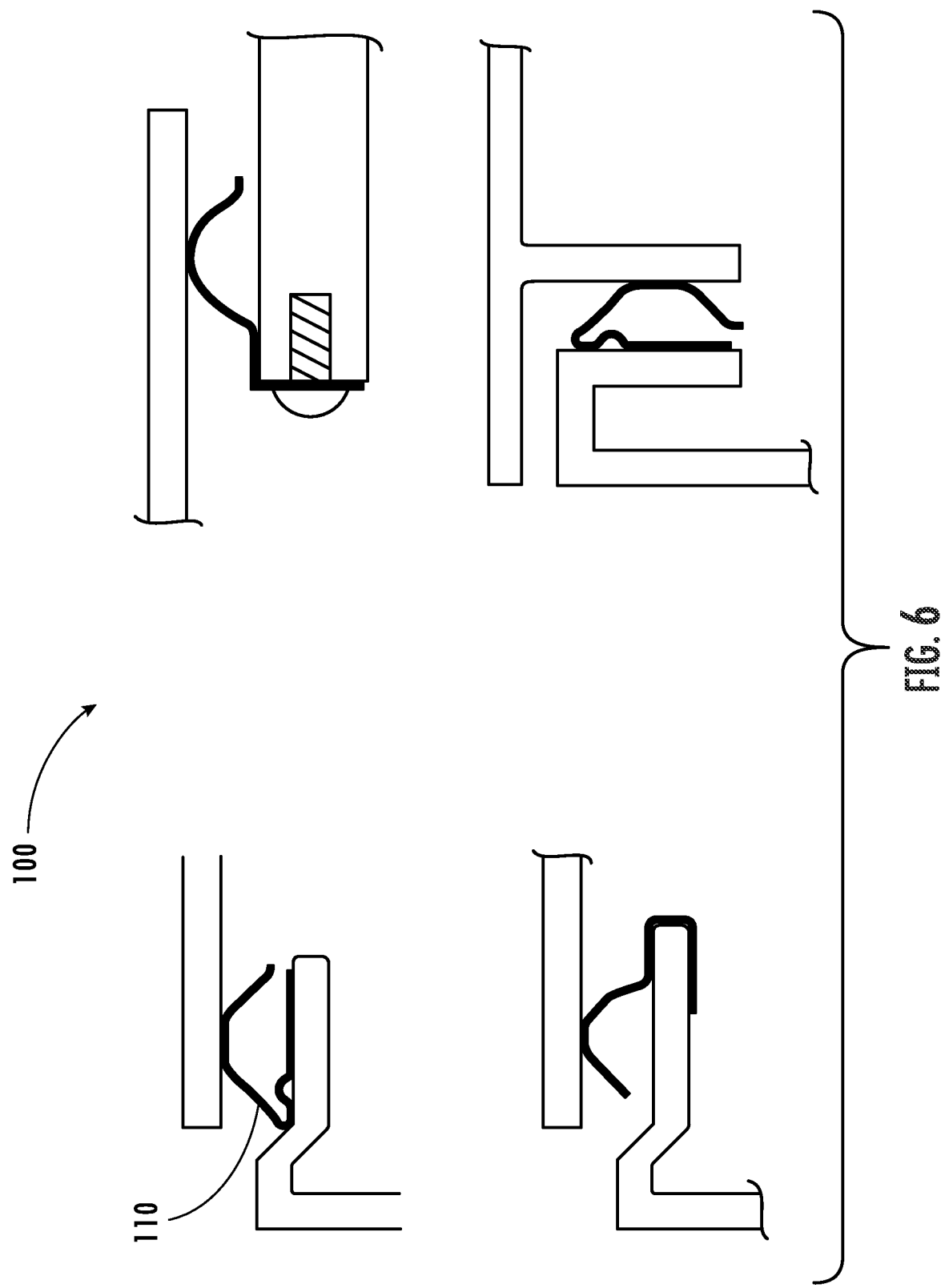

FIG. 6 illustrates different profiles and attachments for finger stock seals located between two surfaces for creating an EMC shielding circuit, in accordance with embodiments of the present disclosure.

Figure 7:
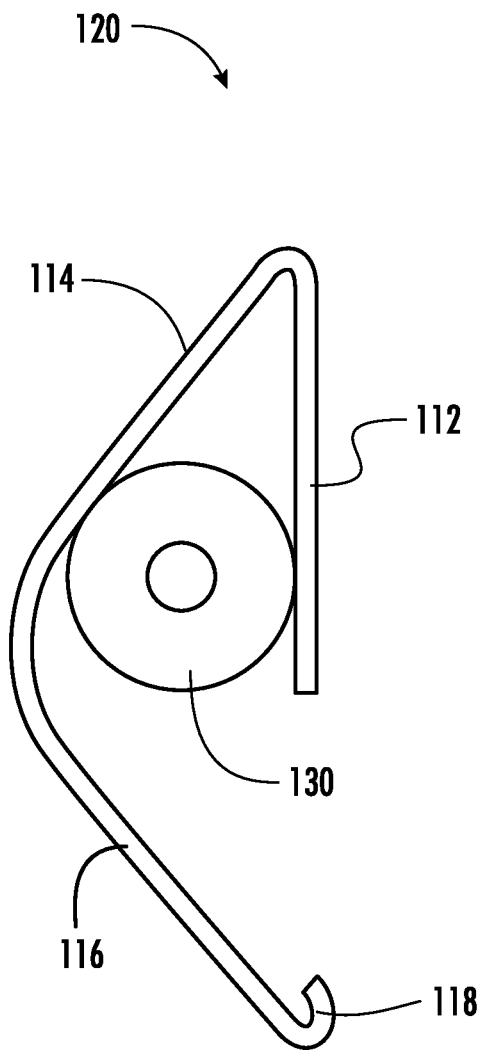

FIG. 7 illustrates an end view of a composite finger stock seal using an EMC finger stock seal with an EMC/STC inner seal, in accordance with embodiments of the present disclosure.

Figure 8A:
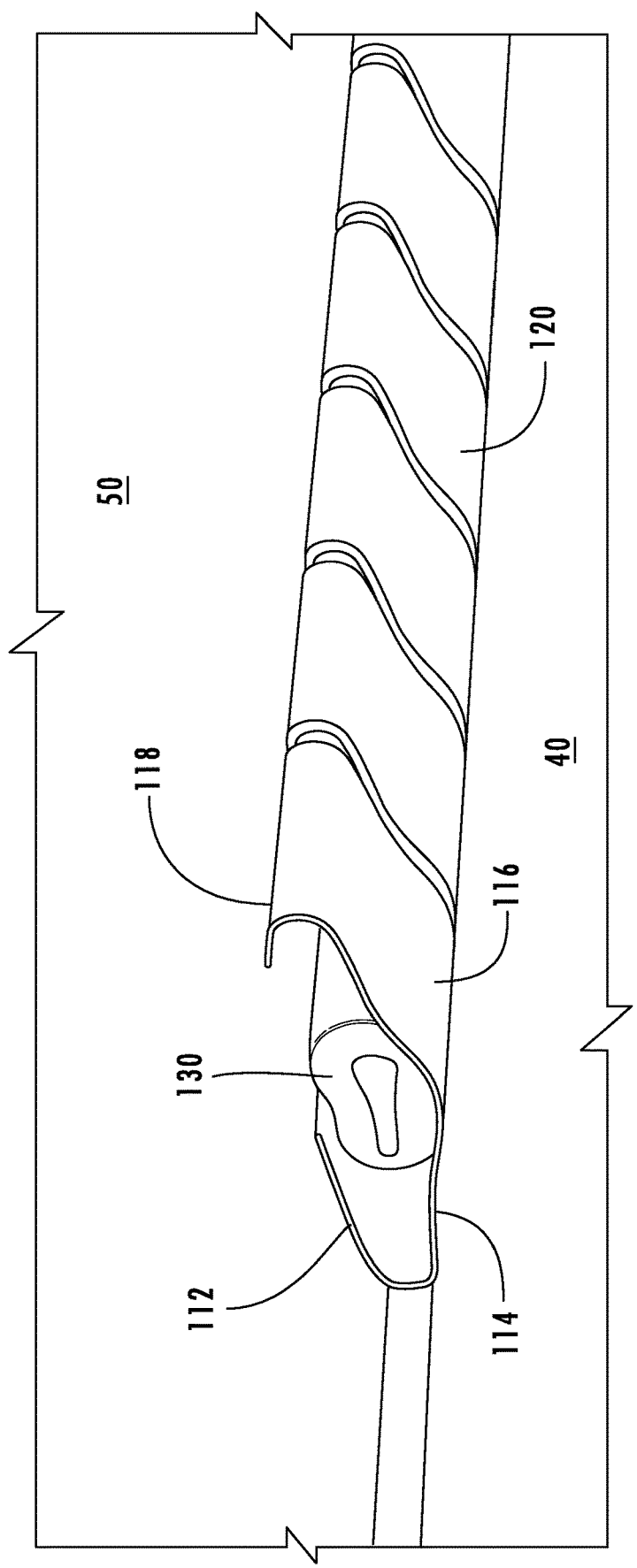

FIG. 8A illustrates a composite EMC finger stock seal, having the EMC finger stock seal with the EMC/STC inner seal, operatively coupled to an edge of a door, in accordance with embodiments of the present disclosure.

Figure 8B:
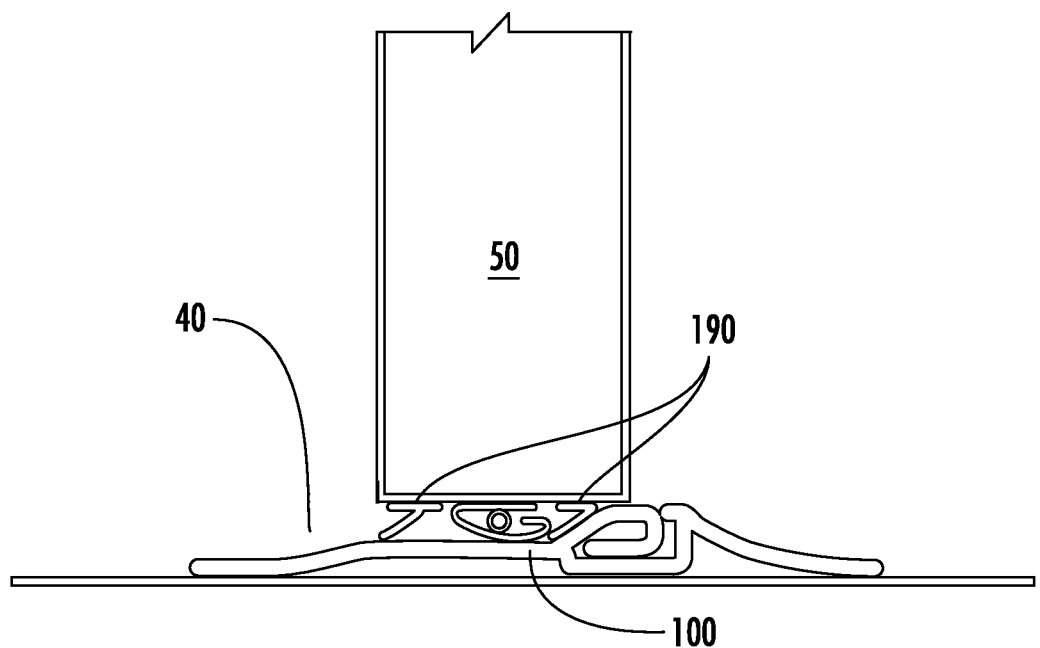

FIG. 8B is an enlarged vertical cross-sectional view of the door bottom assembly with seals, in accordance with embodiments of the present disclosure.

Figure 8C:
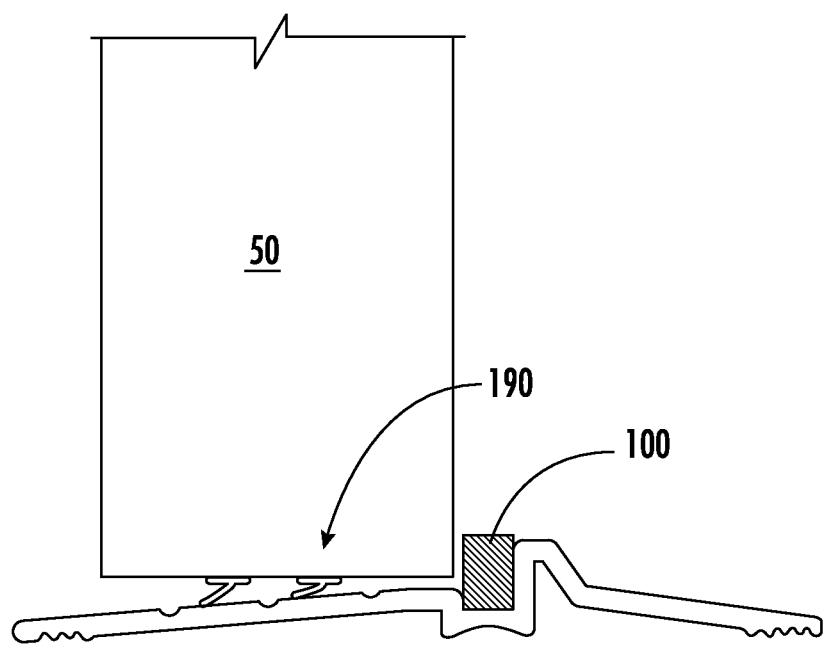

FIG. 8C is an enlarged vertical cross-sectional view of the door bottom assembly with seals, in accordance with embodiments of the present disclosure.

Figure 9A:
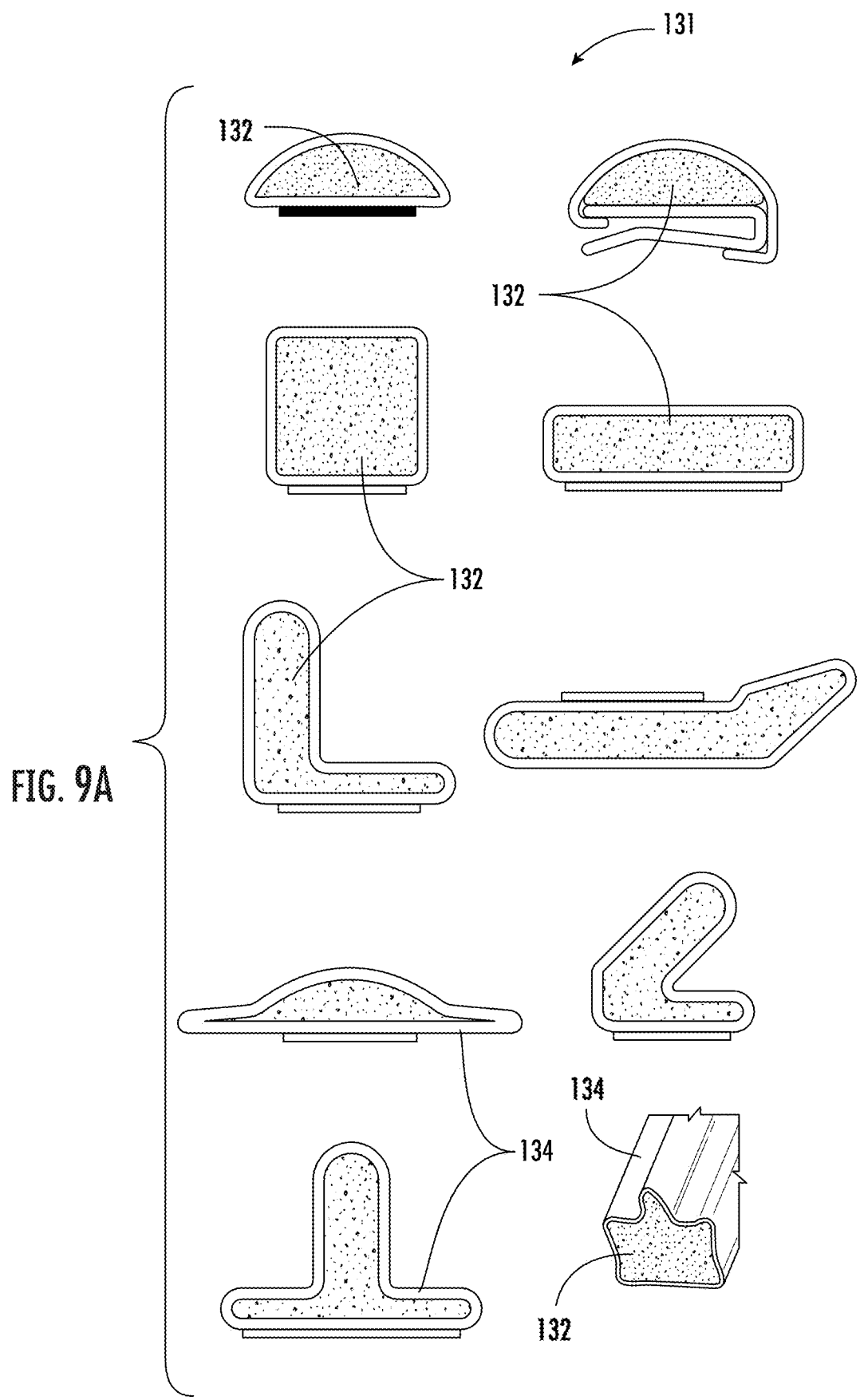

FIG. 9A illustrates different types of EMC seals, such as EMC gasket seals, with an exterior EMC material that may be used for creating an EMC shielding circuit, in accordance with embodiments of the present disclosure.

Figure 9B:
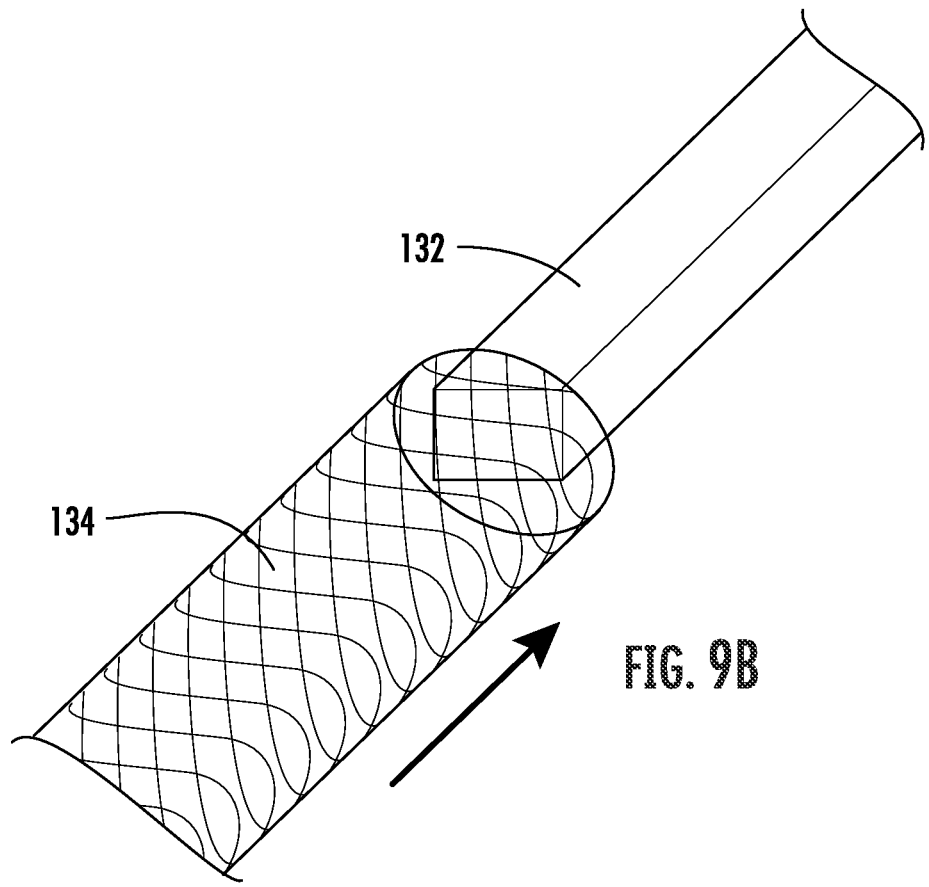

FIG. 9B illustrates an EMC seal, such as an EMC gasket seal, having an EMC cover being assembled over a sound seal or thermal seal core, in accordance with embodiments of the present disclosure.

Figure 9C:
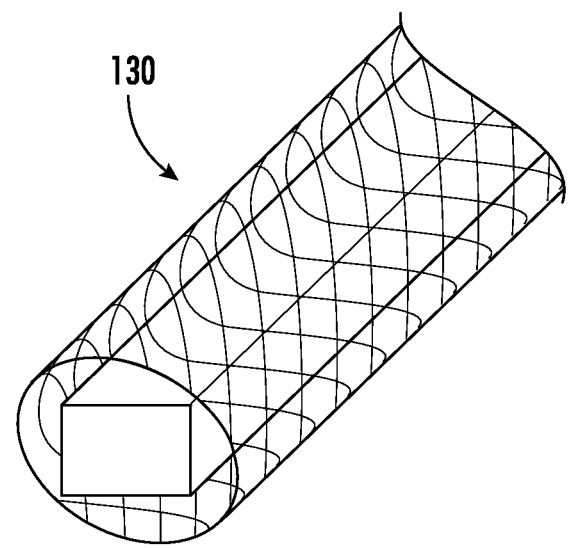

FIG. 9C illustrates an EMC seal, such as an EMC gasket seal, having an EMC cover over a sound seal or thermal seal core, in accordance with embodiments of the present disclosure.

Figure 10:
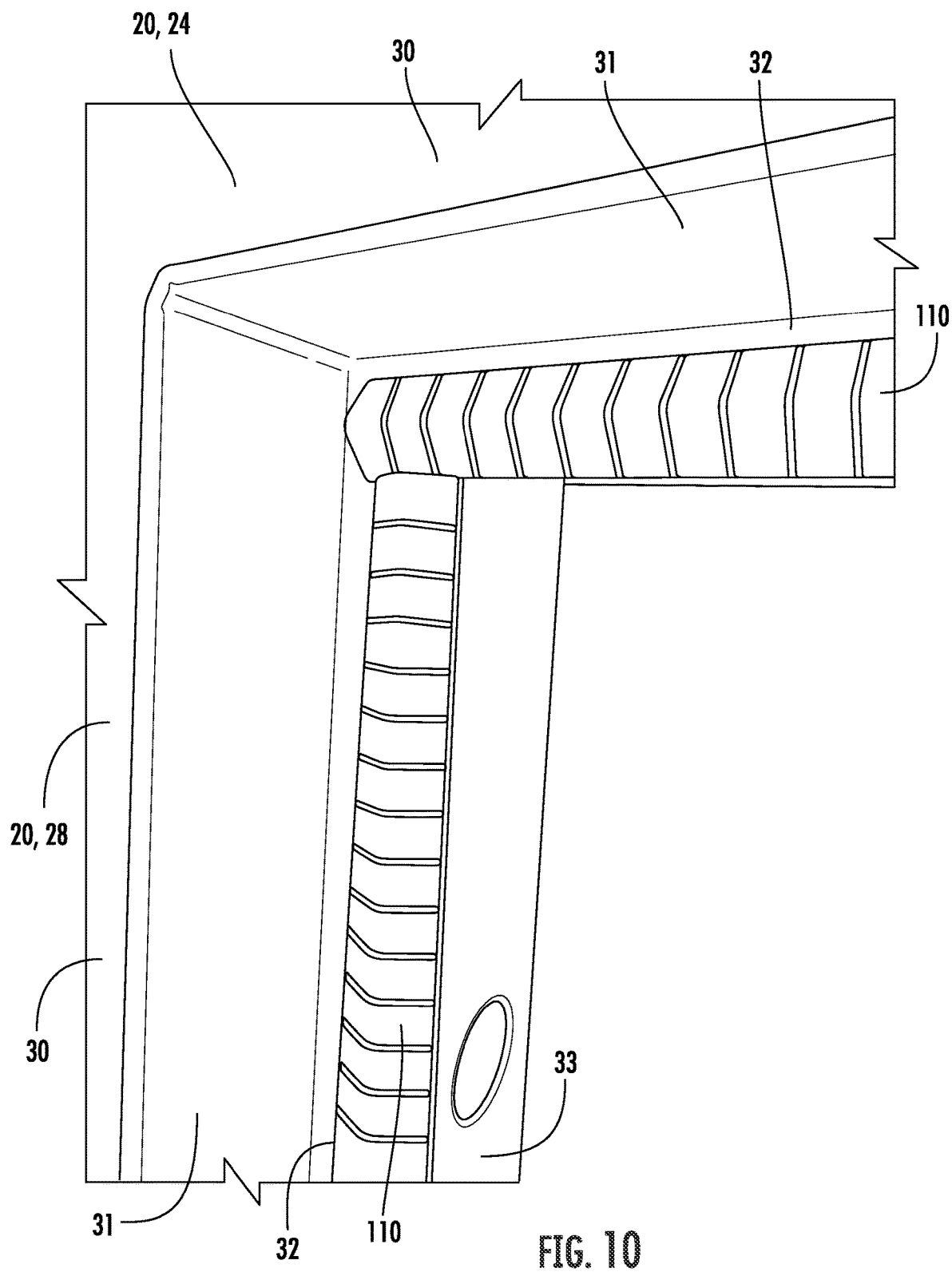

FIG. 10 illustrates an enlarged view of an upper portion of the lock side of the door frame with EMC finger stock seals operatively coupled to the frame stop, in accordance with embodiments of the present disclosure.

Figure 11:
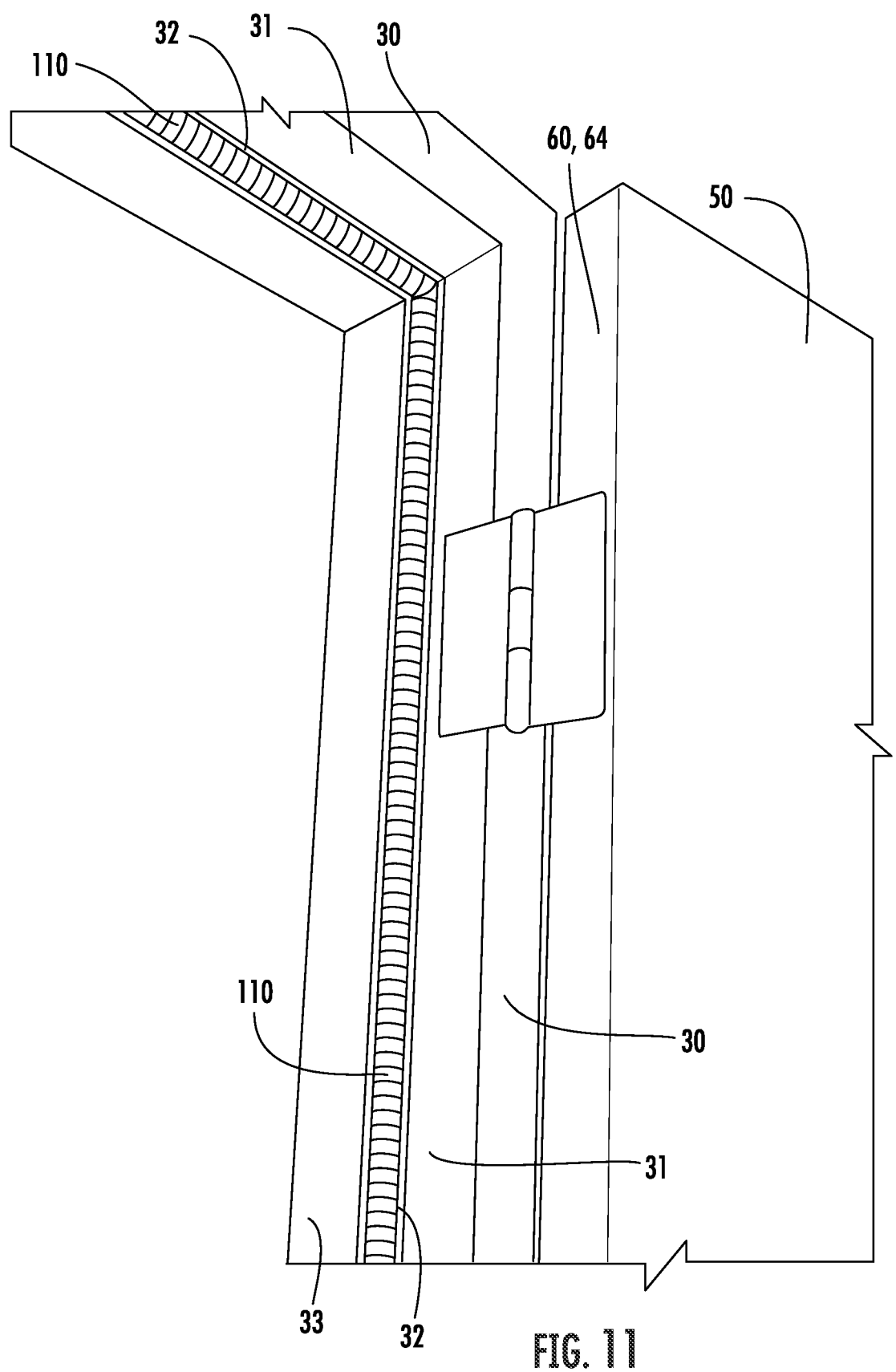

FIG. 11 illustrates an enlarged view of an upper portion of the hinge side of the door frame with EMC finger stock seals operatively coupled to the frame stop, in accordance with embodiments of the present disclosure.

Figure 12:
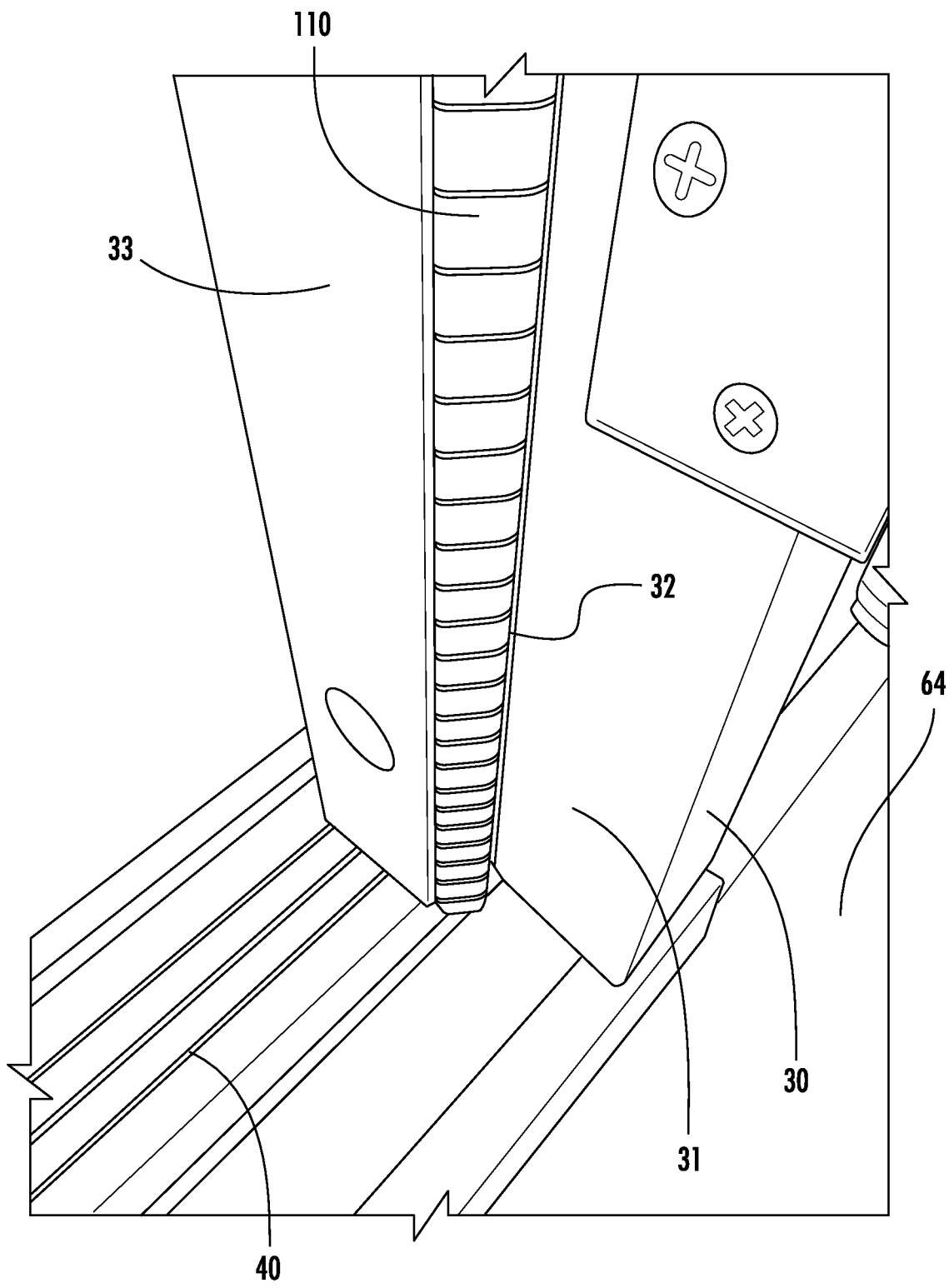

FIG. 12 illustrates an enlarged view of a lower portion of the hinge side of the door frame with an EMC finger stock seal operatively coupled to the frame stop, in accordance with embodiments of the present disclosure.

Figure 13A:
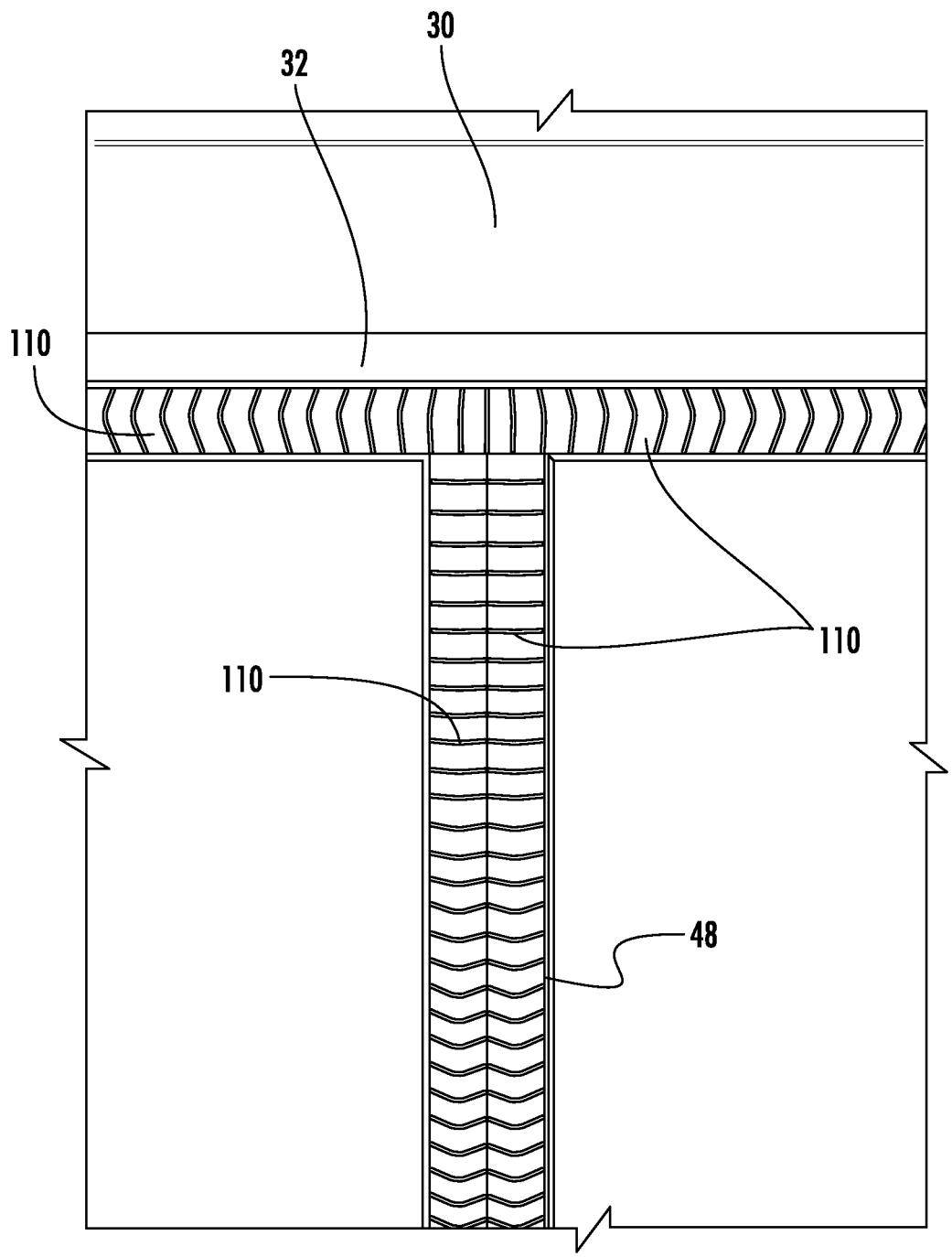

FIG. 13A illustrates an enlarged view of an upper portion of a mullion of a double door assembly with EMC finger stock seals operatively coupled to the mullion and upper frame stop, in accordance with embodiments of the present disclosure.

Figure 13B:
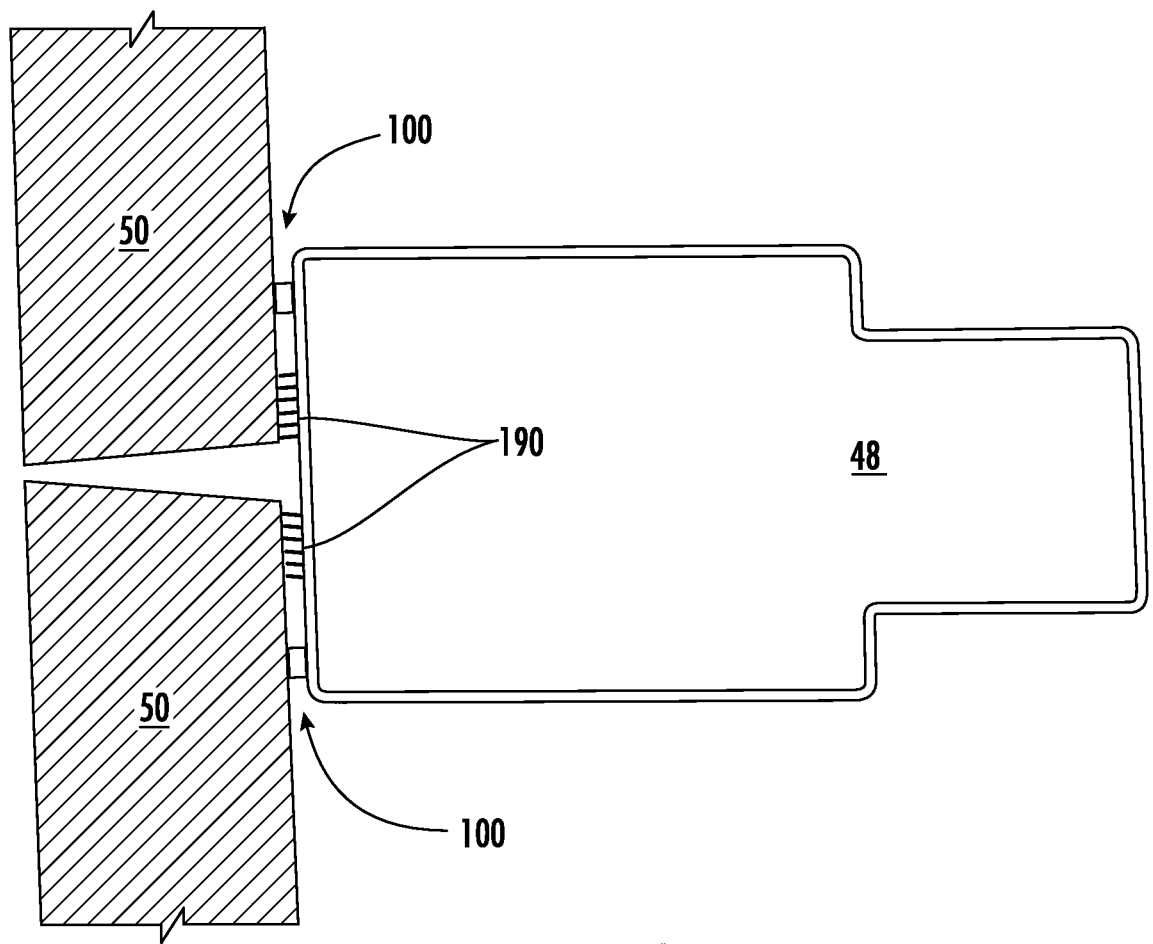

FIG. 13B illustrates an enlarged cross-sectional view of a mullion of a double door assembly with seals, including EMC seals, in accordance with embodiments of the present disclosure.

Figure 14A:
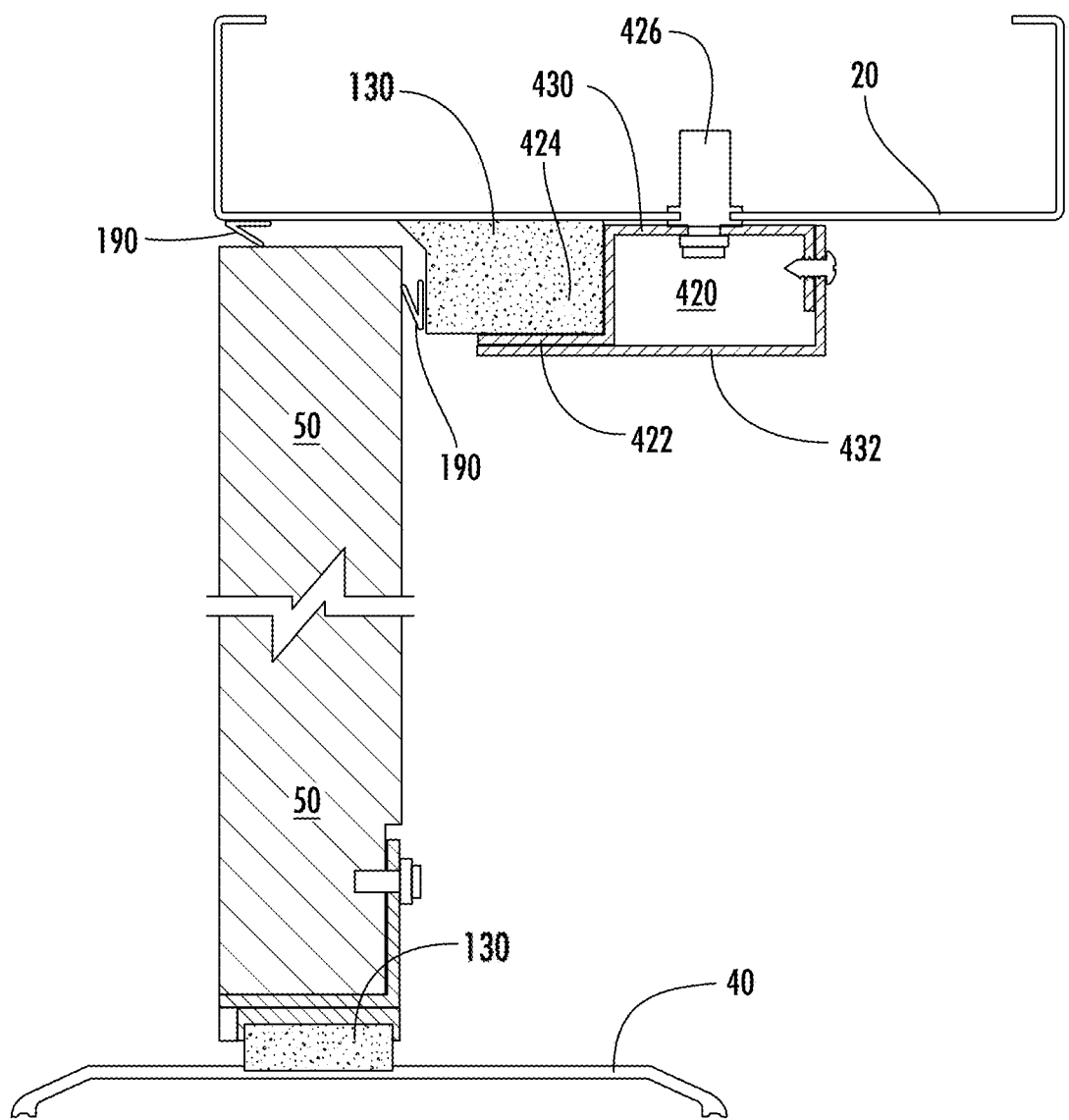

FIG. 14A illustrates a vertical cross-sectional view of the door assembly with EMC gasket seals, in accordance with embodiments of the present disclosure.

Figure 14B:
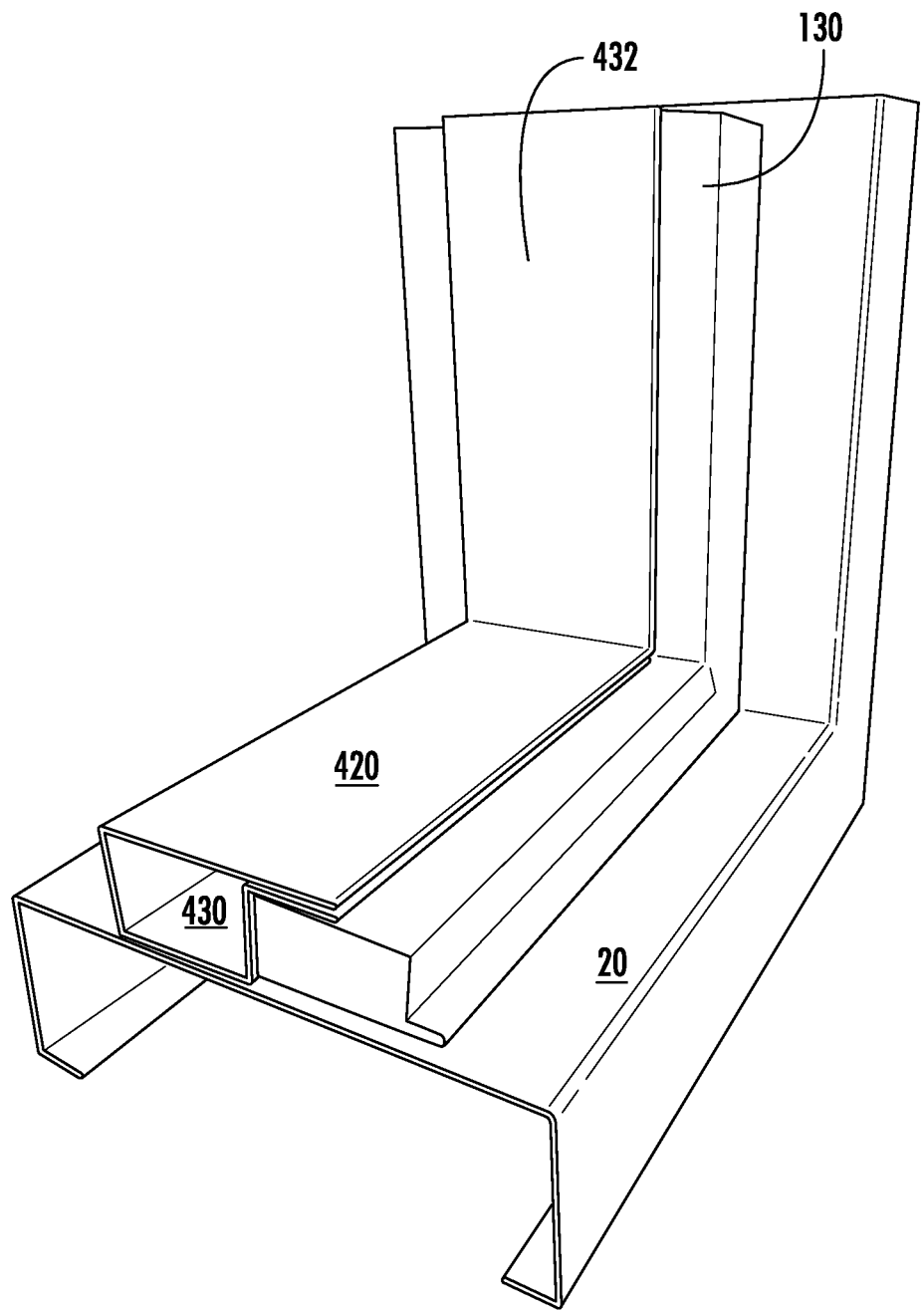

FIG. 14B illustrates a perspective view of a portion of the door frame with a gasket seal, in accordance with embodiments of the present disclosure.

Figure 14C:
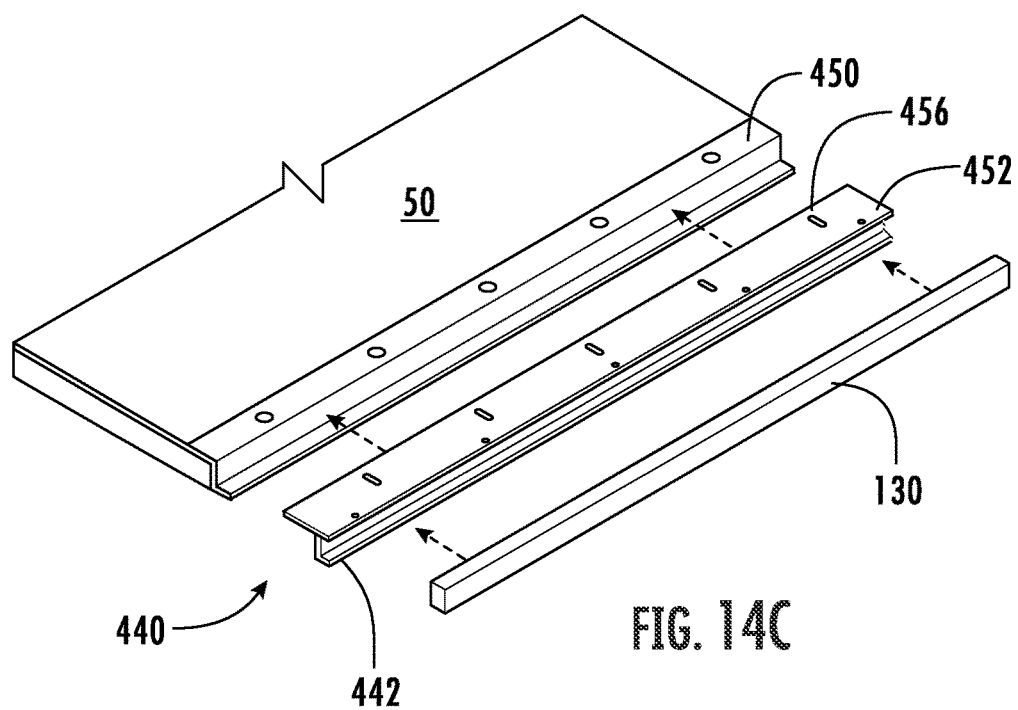

FIG. 14C illustrates a perspective view of a bottom of the door with a door shoe and EMC gasket seal being installed, in accordance with embodiments of the present disclosure.

Figure 14D:
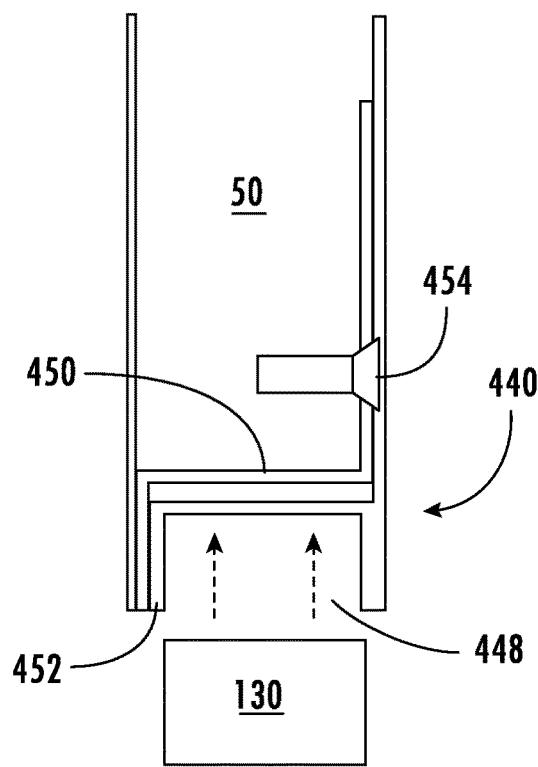

FIG. 14D illustrates a cross-sectional view of the door with the door shoe and EMC gasket seal being installed, in accordance with embodiments of the present disclosure.

Figure 14E:
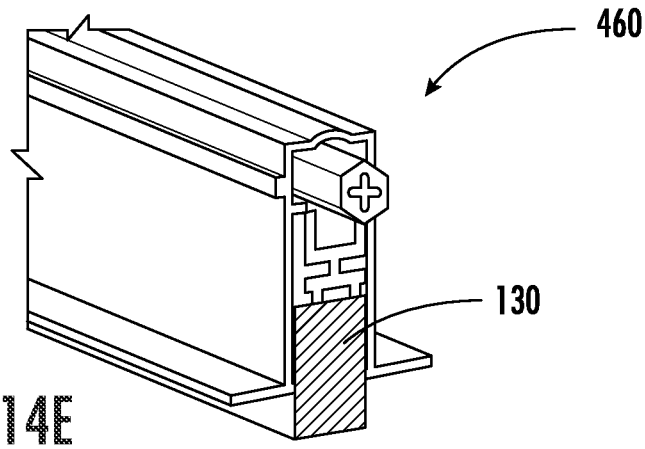

FIG. 14E illustrates an end perspective view of a dynamic door bottom in a full-mortise mount, in accordance with embodiments of the present disclosure.

Figure 14F:
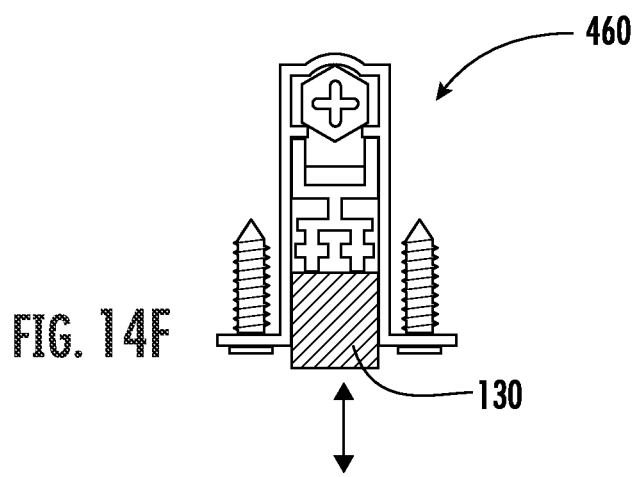

FIG. 14F illustrates an end cross-sectional view of the dynamic door bottom in a full-mortise mount of FIG. 14E, in accordance with embodiments of the present disclosure.

Figure 14G:
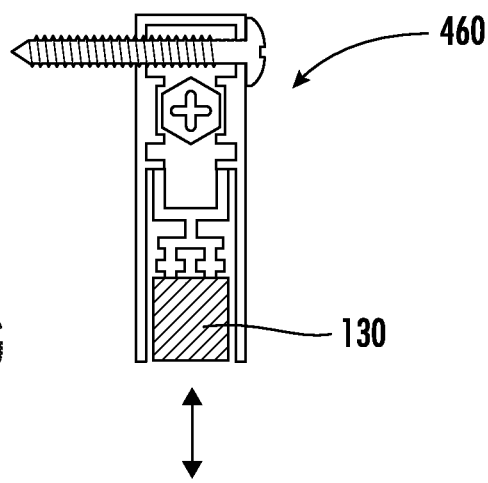

FIG. 14G illustrates an end cross-sectional view of the dynamic door bottom in a semi-mortise or face mount, in accordance with embodiments of the present disclosure.

Figure 14H:
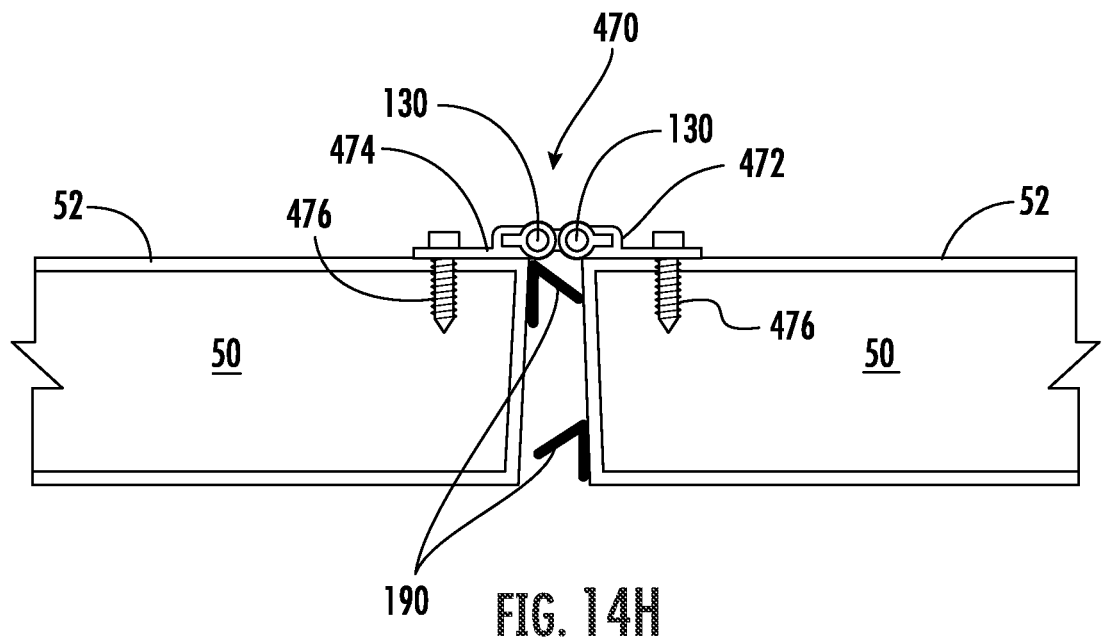

FIG. 14H illustrates a top cross-section view of double doors with astragal hardware and EMC seals, in accordance with embodiments of the present disclosure.

Figure 14I:
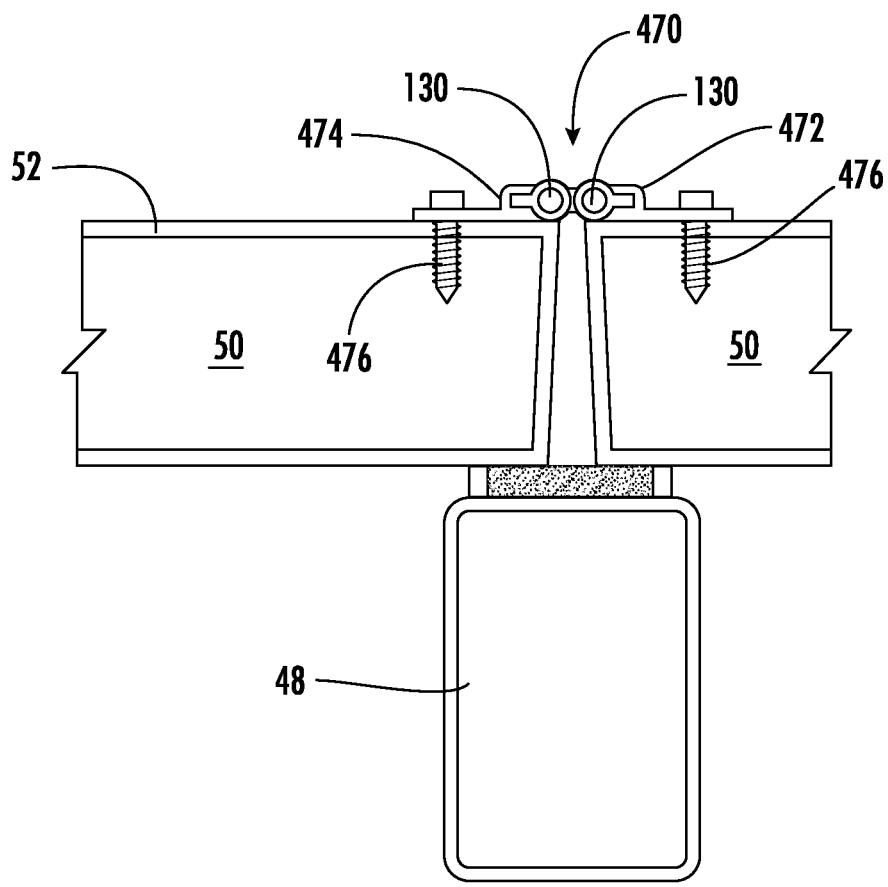

FIG. 14I illustrates a top cross-section view of double doors with astragal hardware and a mullion and EMC seals, in accordance with embodiments of the present disclosure.

Figure 14J:
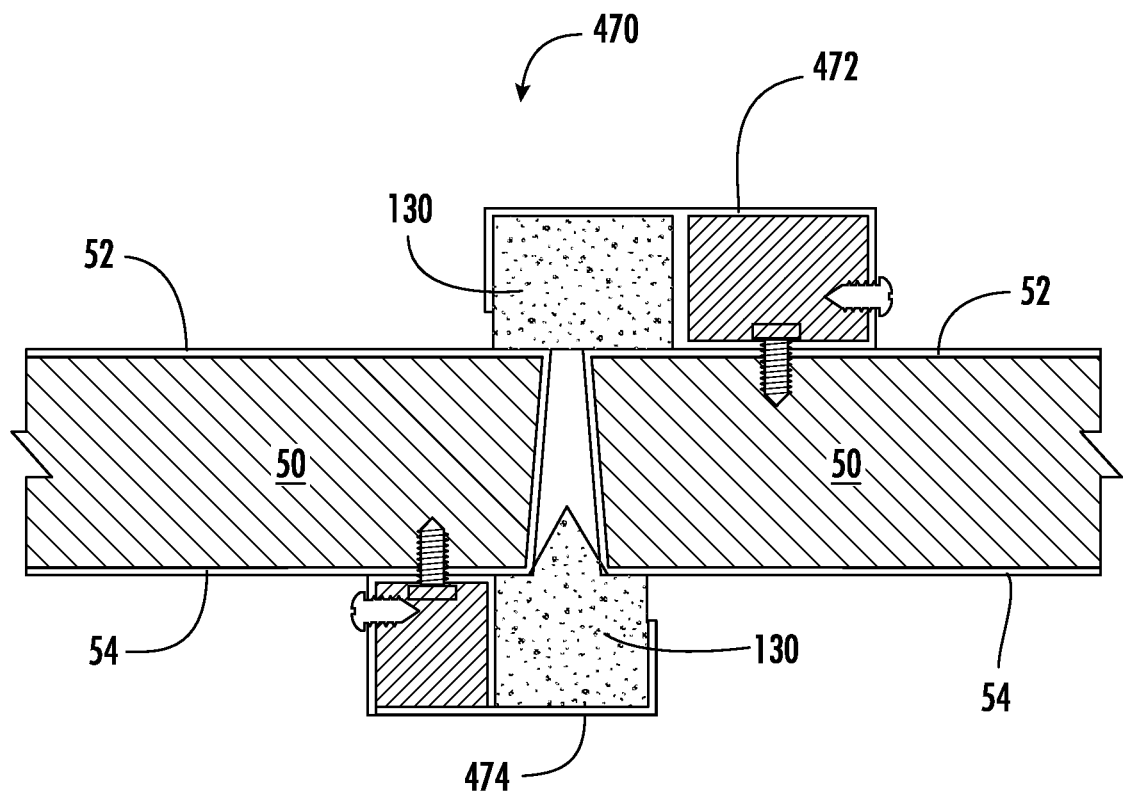

FIG. 14J illustrates a top cross-section view of double doors with astragal hardware and EMC seals, in accordance with embodiments of the present disclosure.

Figure 14K:
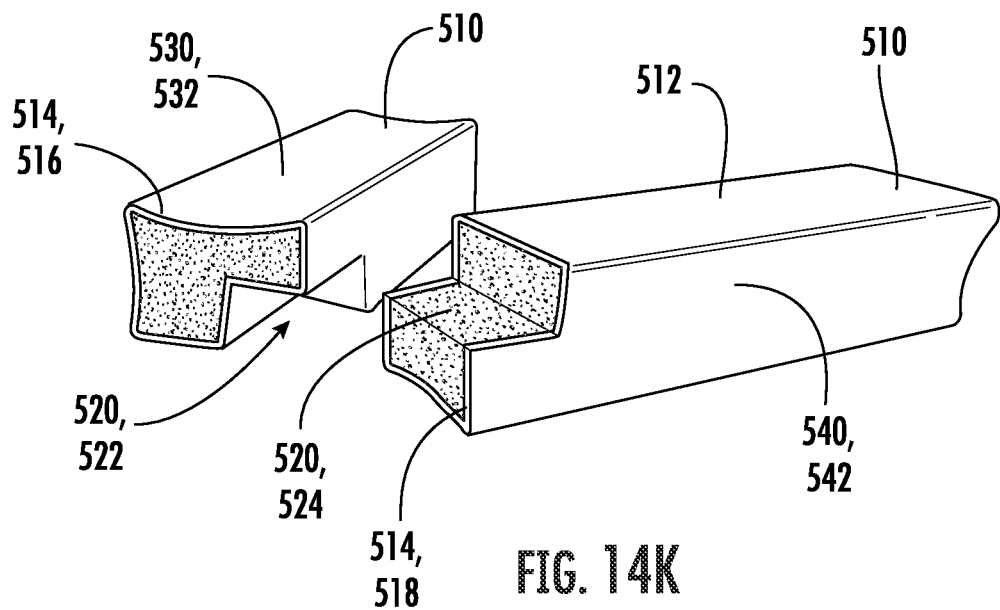

FIG. 14K illustrates perspective views of the EMC gasket seals with end notches, in accordance with embodiments of the present disclosure.

Figure 14L:
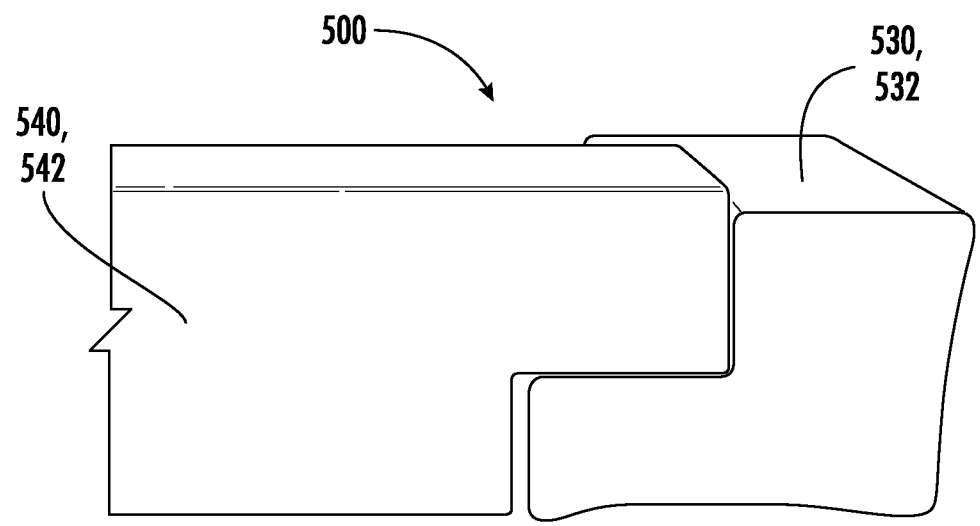

FIG. 14L illustrates a top view of the EMC gasket seals with end notches assembled for a corner of a door frame, in accordance with embodiments of the present disclosure.

Figure 14M:
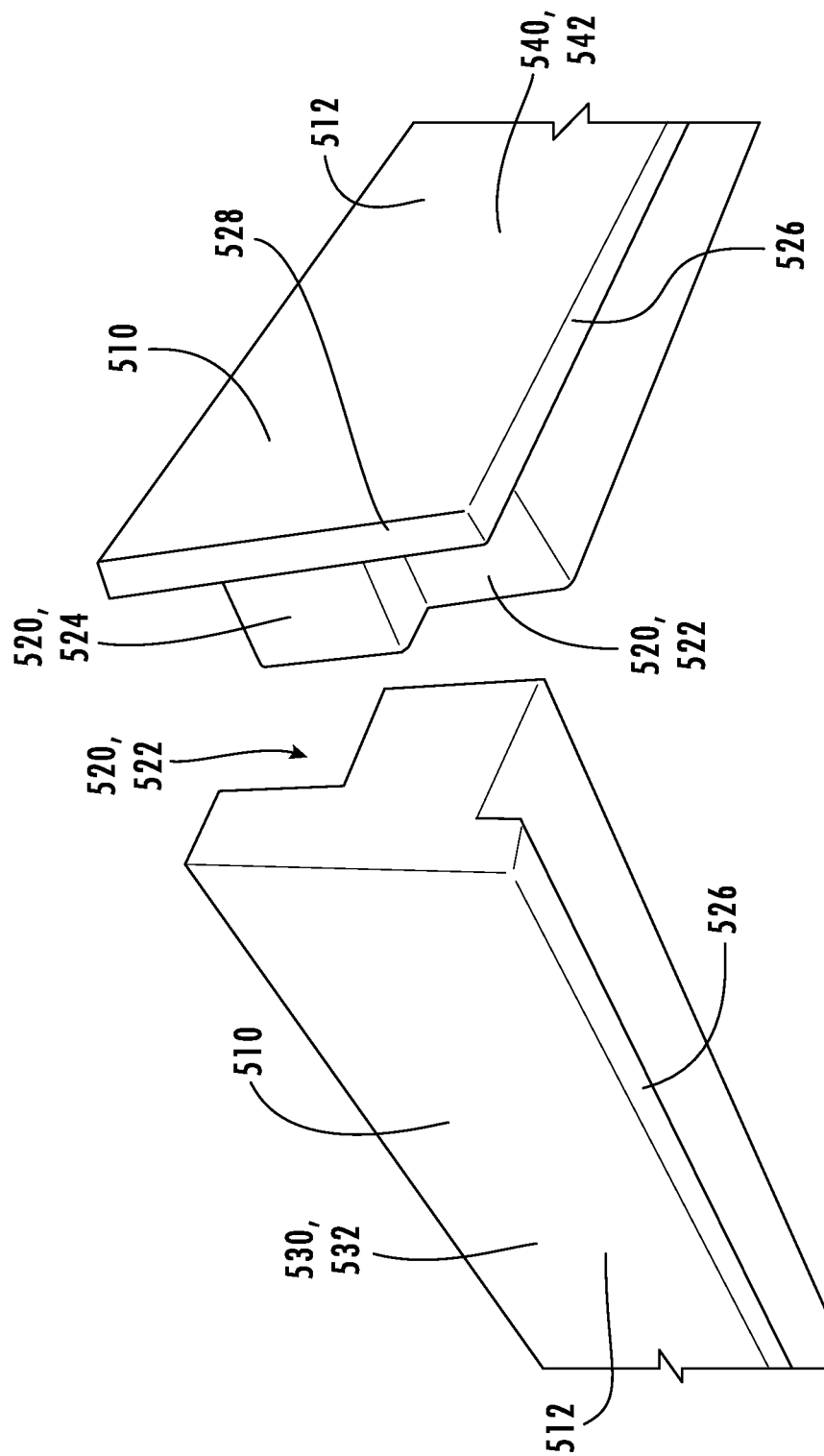

FIG. 14M illustrates a perspective view of the EMC gasket seals with end notches and seal projections, in accordance with embodiments of the present disclosure.

Figure 14N:
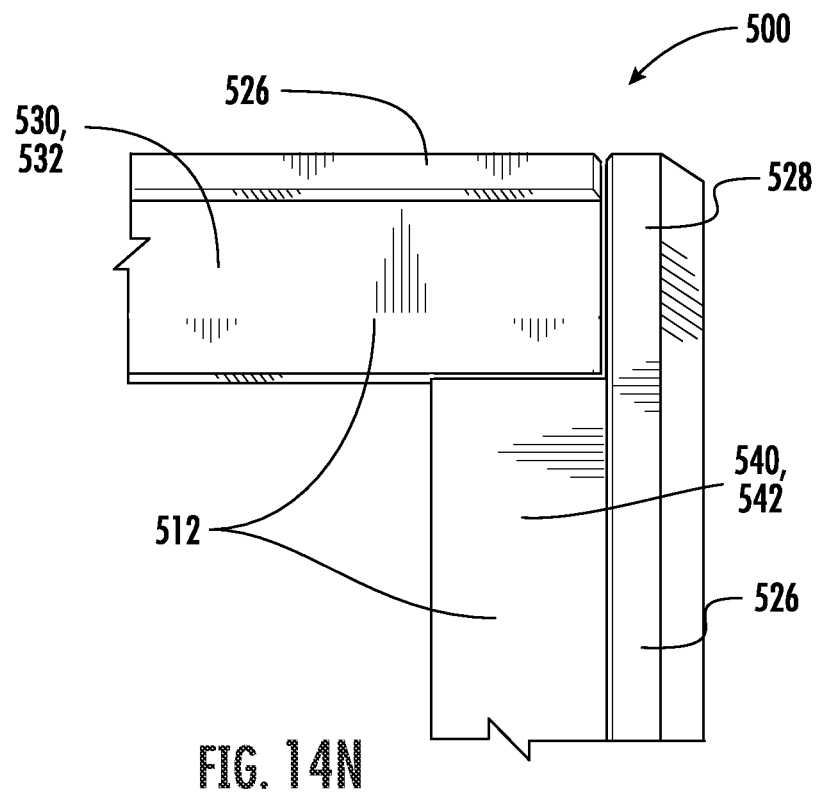

FIG. 14N illustrates a front view of the EMC gasket seals with end notches and seal projections for a corner of a door frame, in accordance with embodiments of the present disclosure.

Figure 14O:
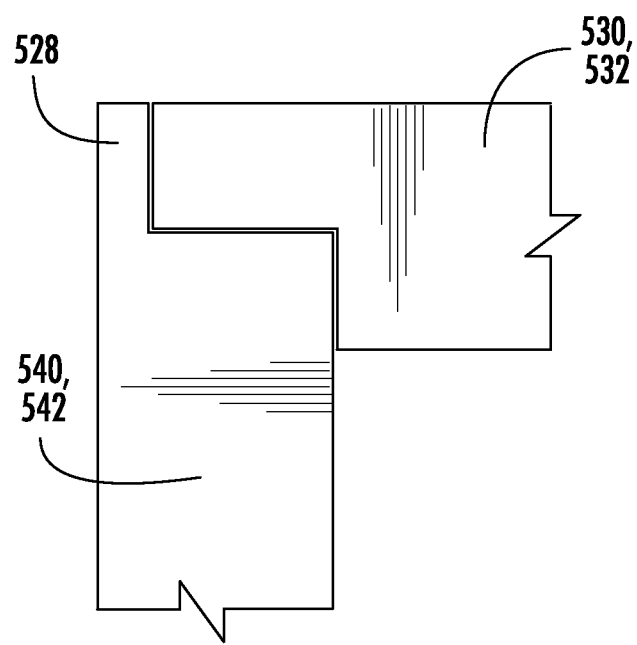

FIG. 14O illustrates a rear view of the EMC gasket seals with end notches and seal projections assembled for a corner of a door frame, in accordance with embodiments of the present disclosure.

Figure 14P:
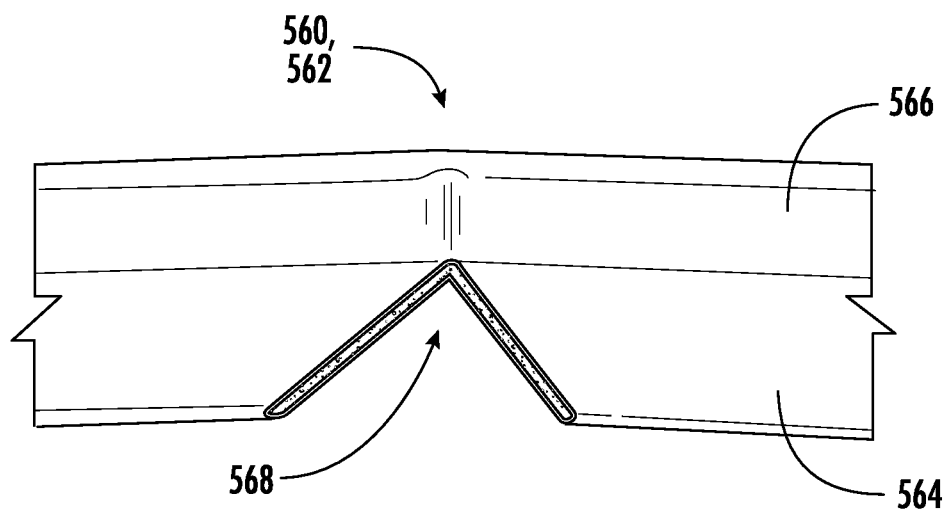

FIG. 14P illustrates a perspective view of another EMC gasket seal with a miter notch for assembly at a door frame corner, in accordance with embodiments of the present disclosure.

Figure 14Q:
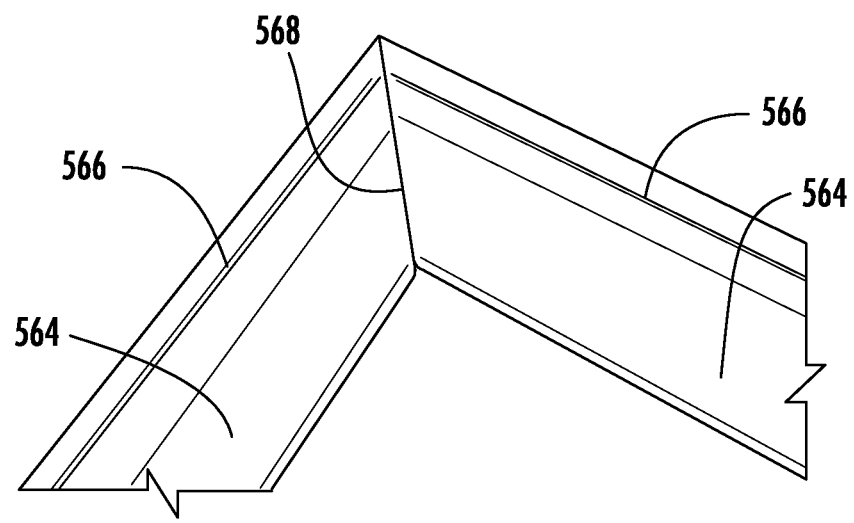

FIG. 14Q illustrates a perspective view of the EMC gasket seal of FIG. 14P as bent for assembly on a door frame, in accordance with embodiments of the present disclosure.

Figure 14R:
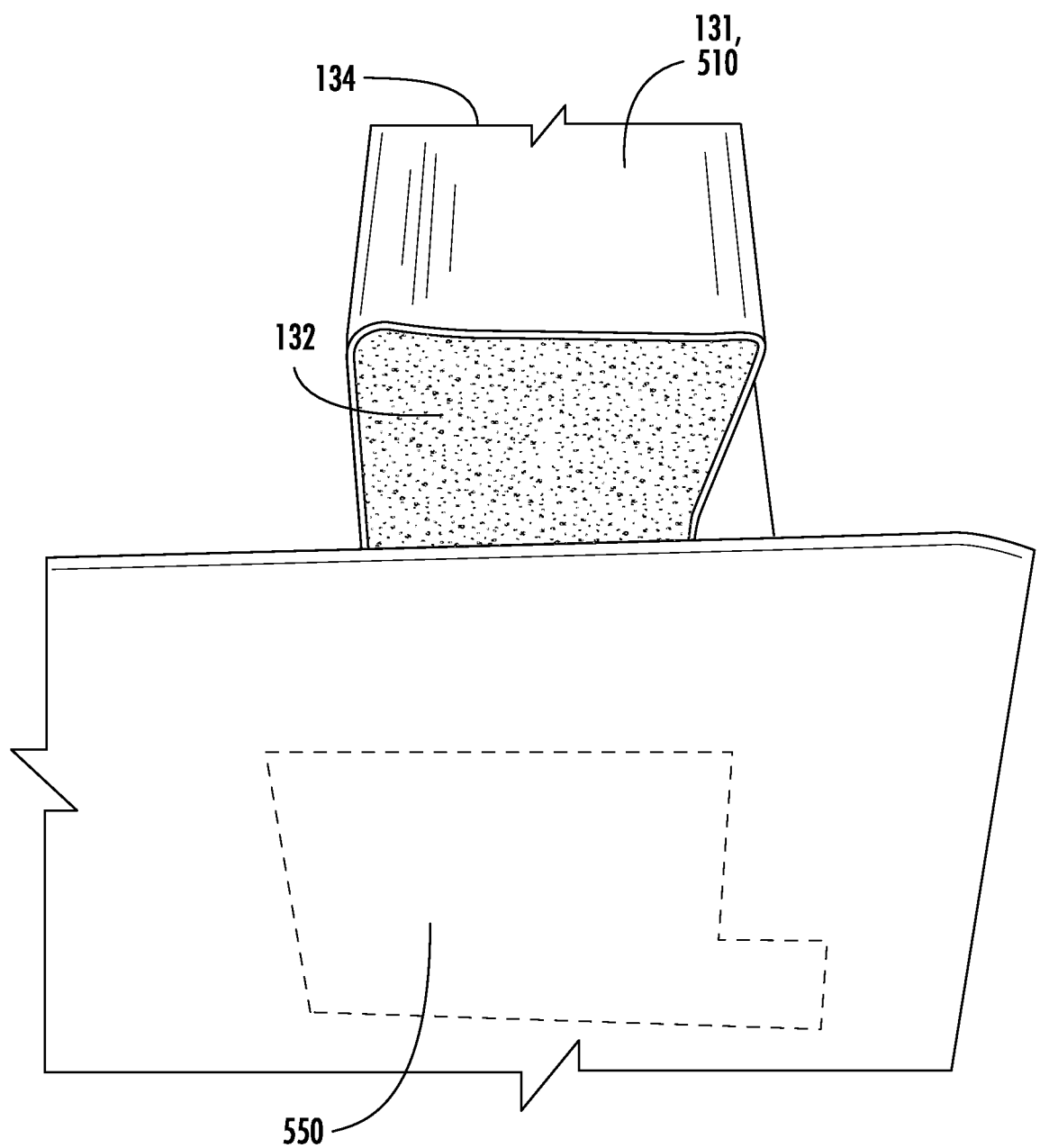

FIG. 14R illustrates a perspective view of an EMC patch adjacent an EMC seal with a portion of the core exposed, in accordance with embodiments of the present disclosure.

Figure 14S:
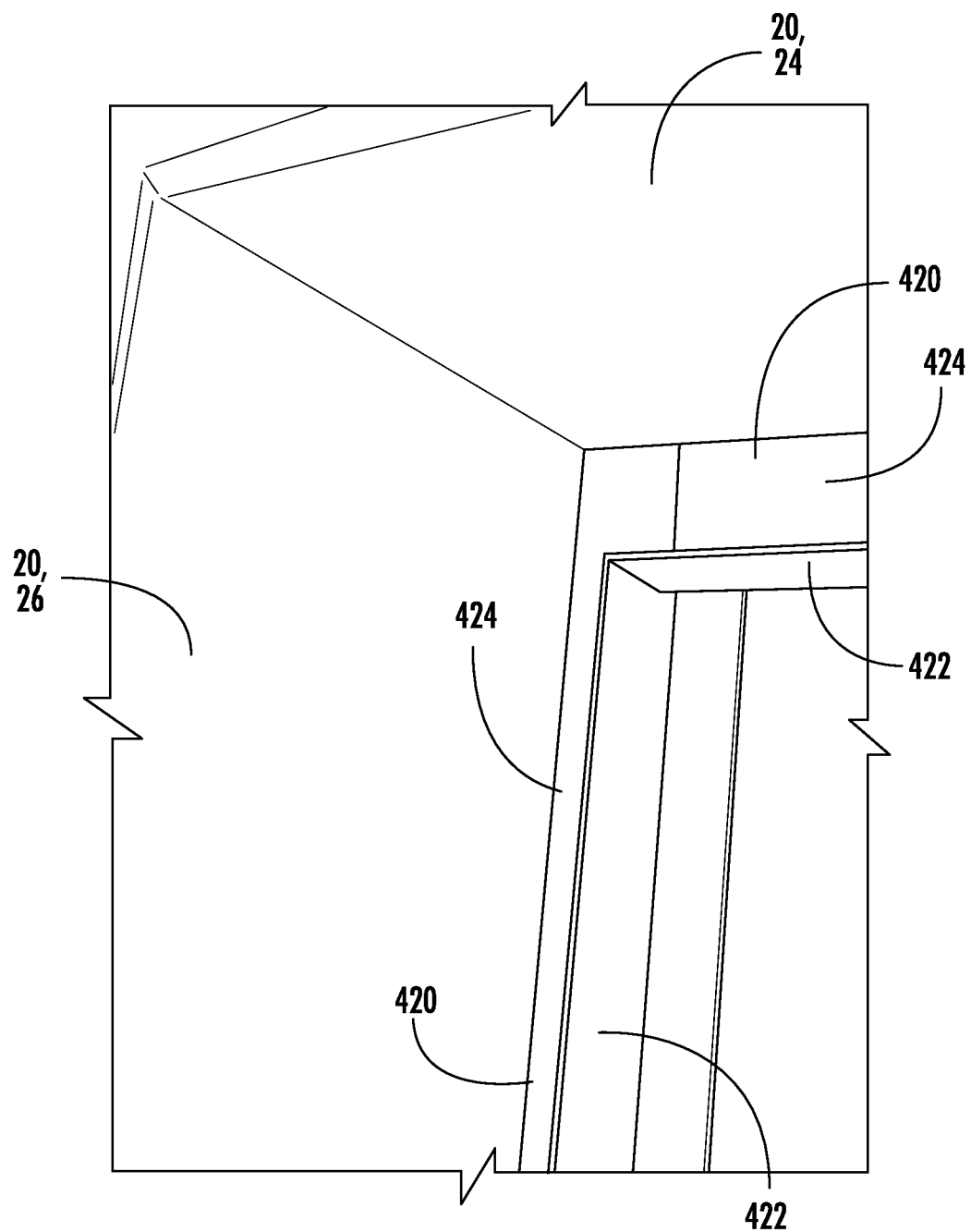

FIG. 14S illustrates a perspective view of a corner of a door frame for a door assembly with a retainer before installing the EMC seals to the retainer of the door frame, in accordance with embodiments of the present disclosure.

Figure 14T:
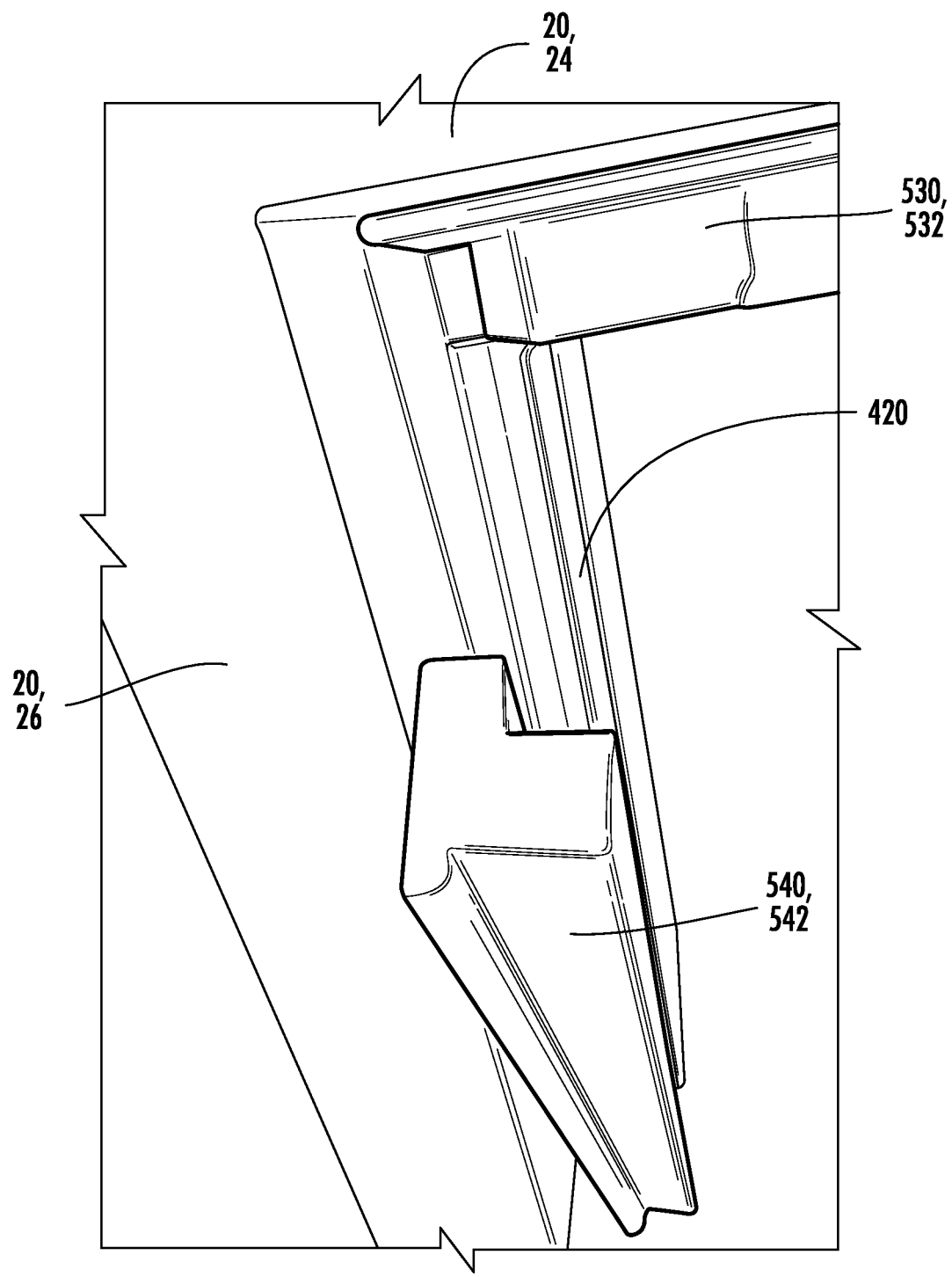

FIG. 14T illustrates a perspective view of a corner of a door frame for a door assembly with an upper EMC seal installed and a side EMC seal being installed, in accordance with embodiments of the present disclosure.

Figure 14U:
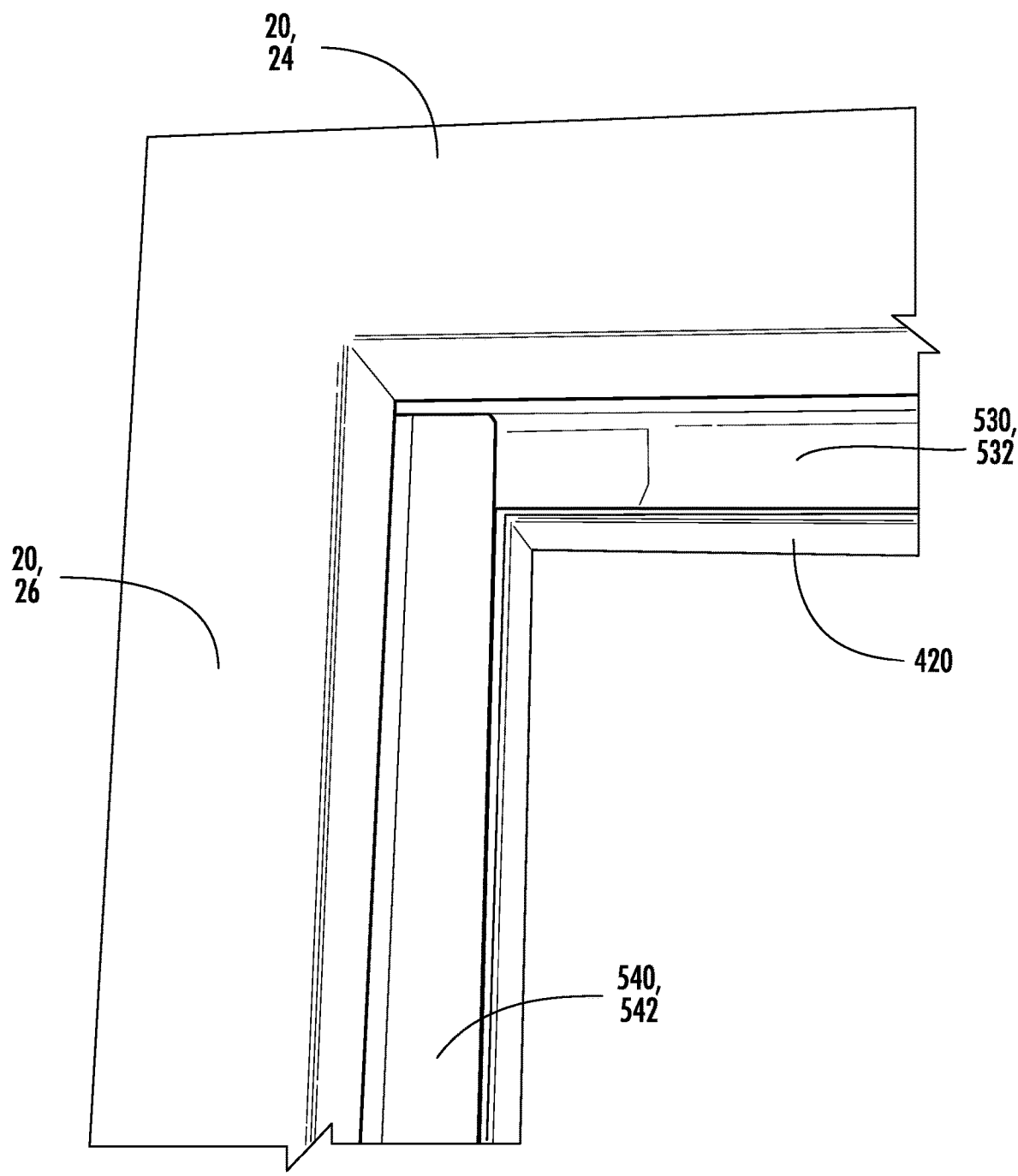

FIG. 14U illustrates a perspective view of a corner of a door frame for a door assembly with an upper EMC seal installed and a side EMC seal installed, in accordance with embodiments of the present disclosure.

Figure 14V:
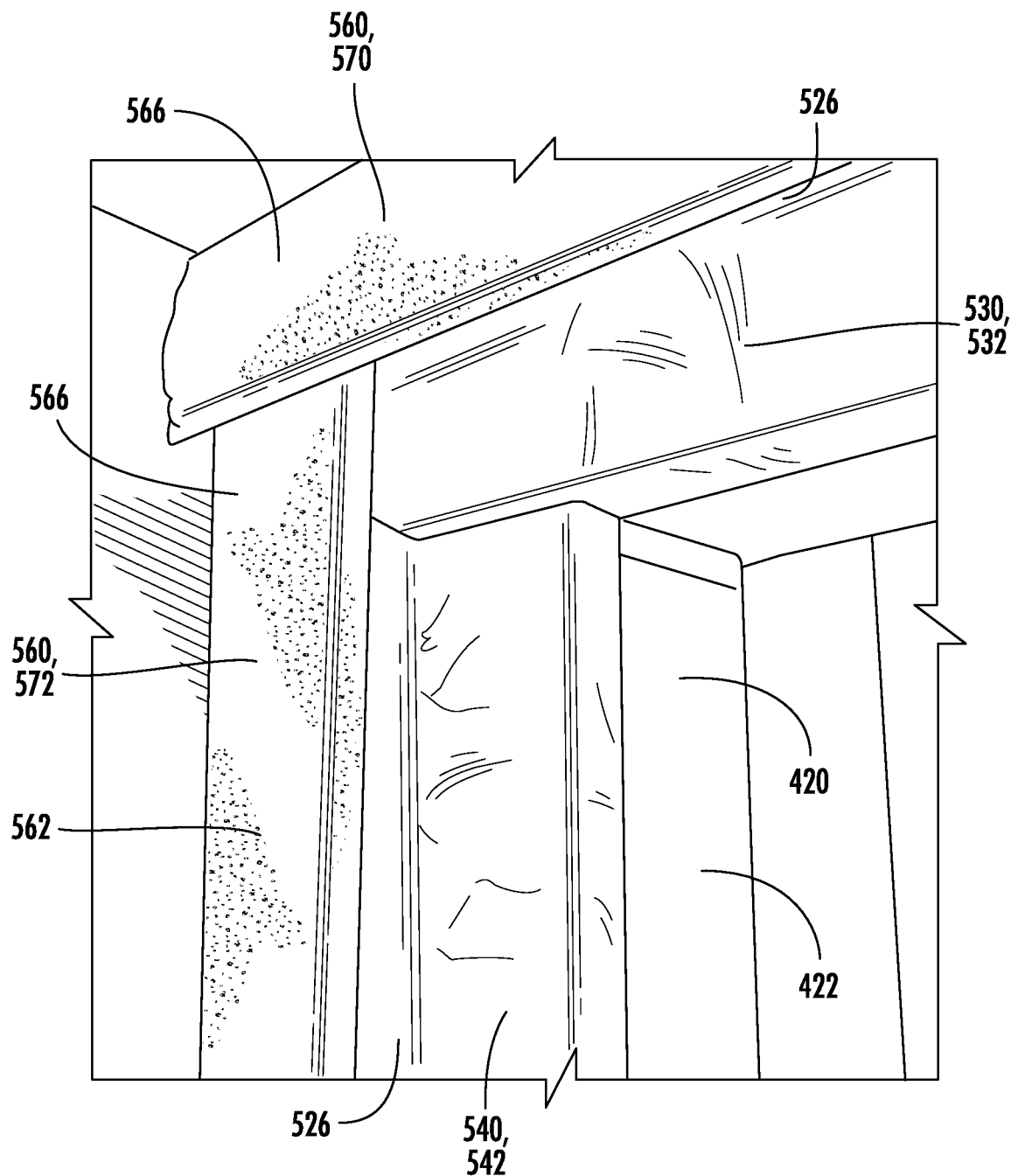
Figure 14W:
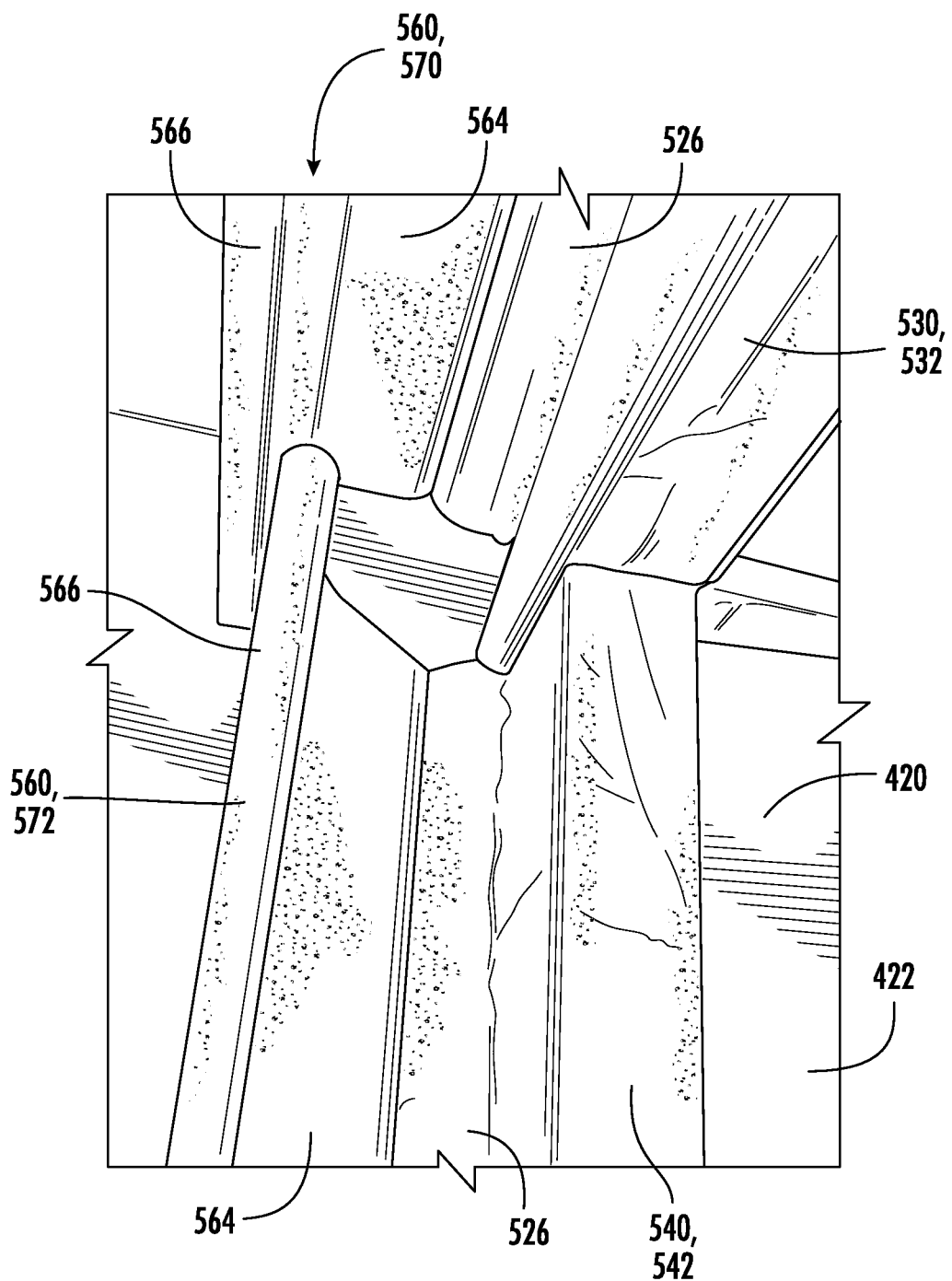

FIG. 14V illustrates a perspective view of a corner of a door frame for a door assembly with an EMC seal assembly installed having a primary EMC gasket seal and a secondary EMC gasket seal, in accordance with embodiments of the present disclosure FIG. 14W illustrates a perspective view of a corner of a door frame for a door assembly with and EMC seal assembly installed having a primary EMC gasket seal and a secondary EMC gasket seal, in accordance with embodiments of the present disclosure.

Figure 14X:
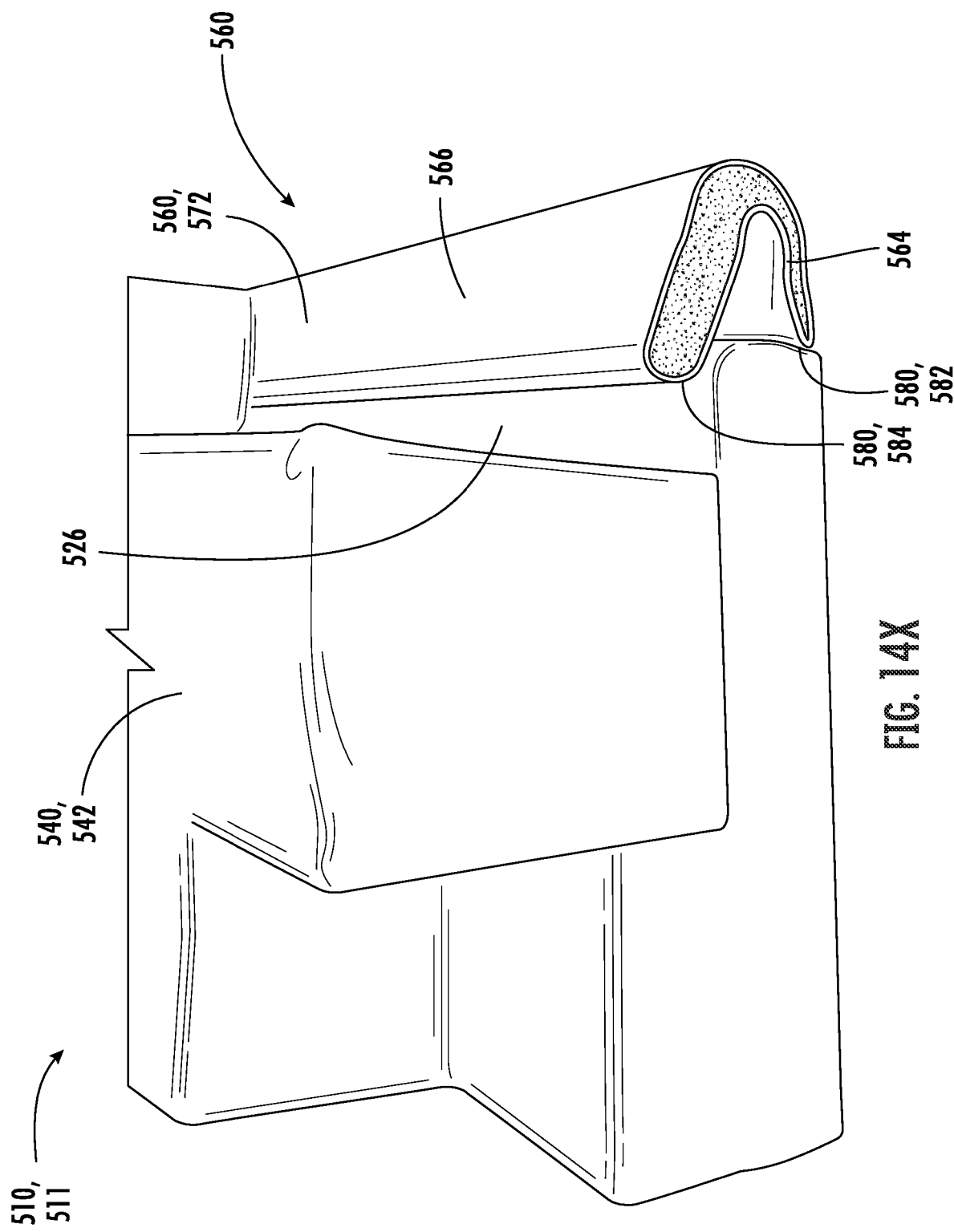

FIG. 14X illustrates a perspective view of the multipoint connection between the primary EMC gasket seal and the secondary EMC gasket seal when a door is closed, in accordance with embodiments of the present disclosure.

Figure 14Y:
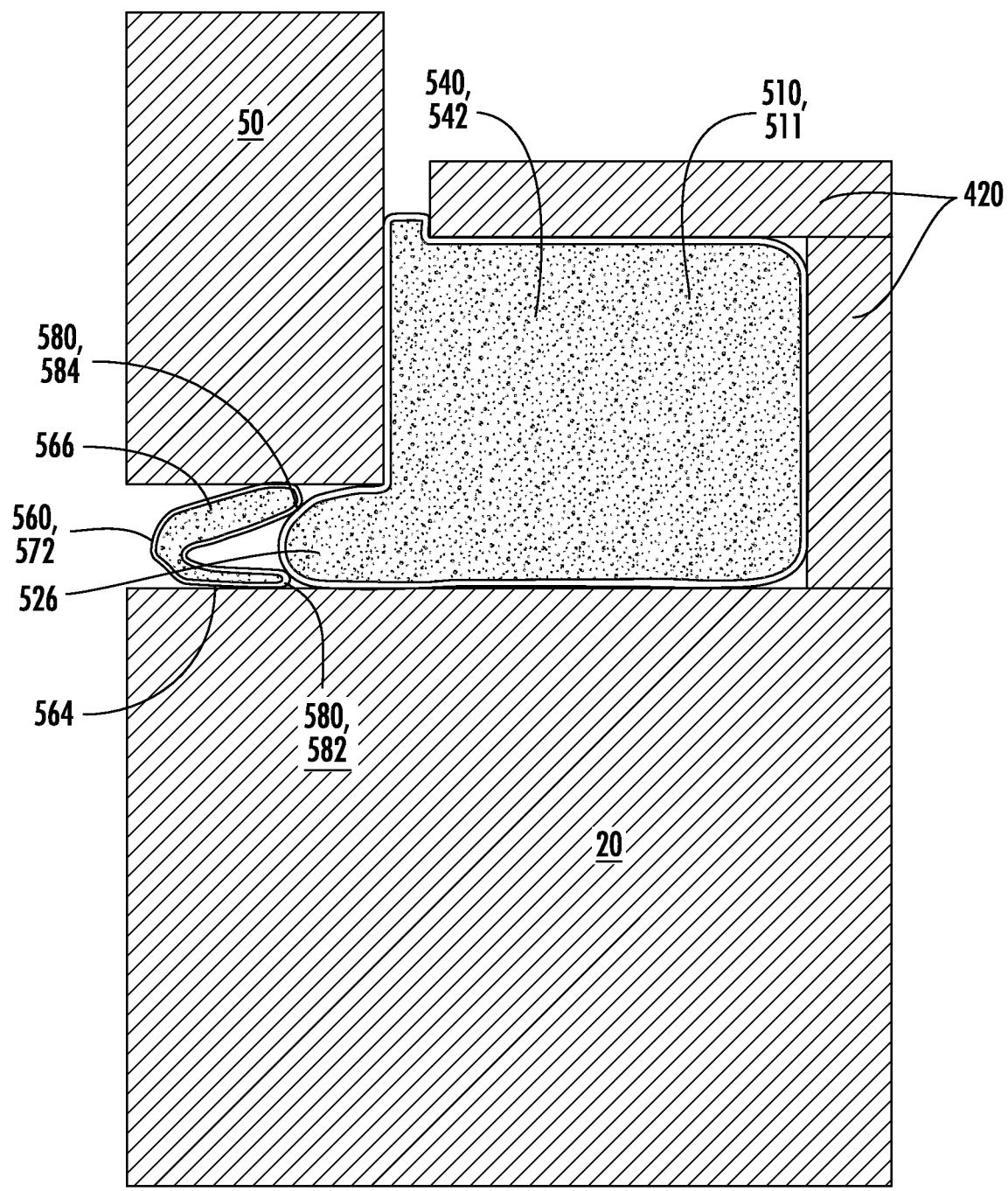

FIG. 14Y illustrates a cross-sectional view of the multipoint connection between the primary EMC gasket seal and the secondary EMC gasket seal between a door frame and a door when a door is closed, in accordance with embodiments of the present disclosure.

Figure 14Z:
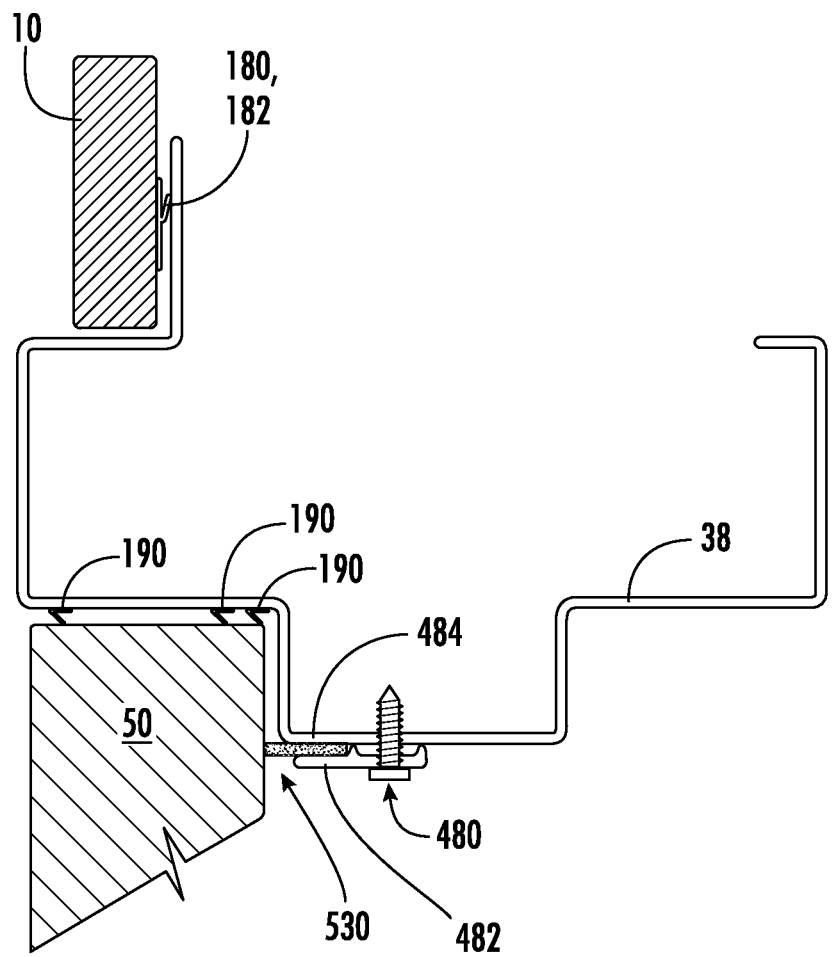

FIG. 14Z illustrates a cross-sectional view of an EMC door assembly utilizing a retainer attached to a stop in the door frame, in accordance with embodiments of the present disclosure.

Figure 15A:
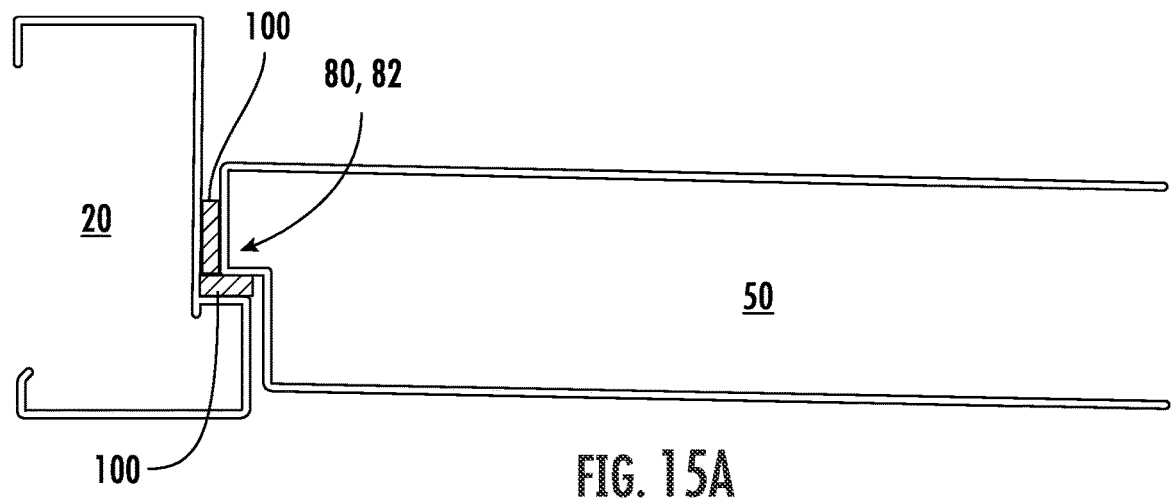

FIG. 15A illustrates an alternate door assembly that utilizes a two-stepped door edge and frame, in accordance with embodiments of the present disclosure.

Figure 15B:
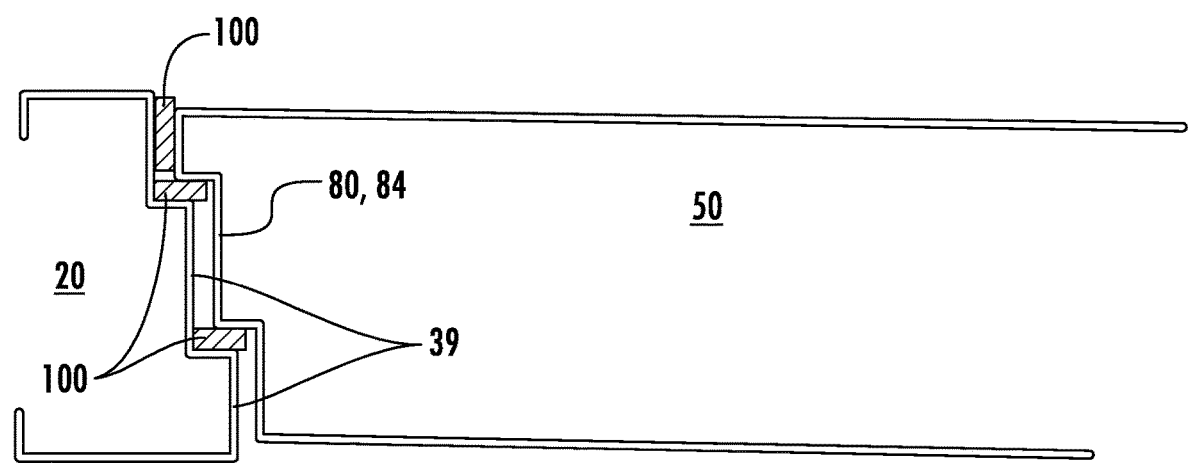

FIG. 15B illustrates an alternate door assembly that utilizes a three-stepped door edge and frame, in accordance with embodiments of the present disclosure.

Figure 15C:
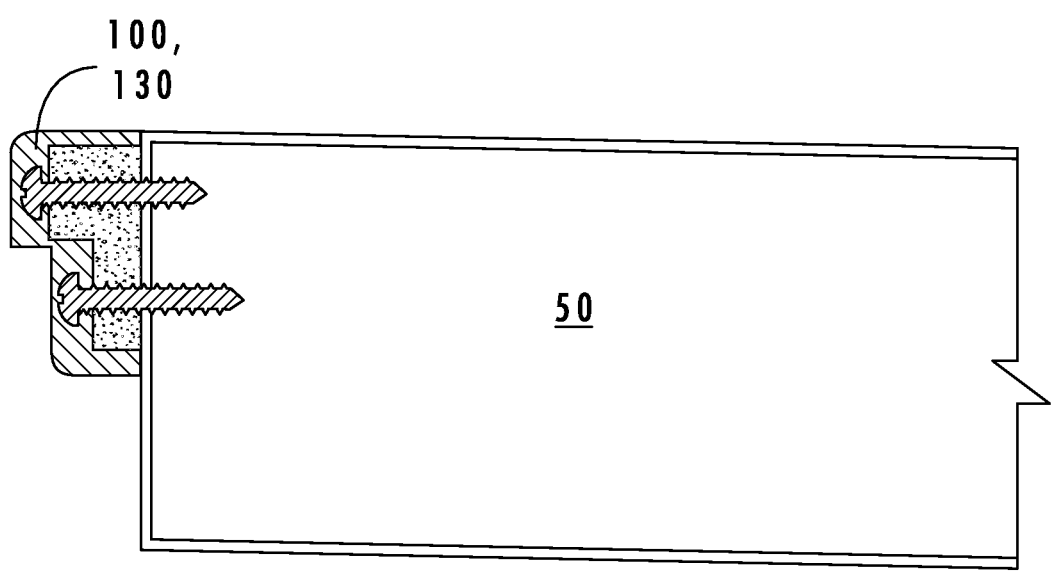

FIG. 15C illustrates a cross-sectional view of an alternate door assembly that uses a two-stepped EMC seal, in accordance with embodiments of the present disclosure.

Figure 16A:
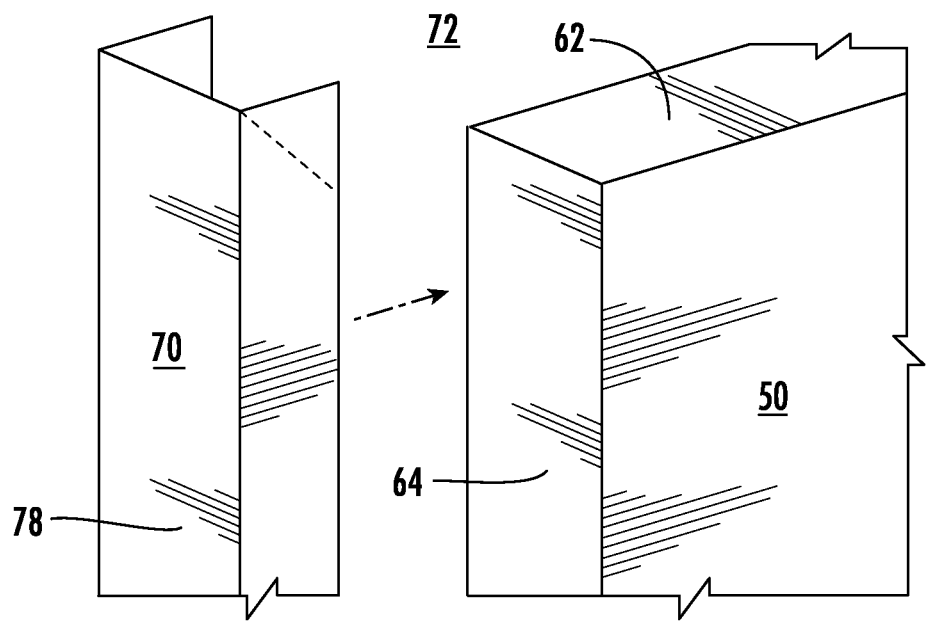

FIG. 16A illustrates EMC door trim being installed on a non-conductive door or a conductive door, in accordance with embodiments of the present disclosure.

Figure 16B:
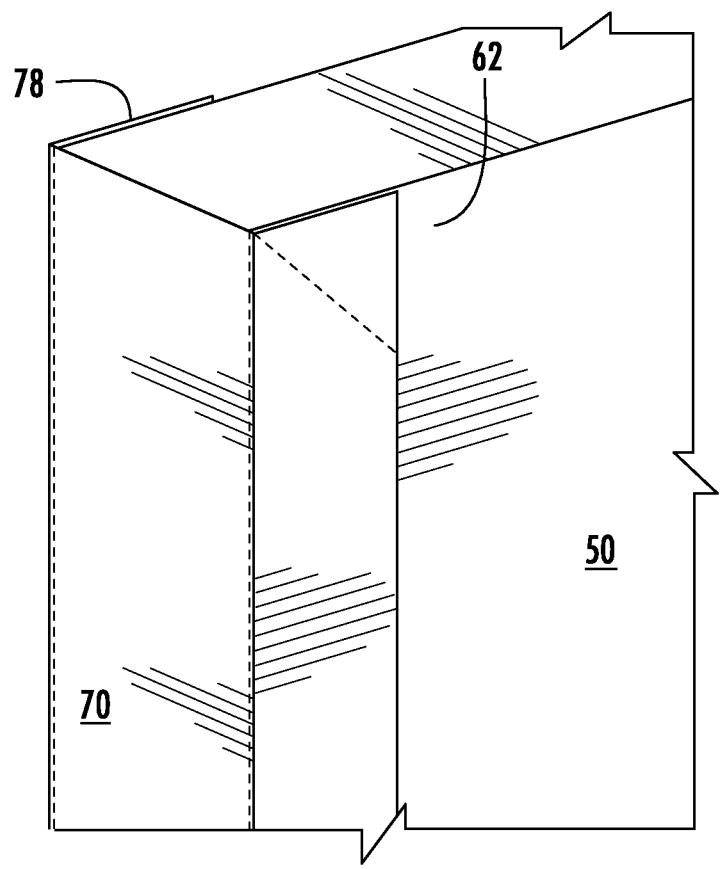

FIG. 16B illustrates EMC door trim installed on a non-conductive door or a conductive door, in accordance with embodiments of the present disclosure.

Figure 16C:
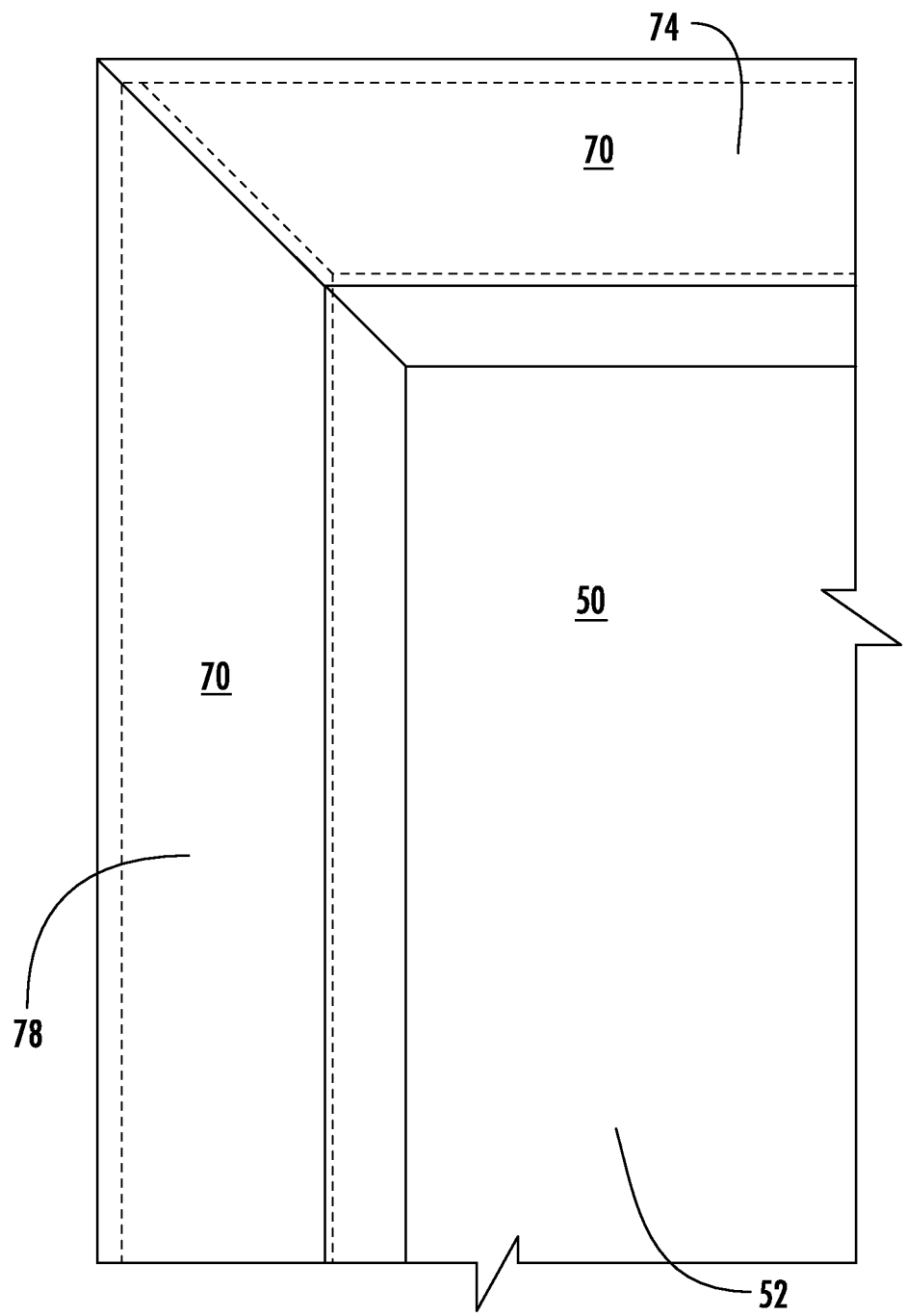

FIG. 16C illustrates EMC door trim with mitered ends installed on a non-conductive door, in accordance with embodiments of the present disclosure.

Figure 16D:
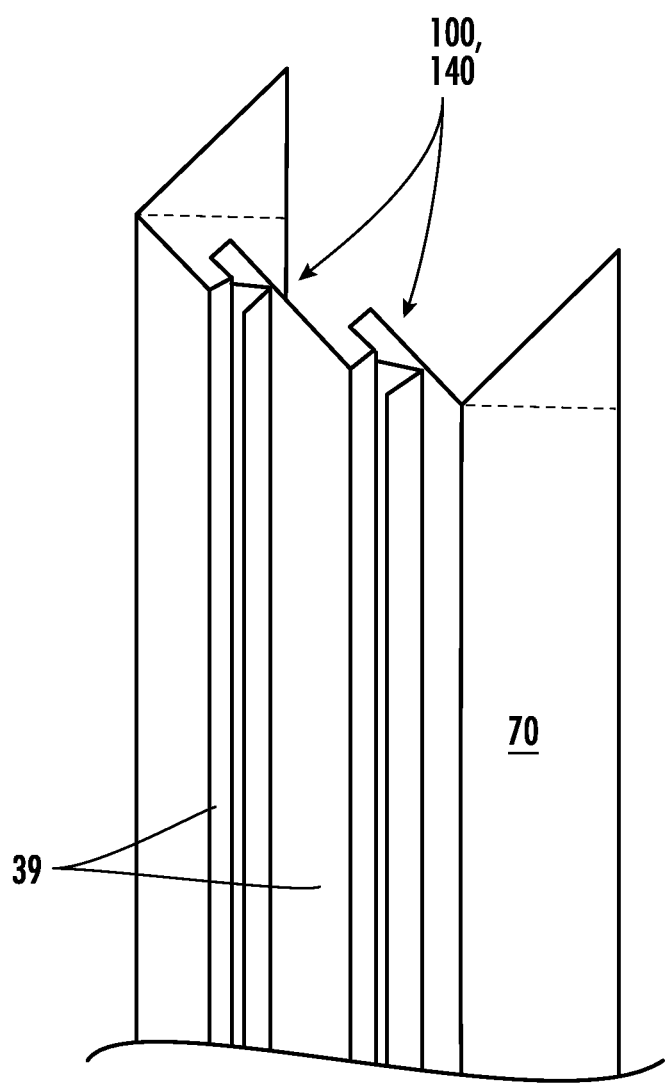

FIG. 16D illustrates a perspective view of an alternate EMC door trim with EMC seals, such as EMC kerf seals, in accordance with embodiments of the present disclosure.

Figure 17A:
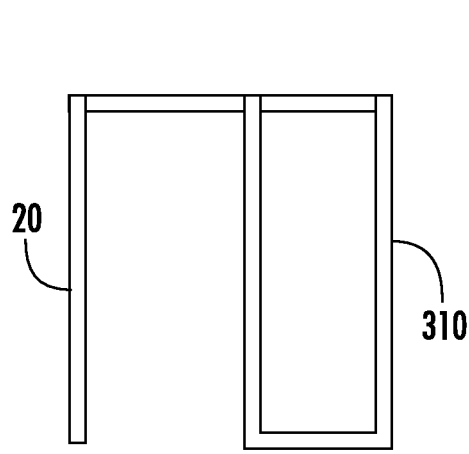

FIG. 17A illustrates a front view of a door frame and sidelight frame, in accordance with embodiments of the present disclosure.

Figure 17B:
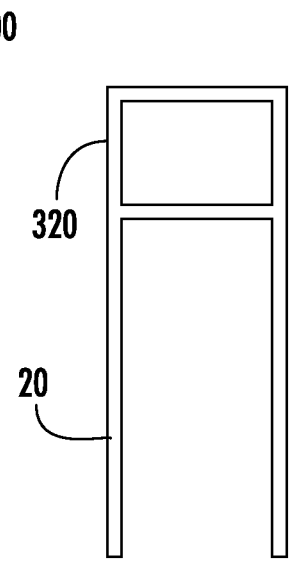

FIG. 17B illustrates a door frame and transom frame, in accordance with embodiments of the present disclosure.

Figure 17C:
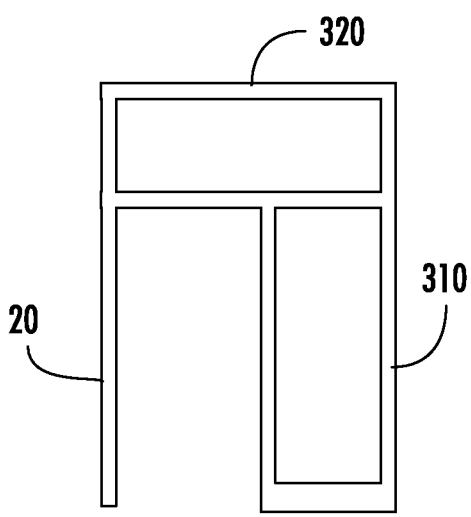

FIG. 17C illustrates a door frame, a sidelight frame, and a transom frame, in accordance with embodiments of the present disclosure.

Figure 17D:
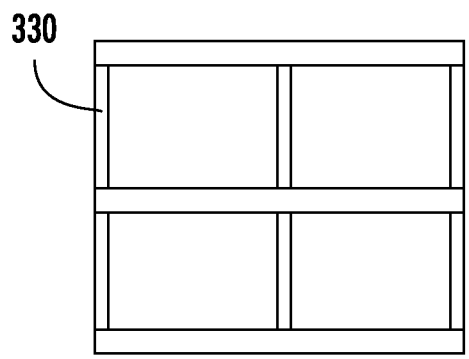

FIG. 17D illustrates a window frame, in accordance with embodiments of the present disclosure.

Figure 17E:
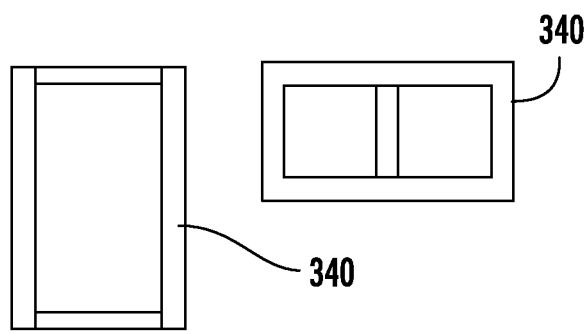

FIG. 17E illustrates borrowed light frames, in accordance with embodiments of the present disclosure.

Figure 17F:
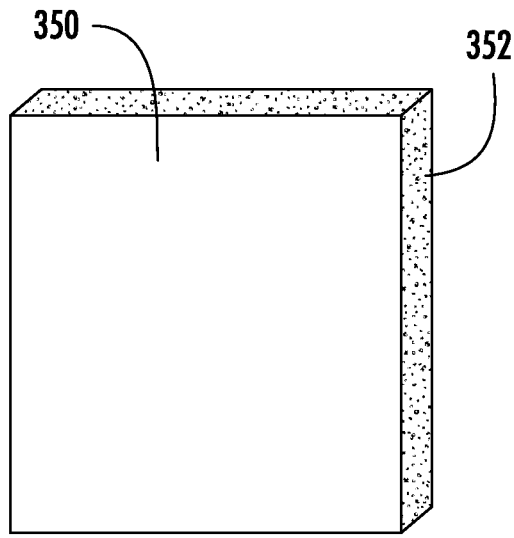

FIG. 17F illustrates a transparent material with EMC shielding around the edges, in accordance with embodiments of the present disclosure.

Figure 17G:
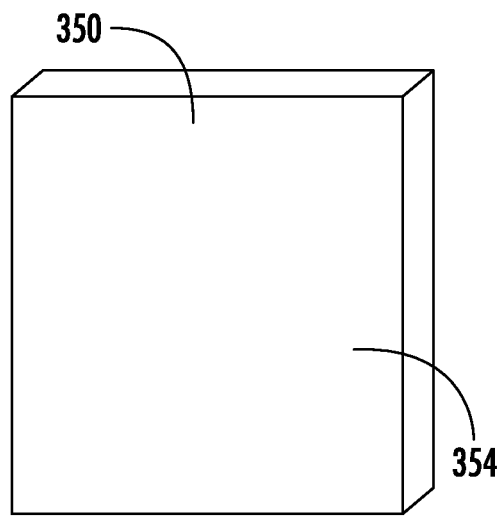

FIG. 17G illustrates a transparent material with EMC shielding on or in the surfaces, in accordance with embodiments of the present disclosure.

Figure 17H:
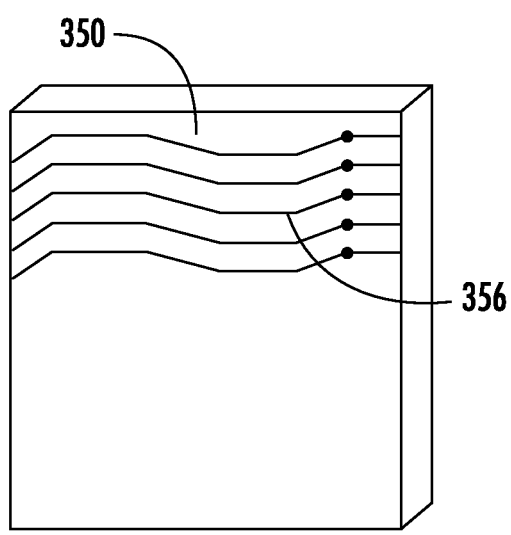

FIG. 17H illustrates a transparent material with circuits on or in the surfaces, in accordance with embodiments of the present disclosure.

Figure 17I:
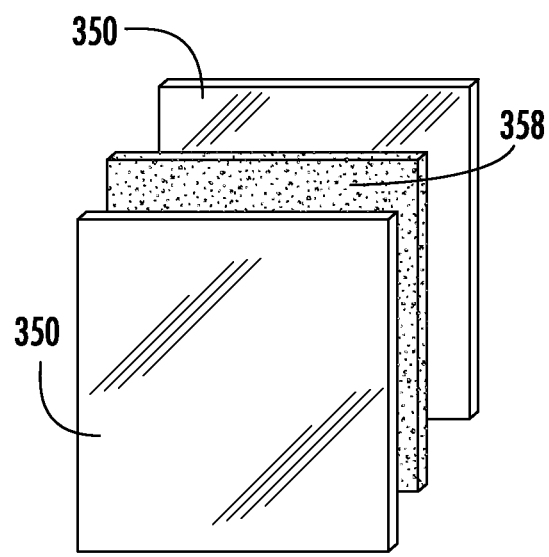

FIG. 17I illustrates a transparent material with multiple layers including an EMC shielding layer, in accordance with embodiments of the present disclosure.

Figure 18:
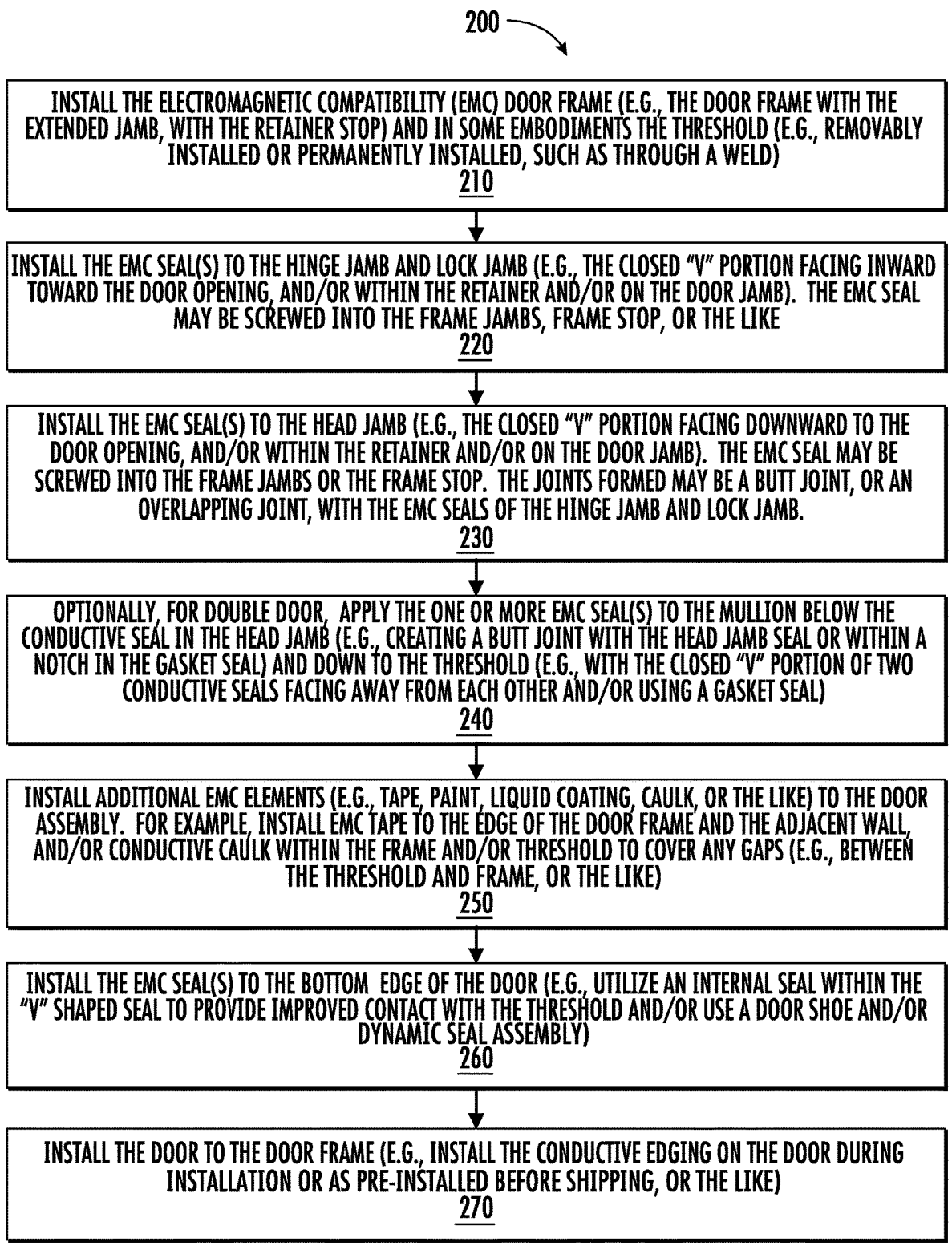

FIG. 18 illustrates a method of installing a door assembly having EMC shielding, in accordance with embodiments of the present disclosure.

DETAILED DESCRIPTION

The following detailed description teaches specific example embodiments of the invention; however, other embodiments of the invention do not depart from the scope of the present invention. The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes" and/or "including" when used herein, specify the presence of stated features, steps, operations, elements, and/or components, but do not preclude the presence or addition of one or more other features, steps, operations, elements, components, and/or groups thereof.

Embodiments of the invention will be described with respect to FIGS. 1A through 17E illustrating a door assembly 1, comprising a door frame 20 (e.g., otherwise described as an EMC door frame 20, or the like), a door 50 (e.g., otherwise described as an EMC door 50, or the like), conductive seals 100 (e.g., otherwise described as EMC seals, or the like) for completing circuits between the door frame 20, floor (e.g., threshold 40, flooring, or the like), and door 50. Moreover, the door assembly 1 (e.g., otherwise described as an EMC door assembly 1) may comprise one or more EMC elements 180 (e.g., EMC tape, fabric, mesh, paint, adhesive, coating, caulk, or the like) for completing the circuits (e.g., EMC shielding circuits) between the wall 10 and other areas of the EMC door assembly 1 that may have air gaps or open circuit locations. The EMC door assembly 1 described herein provides electromagnetic compatibility (EMC) shielding between two areas (e.g., inside or outside of a structure, such as a building, a room in a building, or the like). It should be understood that EMC shielding is used to reduce (e.g., limit, block, or the like) the levels of electrogenic interference (EMI)/radio frequency interference (RFI) radiation that is able to pass by the shielding. While EMI and RFI are often used interchangeably, EMI covers any frequency of electrical noise, while RFI is a specific subset of electrical noise within the radio frequency spectrum. As such, the EMC shielding may be used within building enclosures to reduce the transmission of electric or magnetic fields from one area to another. In particular, the EMC shielding provides improved security by reducing interference with electrical devices (e.g., telecommunications, hospital equipment, or the like) and reduces unauthorized surveillance of sensitive electronic data (e.g., confidential information, trade secrets, personal identifiable information (PII), health information, or the like). Specifically, the EMC door assembly 1 of the present disclosure may be designed to provide EMC shielding effectiveness (SE) shielding of 40-105 dB per IEEE 299-2006 (9 kHz-18 GHz) (as of the date of this filing) and may be used in any commercial, industrial, or governmental applications, such as NSA, Military Standards, Transient Electromagnetic Pulse Emanation (TEMPEST) standard applications depending on project requirements, which limits electric or electromagnetic radiation. More specifically, the EMC shielding may provide up to and including 93 bB for double doors, and up to and including 103 dB for single doors (at frequencies from 9 kHz to 18 GHz). However, the EMC shielding may provide any bB and/or frequencies depending on the materials used and installation type. The EMC door assembly 1 of the present disclosure provides improved structures, materials, assembly processes, or like, or combinations thereof to enhance the EMC shielding performance, and in some embodiments, to improve additional door assembly performance (e.g., sound, weather, air flow, heat, cold, fire or the like abatement, and/or other benefits).

As illustrated in FIGS. 1A and 1B, the door frame 20 may comprise three portions including an upper portion 24 (e.g., a header portion, or the like) disposed adjacent an upper end of a door opening, and two side portions 26, 28 (e.g., hinge side 26, latch side 28, or the like) disposed along either edge of the door opening, with one side portion 26 being on the hinge side of the door 50, and the opposite side portion 28 being on the latch side of the door 50. Each portion 24, 26, 28 of the door frame 20 may be made up of one or more elongated frame segments of sufficient length to fit the door opening and door 50. The one or more elongated frame segments are assembled around the open edges of wall 10. The door frame portions 24, 26, 28 may be secured to each other and/or an adjoining structure by frame connectors 25 (e.g., clips, tabs, fasteners, tapes, adhesives, welding, or the like). As further illustrated in FIG. 1A, a door 50 may be hung otherwise conventionally within the door opening by hinges 90 secured by fasteners through openings to hinge reinforcements 27 in one (for a single door) or both (for double doors) of frame side portions 26, 28 so that the door face contacts frame stops, as will be described herein. The door frame 20 may be made of any metal (e.g., steel, copper, aluminum, stainless steel, metal alloys, or the like), but in particular embodiments the door frame 20 may be made of stainless steel, steel, or aluminum, which provides the desired EMC shielding properties. In other embodiments, the door frame 20 may be made of conductive non-metal material (e.g., some composites, hybrids, 3D printed materials, or the like). In other embodiments, when the door frame 20 is made at least partially of non-conductive materials, the door frame 20 surface(s) may be coated with an EMC coating (e.g., containing EMC particles, conducive paint, clear coatings, film, sheet, or the like liquid that hardens, or solid materials). The door frame 20 design may be standard profile, masonry profile, dry wall profile, weather KERF profile, thermal break profile, adjustable frame profile, adjustable thermal break profile, retainer stop (e.g., adjustable or non-adjustable seal retainer and/or a retainer cover), or the like, as will be described herein.

As will be described with respect to FIG. 18, when the door frame 20 is installed within a door opening around a wall 10, EMC elements 180, such as tape, caulk, coatings, fabrics, mesh, covers, or the like may be used between the outer edge of the door frame 20 and the wall 10 to which it is operatively coupled. It should be understood that the wall 10 may have a thickness and/or be made from a material that provides EMC shielding. That is, the wall 10 may include a layer of copper, be painted with EMC paint, be covered in a coating having EMC materials (e.g., particles in the coating, or the like), or the like which provides EMC shielding properties in the wall 10. While the wall 10 and the door frame 20 may both provide EMC shielding, air, and thus electrical signals, may be able to make their way between the wall 10 and the edge of the door frame 20. As such, in order to restrict the flow of air, and thus, the signals between the wall 10 and door frame 20, EMC elements 180, such as EMC tape 182 may be used to overlap a part of the wall 10 and the edge of the door frame 20 (e.g., a flange, leg, or like of the outer edge of the door frame 20).

As illustrated in FIGS. 1A through 2F, it should be understood that in some embodiments each of the door frame portions 24, 26, 28 comprise a first wall face 30 (e.g., parallel with the wall), a first jamb rabbet 31 (e.g., perpendicular with the first wall face 30), a first stop face 32 (e.g., parallel with the first wall face 30), a soffit face 33 (e.g., parallel with the first jamb rabbet 31), a second stop face 33 (e.g., parallel with the first stop face 32), a second jamb rabbet 35 (e.g., parallel with the first jamb rabbet 31), and a second wall face 36 (e.g., parallel with the first wall face 30). Moreover, as illustrated in FIGS. 1C and 1D, the door frame portions 24, 26, 28 may further comprise frame legs 37 (e.g., first and second frame legs) that butt up to the wall 10 (e.g., are perpendicular to the wall 10, or the like). Finally, in some embodiments a wall flange 38 (e.g., an EMC wall flange may extend from the one or more frame legs 37, in order to aid in maintaining an EMC circuit with the EMC shielding in the wall 10.

As will be discussed in further detail herein, while the door frame 20 may have standard sizes, in some embodiments, the door frame 20 may have an oversized door stop that has a first stop face 32 with a width that is greater than or equal to ⅝, ⅝, ⅞, ¹⁵⁄₁₆, ³¹⁄₃₂, ⁶³⁄₆₄, or the like inches, and more particularly has at least a 1 inch width (e.g., length of the first stop face 32, the second stop face 34, or the like). The larger surface area of the first stop face 32 may provide a larger surface for installation of EMC seals 100 that may be larger in order to provide improved EMC shielding when the door 50 is closed, as will be discussed herein. Furthermore, it should be understood that the first jamb rabbet 31 may have a width that is greater than or equal to 1, 1¼, 1½, or the like inches, while the second jamb rabbet 35 may have a with that is greater than or equal to 1, 1, 1¼, 1½, 1¾, 2, or like inches depending on the thickness of the wall 10. However, it should be understood that any size door frames 20, such as standard sized door frames 20, may be utilized for the EMC door assembly 1 of the present disclosure.

The door frame 20 may be any type of door frame 20. For example, as illustrated in FIGS. 1C, 1D, 2A, 2B, and 2C, the door frame may have a standard profile. In other embodiments, as illustrated in FIG. 2E, the door frame 20 may have a KERF profile that utilizes a KERF seal 140. The KERF seal 140 may be an EMC seal 100 that maintains the EMC circuit between the door 50 and door frame 20 when the door 20 is closed. However, it should be understood that the KERF seal 140 may provide other benefits (e.g., sound abatement, fire protection, thermal protection, air infiltration/exfiltration protection, or the like as described herein with respect to other seals). In still other embodiments, as illustrated in FIG. 2F the door frame 20 may be an adjustable door frame 20 that has first and second segments (and in some embodiments more than two segments) that may be adjustable with respect to each other in order to be used on walls having different thicknesses. With respect to an adjustable door frame a thermal barrier 196 (e.g., a non-conductive barrier, such as an elastomer, plastic, rubber, insulative material, or the like), or alternate barrier materials (e.g., an EMC conductive barrier may also function as a thermal barrier and provide EMC shielding), is used between the adjustable segments (e.g., between the surfaces of the first and second segments, or the like) in order to provide a thermal break and/or EMC shielding between the segments to reduce the thermal transfer (e.g., hot/cold) between conductive surfaces. However, it should be understood that one or more EMC seals 100 may be used between the adjustable door frame 20 and the door in order to maintain or enhance a circuit for the EMC shielding. It should be understood that the EMC seals 100 may also provide sound abatement, fire protection, thermal protection, air leakage protection, or the like).

The door 50 may comprise a first face 52, a second face 54, and edges 60 between the first face 52 and the second face 54. The edges 60 may comprise an upper edge 62 (e.g., top edge, or the like), a first side edge 64 (e.g., a hinge edge), a second side edge 66 (e.g., a lock edge), and a lower edge 68 (e.g., a bottom edge). The door 50 may be any type of conventional door, any customized door, or the like. Like the door frame 20, the door may be made of any metal, and in particular, stainless steel or aluminum, which provides the desired EMC shielding properties. In some embodiments, the door 50 may be a hollow metal door in order to reduce the weight of the door 50. However, it should be understood that the door 50 may be made of any material, such as wood, composite, or other material. While the stainless steel door may provide EMC shielding, in some embodiments it may be beneficial to make the door 50 out of wood, composite, or other material. While these other materials may also provide EMI shielding (e.g., due to the thickness of the door, applied EMC coating, EMC film, or the like), door trim 70, as will be described with respect to FIGS. 16A through 16C, may be required on the edges 60 and/or wrapped around a portion of the door 50 near the edges 60 in order reduce any gaps and/or maintain a circuit between the door 50, the EMC seals 100, and/or the door frame 20 when the door 50 is closed. As such, the door 50, like the door frame 20 may be made out of any conductive or non-conductive material (e.g., in some embodiment with EMC coatings, film, or the like). The door 50 may have any thickness; however, in particular embodiments the door 50 may have a door thickness that is 1¾ inches. Moreover, the door 50 may have different weights, but in some embodiments may be 7.8 pounds per square foot (e.g., or be +/−10, 20, 30, 50, 60, 70, 80, 90, 100, 150, 200, 300, 400, 500 percent of the recited weight).

As illustrated in FIG. 1A, the EMC door assembly 1 may use any type of hinge 90. For example, the door 50 may be operatively coupled to the door frame 20 using a pin and barrel hinge, continuous pin and barrel hinge, geared hinge, continuous geared hinge, cam hinge, or other like hinges. However, in some embodiments, as illustrated in FIG. 1E, it should be understood that the hinge 90 may be a cam hinge 92. The cam hinge 92, may use an angled upper knuckle 94 and angled lower knuckle 95, and one or more pins 96 operatively coupling the upper knuckle 94 and lower knuckle. When the door is opened the angled knuckles 94, 95 rotate with respect to each other in order to lift the door as the door is moved to one or more open positions and lower the door as the door is moving from one or more open positions to a closed position. By lifting the door 50 during opening and lowering the door 50 during closing (e.g., using the cam hinges 92) the EMC seals 100 at the bottom edge of the door, in the threshold 40, and/or on the floor may be preserved (e.g., reduce the damage and/or wear and tear on the seals). That is, the lifting and dropping action of the cam hinges 92 reduces the friction on the bottom EMC seals 100 during opening and closing. In some embodiments the hinges 90, in particular the cam hinges 92 may include one or more wires 98 which may be used to transmit energy and/or information between the door frame 20 and door 50 (e.g., for electric locks, electronic panels in the door 50, window, or the like).

As illustrated in FIGS. 2A through 9C any type of EMC seal 100 may be used between the door frame 20 and the door 50, between the door 50 and the floor (e.g., threshold 40, flooring, or the like), and/or between the door 50 and a mullion 48 (e.g., of a double door system, or the like). In some embodiments, it should be understood that the EMC seal 100 may be a finger stock seal 110, a composite finger stock seal 120 (e.g., a finger stock seal with an inner seal), a gasket seal 130 (e.g., otherwise described as a compression seal 130, compression gasket seal 130, or the like of any size and/or shape) that is flexible or rigid made from one or more materials (e.g., elastomer, foam, rubber, vinyl, silicone, or the like, and optionally covered in wire, fabric, or the like), a KERF seal 140 (e.g., that has a portion located within a KERF cavity within a door frame 20), and/or any other type of seal, as will be described in further detail herein.

As illustrated in FIGS. 3 and 4, the finger stock seal 110 may have an elongated longitudinal axis that has a plurality of apertures 111 (e.g., slots, or the like) located generally transverse to the longitudinal axis of the finger stock seal 110. As illustrated in FIGS. 4 and 5, the finger stock seal 110 may include a first leg 112 (e.g., a first finger leg), a second leg 114 (e.g., a second finger leg), and/or a third leg 116 (e.g., a third finger leg). In some embodiments, the finger stock seal 110 may only have two legs, such as the first leg 112 operatively coupled to the second leg 114 and generally having a V-shaped configuration. In other embodiments, the finger stock seal 110 may have three legs, such as the first leg 112 and the second leg 114 having the V-shaped configuration, as well as a third leg 116 extending from the second leg 114 forming a triangular shaped seal. The end of the third leg 116 may include a fourth leg 118 or a fourth finger leg (e.g., a straight leg, a hook leg, or the like), which may aid in allowing the end of the third leg 116 and/or the fourth leg 118 to slide along a surface (e.g., a surface of the door frame 20). The end of the third leg 116 and the fourth leg 118 (e.g., the hook, or the like) and the end of the first leg 112 may form an opening in the triangular shaped seal, as illustrated in FIG. 4.

While the specific finger stock seals 110 may have the shape discussed with respect to FIGS. 3 and 4, it should be understood that any type of finger stock seal 110 may be utilized. For example, as illustrated in FIGS. 5 and 6, different types of finger stock seals 110 with any number of legs that are directed outwardly, directed inwardly, are curved, straight, have multiple bends, or the like may be used. Moreover, the plurality of fingers 115 (e.g., the solid portions of the seal between the apertures 111) of the finger stock seal 110 may be uniform or different. For example, the plurality of fingers 115 may be different sizes and/or shapes, which creates different sizes and shapes of the apertures 111 in the finger stock seal 110. For example, the size and shape of the plurality of fingers 115 may change the number of apertures 111 (e.g., transverse from the longitudinal axis along the entire length, between individual fingers, or the like), the width of the apertures 111 (e.g., aperture space is different, or the like), the direction of the apertures 111 (e.g., opposing apertures 110 that extend from different sides), different profiles for the apertures 111 (e.g., circular, half-circular, rectangular, square, or the like), length of apertures 111 (e.g., the apertures 111 extend different distances through the finger stock seal), and/or other like features. As further illustrated in FIG. 6, and as will be described in further detail herein, the finger stock seals 110 (or other types of seals 100) may be secured to surfaces in different ways using seal connectors 102, such as by using clips, fasteners, adhesive, welds, soldering, or the like.

FIGS. 7 and 8A illustrate that in some embodiments the EMC seal 100 may be a composite EMC finger stock seal 120. For example, the composite finger stock seal 120 may have the same configuration as the finger stock seal 110 as described with respect to FIGS. 3 through 6 above. However, the composite finger stock seal 120 may further have a gasket seal 130 located within at least a portion of the finger stock seal 110. In the embodiments illustrated in FIGS. 7 and 8, the elongated inner gasket seal 130 is an o-shaped seal (e.g., a conductive silicone o-shaped seal, or other seal made of other material). It should be understood that while the finger stock seal 110 alone may provide the desired level of EMC shielding, the composite finger stock seal 120 may provide addition levels of EMC shielding (e.g., additional contact points between the fingers that have openings, or the like), may provide the desired levels of EMC shielding in locations where a finger stock seal 110 may not work as well (e.g., between the bottom edge 68 of the door 50 and a threshold 40), and/or may provide additional door assembly performance (e.g., sound, weather, air flow, heat, cold, fire, or the like abatement, as will be described herein). For example, when the composite finger stock seal 110 is used between the bottom edge 68 of the door 50 and a threshold 40, the gasket seal 130 within the finger stock seal 110 that forms the composite finger stock seal 120 may be used to aid in re-expanding the finger stock seal 110 when the door 50 is opened, and/or aid in maintaining contact of the finger stock seal 110 with the threshold 40 when the door 50 is closed.

As previously discussed herein, and as illustrated in FIG. 9A, other types of seals, such as gasket seals 130 may be utilized with the EMC door assembly 1. The gasket seals 130 may be made of a single type of material, such as an elastomer, foam, polymer, silicone, or the like. In some embodiments, the gasket seals 130 may be made of a uniform material, but it some embodiments, the gasket seals 130 may be made of multiple types of materials, and as such may be referred to as composite gasket seals 131. For example, the composite gasket seals 131 may have an internal core 132 (e.g., made of an elastomer, intumescent, foam, polymer, silicone, or the like) and an external cover 134 (e.g., made of fabric, metal, or the like that may be knitted, spiraled, mesh, or the like). It should be further understood that in some embodiments, the composite gasket seals 131 may further have one or more internal metal elements that are bendable to allow at least a portion of the seal to be shaped for installation purposes, magnetic to improve performance, shielding, sealing, or the like.

FIGS. 9B and 9C, illustrate particular embodiments of the invention in which the composite gasket seal 131 has an external cover 134 (e.g., fabric, such as woven, non-woven, or the like) that is located over the internal core 132 (e.g., foam core, or the like). It should be understood that the external cover 134 may be operatively coupled to the internal core 132, such as bonded through the use of an adhesive (e.g., heat-shrink adhesive, or the like). The adhesive may be conductive adhesive to provide additional EMC shielding, or the adhesive may be non-conductive adhesive. As illustrated in FIGS. 9B and 9C, the external cover 134 may be an EMC material, as described herein, such as a fabric (e.g., a woven, non-woven, or other like fabric) that provides EMC shielding. The internal core 132 may be a foam core, which in some embodiments may be an ethylene propylene diene monomer (EPDM) foam that provides acoustic benefits (e.g., sound rating), moisture barrier protection, fire rating, and/or other benefits.

In some embodiments, the fabric cover 134 may be slipped over the internal core 132 and operatively coupled through the use of an adhesive, such as a heat activated adhesive. In some embodiments, the heat activated adhesive may be a shrink to fit adhesive that is within the fabric cover 134, attached to the internal surface of the fabric cover, or slipped over the exterior surface of the fabric cover 134. As such, when heated, the fabric cover 134 is bonded to the internal core 132 in order to form the composite gasket seal 131.

In other embodiments, as previously discussed herein, the external cover 134 may be a wire mesh (e.g., knitted wire mesh, or the like) that is slipped over the internal core 132 and operatively coupled to each other using an interference fit, an adhesive, or other connector. In some embodiments, the external cover 134 may be formed around the internal core 132 in other ways (e.g., knitted around, wrapped around, wound around, or the like with or without adhesive). Furthermore, in some embodiments multiple internal cores 132 may be layered or located inside of each other in order to provide different benefits of the composite gasket seal 131 (e.g., structural reinforcement, fire rated material, data transfer, energy harvesting, energy transfer, or the like).

Returning to FIG. 9A, the gasket seals, regardless of if the gasket seals 130 are made of a single material or if they are composite gasket seals 131, may have different types of profiles (e.g., the cross-sectional shapes). As illustrated in FIG. 9A, the seals 130, 131 may have a cord profile, a tube profile, a D-profile (with adhesive or a clip), a square profile, a rectangular profile, an L-shaped profile, a T-profile, a p-profile, a tadpole profile, double piping profile, u-profile, V-shaped profile, or other like profile. As such, these gasket seals 130, 131 may be used as a frame perimeter seal, door bottom seal (e.g., inverted channel), automatic door bottom seal, applied astragal seal, or other type of seal that may be used in different locations within an EMC door assembly 1.

It should be understood that in some embodiments of the invention multiple EMC seals 100 may be utilized in the same location adjacent to each other. For example, as illustrated in FIGS. 2A and 2C, and as will be described in further detail herein, two EMC seals 100 may be located on the door 50 and door frame 20, respectively. For example, as illustrated in FIG. 2A, a rectangular EMC seal 100 (e.g., an EMC composite gasket seal 131) may be located on the door frame 20, while a circular EMC seal 100 (e.g., an EMC composite gasket seal 131 with legs extending from the circular portion) may be utilized on the door 50. Alternatively, as illustrated in FIG. 2C, an EMC composite gasket seal 130 with an angled profile having at least two legs (e.g., V-shaped, L-shaped, or the like) may be utilized on the door frame 20, while a circular EMC seal 100 (e.g., a EMC composite gasket seal 130 with a leg extending from the circular portion) may be utilized on the door 50. In still other embodiments, it should be understood that different types of seals that provide different performance benefits may be utilized on different portions of the door assembly 1 adjacent to each other. For example, as illustrated in FIG. 2B an EMC seal 100 may be utilized on the door 50 or the door frame 20, along with a secondary seal 190 (e.g., a gasket seal 130 with one or more legs that may or may not be an EMC seal) used on the door 50 or the door frame 20 to provide additional EMC shielding and/or other performance benefits (e.g., acoustical seal for sound abatement, or the like). Furthermore, as illustrated in FIG. 8B the composite finger stock seal 120 may be used along with a secondary seal 190 (e.g., a gasket seal 130 with one or more legs that may or may not be an EMC seal) for weather protection. Moreover, as illustrated in FIG. 8C, a different type of EMC seal 100 (e.g., different than a composite finger stock seal 120), such as an EMC gasket seal 130 having a rectangular profile may be used along with two or more secondary seals that may or may not have EMC properties (e.g., gasket seals with single legs) that may provide sound abatement or other benefits, as will be described in further detail herein.

Regardless of the type of seal (e.g., EMC seal 100, secondary seal 190 that provides EMC shielding or other benefits, or the like), the seals may have any type of shape (e.g., full-circular, quarter-circular, semi-circular, rectangular, square, oval, elliptical, V-shaped, c-shaped, u-shaped, trapezoidal, polygonal, uniform, non-uniform, or the like). Moreover, the seals may be attached in any way, such as using a seal connector 102 (e.g., adhesive, fasteners, heat, coating, sealant, caulk, and/or glue, or the like). Additionally, or alternatively, the seals (e.g., composite gasket seal 131, or the like) may be oversized to create an interference (e.g., compression) fit, such that the seal is partially compressed, inserted into a cavity, released, and partially expands within the cavity for retention within the cavity (e.g., of a door shoe, frame member, retainer stop 420, retainer strip 480, other retainer, or the like).

Use of the EMC seals 100 in a door assembly 1 will be described in further detail herein. For example, FIGS. 10 through 13B illustrates the use of the finger stock seals 110 and/or composite finger stock seals 120. In other examples, FIGS. 14A through 14Z illustrate the use of gasket seals, such as composite gasket seals 131 (e.g., primary EMC gasket seals 510 and/or secondary EMC gasket seals 560). The use of the EMC seals 100, for example as illustrated in these figures, provides improve EMC shielding to door assemblies 1.

As illustrated in FIGS. 10 through 13B, the EMC seals 100 may be operatively coupled to the door frame 20 and/or the door 50 depending on the configuration of the door assembly 1. FIGS. 10 through 13B illustrate that the EMC seals 100 (e.g., the finger stock seals 110, or the like) may be installed on the door stop face 32 of the upper frame 24, the hinge side frame 26, the lock side frame 28, and/or the mullion 48 of a double door assembly 1. The EMC seals 100 may be installed any way, however, in the illustrated embodiments, the first leg 112 of the finger stock seal 110 may have adhesive 119 that secures the finger stock seal 110 to the first door stop face 32. However, it should be understood that the EMC seals 100 may be secured in other ways using other connectors (e.g., fasteners, or the like) and/or to any other portions of the door frame 20 and/or door 50. For example, as illustrated with respect to FIG. 2A, one or more EMC seals 100 may be operatively coupled to the first jamb rabbet 31 and/or to the side door edge 66 and/or the second door face 54. In other embodiments, as illustrated in FIG. 2D, one or more EMC seals 100 may be operatively coupled to a door edge 60 through the use of one or more fasteners.

FIGS. 14A through 14Z illustrate the use of the composite gasket seals 131 within a door assembly 1. For example, as illustrated in FIGS. 14A and 14B, the door frame 20 may comprise an EMC door assembly 1 with a door frame 20 that may utilize a door frame 20 with a retainer stop 420. The retainer stop 420 may be any type of retainer stop 420 that has one or more flanges 422 that may form a retainer stop cavity 424, which is configured to receive a composite gasket seal 131 (e.g., an EMC composite gasket seal 131), such as a composite gasket seal 131 in the form of a rectangular EMC composite gasket seal 430. The retainer stop 420 may be operatively coupled to an upper portion 24 and/or the two side portions 26, 28 (e.g., hinge side 26, latch side 28, or the like) of the door frame 20. For example, the retainer stop 420 may be integrally operatively coupled to the door frame 20 or may be operatively coupled through the use of one or more retainer stop connectors 426 (e.g., fasteners, such as screws, self-drilling fasteners, rivets, or the like, welds, structural adhesives, or other like connectors). As further illustrated in FIGS. 14A and 14B, the retainer stop 420 may comprise of a seal retainer portion 430 (otherwise described as a seal retainer member) and a retainer cover portion 432 (otherwise described as a retainer cover member). As such, the seal retainer 430 and/or the retainer cover 432 may have one or more flanges 422 that are used to retain the composite gasket seal 130. It should be understood that in some embodiments the retainer stop 420 may be adjustable (e.g., the seal retainer portion 430 and the retainer cover portion 432 may be adjustable with respect to each other, such as through apertures that may or may not be slotted) to change the location and/or width of the retainer stop 420, and thus, the retainer cavity 424 formed therefrom.

FIGS. 14C and 14D illustrate a door bottom seal assembly, such as a door shoe assembly 440 for retaining a gasket seal 130 (e.g., an EMC composite gasket seal 131, or the like). The door shoe 440 may be any type of door shoe that has one or more shoe flanges 442, such as a first flange 444 and a second flange 446. The one or more shoe flanges 442 may form a shoe cavity 448 in which the composite gasket seal 130 may be retained. It should be understood that the door shoe 440 may be formed from a first shoe portion 450 (otherwise described as first shoe member) and a second shoe portion 452 (otherwise described as a second shoe member). The first shoe portion 450 may be a z-shaped member; however, it should be understood that it may have any type of shape (e.g., L-shaped, planer-shaped, u-shaped, h-shaped, H-shaped, or the like). The first shoe portion 450 may be operative coupled to a first face 52, a second face 54, and/or an edge 60 (e.g., lower edge 68, or the like) of the door 50. The second shoe portion 452 may be an h-shaped member; however, it should be understood that it may have any type of shape (e.g., u-shaped, z-shaped, L-shaped, or the like). The second shoe portion 452 may be operatively coupled to the first shoe portion 450 and/or to a first face 52, a second face 54, and/or an edge 60 (e.g., lower edge 68, or the like) of the door 50. As illustrated in FIGS. 14C and 14D, the first shoe portion 450 and/or the second shoe portion 452 may be operatively coupled to the first face 52 of the door 50 through the use of one or more shoe connectors 454 (e.g., fasteners, such as screw, bolts, rivets, or the like, welds, structural adhesives, or the like) and/or shoe apertures 456 (e.g., slotted apertures, holes, or the like). As such, not only are the first shoe portion 450, the second shoe portion 452, and/or the door 50 operatively coupled together, but the location of the second shoe portion 454 may be set with respect to the first shoe portion 452 and/or the lower edge 68 of the door 50 in order to locate the bottom of the EMC composite gasket seal 131 in order to ensure good contact of the EMC composite gasket seal 131 with the mating surface (e.g., floor, a threshold 40, or the like).

It should be further understood that instead of, or in addition to, a first shoe portion 450 and a second shoe portion 452, the door shoe 440 may have a third, fourth, or the like shoe portions. For example, the shape of the portions illustrated in FIGS. 14C and 14D may be separated, rearranged, and/or operatively coupled to the door 50 in different ways.

As illustrated in FIG. 14D, a door bottom seal assembly may use an EMC composite gasket seal 131 that is operatively coupled to a door shoe 440 by inserting the composite gasket seal 130 into the cavity 448 of the door shoe 440 through the use of seal connectors 102, such as fasteners (e.g., such as screws, bolts, rivets, or the like), tape, adhesives (e.g., structural adhesives, or the like), clips, and/or other types of connectors. Additionally, or alternatively, the EMC composite gasket seal 131 may be oversized to create an interference (e.g., compression) fit, such that the seal is partially compressed, inserted into a cavity, released, and partially expands within the cavity for retention within the cavity (e.g., of a door shoe, frame member, retainer stop 420, retainer 480, other retainer, or the like).

FIGS. 14E through 14G illustrate different embodiments of a door bottom seal assembly, such as a dynamic seal assembly 460. The dynamic seal assembly 460 may comprise an actuator that is actuated downwardly when the door 50 is closed (e.g., when moving from a position adjacent to the closed position to closed) and upwardly when the door is opened (e.g., when moving from a closed position to an open position). For example, as the door 50 is being closed, a member (e.g., pin, or the like) may engage the door frame 20, and the member may engage the actuator in order to extend the EMC composite gasket seal 131 downwardly (e.g., through the use of an actuator having one or more levers, cams, springs, or the like). As such, in the closed position the EMC composite gasket seal 131 is moved downwardly to engage with the floor and/or threshold 40 and create the EMC circuit at the bottom surface (e.g., floor, threshold 40, or the like).

FIGS. 14H, 14I, and 14J illustrate other embodiments wherein the EMC composite gasket seal 131 is utilized between double doors 50 within an astragal assembly 470. For example, as illustrated in FIG. 14H, the astragal assembly 470 comprises a first astragal portion 472 (e.g., a first astragal member) operatively coupled to a first door 50, and a second astragal member 474 (e.g., a second astragal member) operatively coupled to a second door 50. The astragal portions are operatively coupled to the first and second doors 50 through the use of astragal connectors 476 (e.g., fasteners, such as screws, or the like, welds, or other connectors). In some embodiments of the invention, as illustrated in the double door assembly of FIG. 14I, a mullion 48 may be utilized along with one or more EMC composite gasket seals 131 that are operatively coupled to the first and second doors 52 and/or a surface of the mullion 48. FIG. 14J illustrates another embodiment of an astragal assembly 470. In this embodiment, the first and second astragal portions 472, 478 are the same as or similar to the configuration of the retainer stop 420 (e.g., an astragal seal retainer, an astragal cover). Moreover, the first astragal portion 472 may be located on one side of the first door 50 (e.g., a first face 52), while the second astragal portion is located on the opposite side of the first door 50 (e.g., a second face 54).

FIGS. 14K through 14O illustrate embodiments of the assembling the EMC composite gasket seals 131 together at the ends of the EMC composite gasket seals 131. For example, as illustrated in FIG. 14K, the multiple gasket seals 130, 131 may be used in a gasket seal assembly 500 (e.g., with or without using EMC gasket seals 131). For example, in some embodiments the seal assembly 500 may be an EMC seal assembly 500 having one or more EMC composite gasket seals 131 utilized within a door frame 20 (e.g., an upper frame EMC gasket seal 131 and two side frame EMC gasket seals gasket seals 131, or the like). For example, an EMC gasket seal assembly 500 may comprise of multiple primary EMC gasket seals 510 having a seal body 512 with seal ends 514, such as a proximal end 516 and a distal end 518. Moreover, the seal ends 514 may have end notches 520 that extend at least partially into the seal body 512. In some embodiments, the notches may comprise a partial notch 522 that extends partially into the seal body 512, or a full notch 524 that extends through the seal body 512 of the EMC composite gasket seals 510. The notches 520 are illustrated as being generally square or rectangular; however, it should be understood that the notches 520 may be any shape (e.g., stepped, circular, triangular, dovetail, oval, other uniform shape, a non-uniform shape, or the like). The notches 520 may be utilized to operatively couple adjacent EMC composite gaskets seals 510 to improve the EMC capabilities of the of the gasket seal assembly 500. However, it should be understood that the notches 520 may be utilized in any type of gasket seal assembly that is not for EMC shielding but may provide improved benefits for other purposes (e.g., improved sound abatement, fire rating, or the like).

It should be understood that the EMC gasket seal assembly 500 may comprise primary gasket seals, such as a first gasket seal 530 (e.g., a rectangular first gasket seal 532) operatively coupled to a second gasket seal 540 (e.g., a rectangular gasket seal 542), and a third gasket seal (not illustrated). As such, the gasket seal assembly 500 may comprise of multiple gasket seals 510 that overlap each other at the seal ends 514. Traditional seals, which may butt up against each other (e.g., at a 90 degree, 45 degree, or the like angle) may separate from each other when compressed, and thus, result in a gap or space between the seals. As such, traditional seals may result in gaps in the circuit that reduce the effectiveness of the EMC shielding. Unlike traditional seals, since at least a portion of the seal ends 514 of the EMC gasket seals 510 of the present disclosure overlap each other, when compressed by the door 50 (e.g., against the frame the adjacent EMC gaskets seals 510 are squeezed together and do not separate to create a gap.

As illustrated in FIGS. 14M through 14O, in some embodiments of the invention, the gasket seals 510 may comprise body projections 526 that extend at least partially along the length of the gasket seal 510 seal (e.g., in some embodiments along the entire length of the seal, or the like). Moreover, in some embodiments of the invention, the gasket seals 510 may comprise end projections 528 that extend at least partially from the end of the EMC gasket seals 510. In some embodiments, the projections 526, 528 provide additional points of contact for the gaskets seals 510 in order to improve the EMC shielding. The body projections 526, 528 may be any type of shape (e.g., half-circular, oval, square, rectangular, triangular, angled, uniform, non-uniform, or the like).

FIGS. 14P and 14Q illustrate another embodiment of an EMC gasket seal 131, such as an angled gasket seal that may be a secondary seal 190. As such, in some embodiments, the EMC gasket seal assembly 500, may further include a secondary EMC gasket seal 560 that may be used in combination with the one or more EMC gaskets seals 510, which may be described as primary EMC gasket seals 510 (e.g., a first primary EMC gasket seal 530, a second primary EMC gasket seal 540, and/or third primary EMC gasket seal) previously discussed herein. For example, the secondary EMC gasket seal 560 may be utilized to provide additional points of contact to improve the EMC circuit for the EMC shielding. As illustrated in FIGS. 14P and 14Q, the secondary EMC gasket seal 560 may be an angled EMC gasket seal 562 that comprises a first gasket leg 564 (e.g., a mount gasket leg, or the like) operatively coupled to a second gasket leg 566 (e.g., a flexible gasket leg). In some embodiments, the secondary gasket seal 560 may be formed of multiple secondary gasket seals 560 (e.g., a first secondary gasket seal 570, a second secondary gasket seal 572, a third secondary gasket seal—not illustrated —, or the like). In other embodiments, the secondary EMC gasket seal 560 may be a single secondary EMC gasket seal 560 that may be used around the door frame 20 and/or door 50. For example, the secondary EMC gasket seal 560 may have one or more secondary gasket notches 568 (e.g., mitered notch, or the like). The one or more secondary gasket notches 568 may allow a single gasket seal 560 to be used around the door frame 20 and/or the door 50. For example, as illustrated in FIGS. 14P and 14Q the secondary gasket notches 568 allow the secondary gasket seal 560 to be installed around a corner (e.g., of a door frame 20, or the like) without having to butt the gasket seals 560 against each other that could result in the separation of the ends of the adjacent secondary gasket seals 560 when compressed.

As illustrated in FIG. 14R, it should be understood that any cuts made in the EMC seals 100 (e.g., the EMC gasket seals 131, such as the primary EMC gasket seals 510, the secondary EMC gasket seals 560, or the like), such as for installation (e.g., for changing the length of the seal, or the like), in the notches 520, 568 (e.g., during manufacture, installation, or the like), or in the event the seals need repair, may be covered using an EMC patch 550. As such, any exposed core 132 (e.g., foam, or the like) may be covered with an EMC patch 550 that may be made from the same or similar material as the cover 134. The EMC patch 550 may be a flexible material (e.g., pre-cut, cut on demand, sticker, or the like), a cap (e.g., pre-formed 3D cover, or the like), or other like patch that may cover any exposed portion of the core 132 (e.g., exposed when cut during installation, or the like). For example, as illustrated in FIG. 14R, the cover 134 (e.g., Ni—Cu fabric cover) may be used in order to cover the core 132 (e.g., foam compression core) after the EMC seal 131 has been cut to length in order to provide improved EMC shielding (e.g., reducing gaps in the circuit). For example, the primary EMC gasket seals 510 and/or the secondary EMC gasket seal 560 can be cut to the proper length prior to installation. The exposed end of the seals 510, 560 can be covered with the EMC patch 550, which may be pre-shaped to properly fit the profile of the EMC seals 510, 560 to cover the exposed end of the core 132 of the seals 510, 560. In some embodiments, the EMC patch 550 may have pressure sensitive adhesive to bond the EMC patch 550 to the seals 510, 560. Alternatively, the EMC patch 550 may slip over an end of the EMC seals 100, or may otherwise be operatively coupled to the end of the EMC seals 100.

FIGS. 14S through 14W illustrate the installation and/or operation of the EMC gasket seal assembly 500 within the door frame 20. As previously illustrated and described with respect to FIGS. 14A and 14B, the door frame 20 may utilize a retainer stop 420 that has one or more flanges 422 that may form a retainer stop cavity 424 which is configured to receive the one or more EMC gasket seals 510. For example, as illustrated in FIGS. 14S through 14U, the first EMC gasket seal 530 and/or the second EMC gasket seal 540 may be assembled to the retainer stop 420, for example, by inserting the first gasket seal 530 and second gasket seal 540 to each other (e.g., using the notches 520 previously described herein, or the like) and/or to the retainer stop 420 using one or more seal connectors 102 and/or through an interference fit. As previously described herein, the one or more seal connectors 102 may be fasteners (e.g., such as screws, self-drilling fasteners, rivets, or the like), welds, tape, adhesives, and/or other like connectors. Moreover, as illustrated in FIGS. 14V and 14W, the one or more secondary EMC gasket seals 560 may be operatively coupled to the door frame 20 (e.g., a first jamb rabbet 31, or the like) through the use of one or more seal connectors 102 and/or through an interference fit within a cavity in the door frame 20 and/or attached to the door frame 20. For example, a first leg 564 may use adhesive and/or tape (or another connector) to operatively couple the first leg 564 to the door frame 20 (e.g., a first jamb rabbet 31). As illustrated in FIGS. 14S and 14T, multiple secondary EMC gasket seals 560 may be used, and as such adjacent ends (e.g., a proximal end of a first secondary gasket seal and a distal end of a second secondary gasket seal) may overlap. Alternatively, the secondary EMC gasket seal 560 may be a single gasket seal that includes the secondary gasket notches 568, as illustrated in FIGS. 14P and 14Q, to assembly the single secondary EMC gasket seal 560 to the door frame 20.

FIGS. 14X and 14Y illustrate the interaction between the one or more primary EMC gasket seals 510 and the one or more secondary EMC gasket seals 560. For example, as illustrated when the door 50 is closed, the door 50 may fold the second leg 566 of the secondary EMC gasket seal 560 and/or at least partially compress the one or more primary EMC gasket seals 510 and/or the one or more secondary EMC gasket seals 560. As such, not only does the first leg 564 of the secondary EMC gasket seal 560 contact the one or more primary EMC gasket seals 510 (e.g., the one or more body projections 526 of the gasket seals 510), but the second leg 566 of the secondary EMC gasket seal 560 contacts the one or more primary EMC gasket seals 510 (e.g., the one or more body projections 526 of the gasket seals 510). In this way, in some embodiments, two points of contact 580 (e.g., a first point of contract 582, and a second point of contact 584) may be created between the one or more secondary EMC gasket seals 560 and/or the one or more primary EMC gasket seals 510. As such, creating two or more points of contact 580 between the one or more primary EMC gasket seals 510 and the one or more secondary EMC gasket seals 560 may make a stronger EMC circuit and/or will provide a better circuit in that any gaps in a contact point 580 (e.g., first contact portion 582, second contact point 584, or other contact points) may have one or more backup contact points. For example, should a portion of the first leg 564 of the secondary EMC gasket seal 560 have a gap with the gasket seal projection 526 of a primary EMC gasket seal 510 (e.g., a gap where the first contact point should be located), the second contact point 584 between the second leg 566 and the gasket seal projection 526 of the primary EMC gasket seal 510 at the same location (e.g., location of the gap along the length of the body 512 of the gasket seals 510) provides a back-up EMC circuit. The back-up EMC circuit makes the path that an electrical signal would have to travel through EMC seal assembly 500 longer, thus improving the EMC shielding effectiveness.

In alternate embodiments of the invention, as illustrated in FIG. 14Z, instead of using the retainer stop 420 previously discussed herein, the EMC door assembly 1 may utilize a retainer strip 480. Like the retainer stop 420 (e.g., having the retainer stop flanges 422 that form the retainer stop cavity 424), the retainer strip 480 may have one or more retainer strip flanges 482 that form a retainer strip cavity 484 that receives and/or retains an EMC seal 100 (e.g., EMC gasket seal 131). The retainer strip 480 may be operatively coupled (e.g., removably through the use of connectors, or permanently through welds, or the like) to the door frame 20, and in particular, to a frame stop (e.g., integral with the frame 20, attached to the frame 20, or the like), such as a soffit face 33 of a door frame 20. It should be understood that while the EMC gasket seals 131 may be secured within the retainer stop 420 and/or the retainer strip 480 described herein, any type of retainer (e.g., with flanges that form a cavity) may be used to secure an EMC gasket seal 131 and/or other type of seal. As further illustrated in FIG. 14Z, secondary seals 190, such as secondary EMC gasket seals 560, STC sound rated secondary seal 190, and/or other types of secondary seals 190 may provide additional EMC shielding, sound abatement, and/or other types of protection for the EMC door assembly 1.

While specific types, shapes, and configurations of primary EMC gasket seals 510 and secondary EMC gasket seals 560 are illustrated and described herein, it should be understood that any type, shape, and configuration of the EMC seals 100 described herein may be utilized between the door frame 20 and/or door 50 in order to provide the EMC shielding.

FIGS. 15A and 15B illustrate other embodiments of the invention in which, the door edge 60 may have a stepped edge 80, such as a two-step edge 82, a three stepped edge 84, or the like. Moreover, the door frame 20 may have a stepped stop face, such as one or more, two or more, or three or more stepped stops 39. It should be further understood, that one or more EMC seals 100, and in some embodiments two or more, or three or more EMC steals 100 (e.g., one for each stepped edge 80) may be utilized between the stepped edge 80 of the door 50 and/or the stepped stops 39 of the door frame 20. The EMC seals 100 may be operatively coupled to the door 50 and/or the door frame 20, as illustrated in FIGS. 15A and 15B. In other embodiments of the invention, as illustrated in FIG. 15C, the EMC seals 100 themselves may be stepped (e.g., located on the frame 20, or on the door 50 as illustrated in FIG. 15C) in order to mate with a stepped door 50 and/or door frame 20. As such, similar to the multiple contact points 580 previously described herein, the stepped stops 39, the stepped door edges 80, and/or the stepped EMC seals 100 provide a more difficult path for air, and thus electrical signals to pass between the door frame 20 and the door edges 60, thus improving the EMC shielding of the EMC door assembly 1.

Furthermore, as illustrated in FIGS. 16A through 16D, in some embodiments the door 50 may utilize door trim 70 to provide EMC shielding, and in some embodiments, door trim with stepped edges, stepped edges with an EMC kerf seal 140, or the like. Like the door 50 and/or door frame 20, the door trim 70 may be any type of material, but in particular embodiments may be made from stainless steel or aluminum. The door trim 70 may be used when the door is a wood, composite, plastic, fiberglass, fabric, hybrid, or other type of door that is non-conductive. In these configurations, the thickness of the door 50, EMC coatings (e.g., liquid coatings that dry, paint, solid coatings, such as films, sheets, fabric, or the like), or the like may provide EMC shielding, however, the signals may be able to pass between the edges 60 and/or faces 52, 54 of the door and the EMC seal 100 since the circuit between the EMC seal 100 and the wood, composite, or other like door 50 is not maintained. As such, the door trim 70 may be operatively coupled to the edges 60 and/or at least partially around the first face 52 and/or the second face 54 adjacent the edges 60 of the door 50. Additionally, or alternatively, EMC coatings may be applied to the first face 52, the second face 54, and/or the edges 60 of the door In this way, when the wood, composite, and/or other non-conductive door 50 engages the EMC seals 100 operatively coupled to the frame, the conductive circuit is maintained, which improves the EMC shielding for the door assembly 1. The door trim 70 may have mitered ends 72 for operatively coupling upper door trim 74 and/or lower door trim 76, with side door trim 78 portions.

While the present invention is described herein as being used with respect to a door assembly 1, it should be understood that the embodiments of the door assembly 1 described herein may be applied to any type of frame 300 for any type of barrier, such as a sidelight, transom, borrowed lights, windows, or the like. FIGS. 17A through 17E illustrated different types of barrier assemblies 300, that could use any type of frames 301 which could use one or more embodiments of the invention described herein with respect to the door assembly 1. For example, FIG. 17A illustrates a door frame 20 and sidelight frame 310; FIG. 17B illustrates a door frame 20 and transom frame 320; FIG. 17C illustrates a door frame 20, a sidelight frame 310, and a transom frame 320; FIG. 17D illustrates a window frame 330; and FIG. 17E illustrates borrowed light frames 340. As such, the embodiments of the present invention discussed herein with respect to the door assembly 1 may be utilized in any type of frame 300 in any type of barrier (e.g., wall, window, or the like).

When the building fenestration utilizes a transparent material 350 (e.g., clear, frosted, opaque, or the like window), such as in the door 50, frames 20, wall 10, or the like, the transparent material (e.g., glass, plastic, or other like transparent material) may also have EMC shielding. For example, the transparent material 350 in the doors 50, frames 20, sidelights, borrowed lights, windows and the like may utilize EMC glass, EMC coatings, or the like to provide proper EMC shielding. In addition to the transparent material 350 having EMC shielding (e.g., may be made of conductive material), the transparent material may provide power transfer, data transfer (e.g., printed circuits on the material), and/or provide energy harvesting (e.g., solar powered, kinetic power, or the like). For example, as illustrated in FIG. 17F the transparent material 350 may be included on the edges 352 in order to provide the EMC shielding and/or other performance benefits. Alternatively, or additionally, as illustrated in FIG. 17G, the transparent material 350 may have a coating (e.g., nano coating, or the like) on the surface 354 and/or integrated into the glass during manufacturing. In other embodiments, as illustrated in FIG. 17H circuits 356 may be located on or in the transparent material 350 (e.g., 3-D printed circuits, or the like). FIG. 17I further illustrates that in some embodiments the transparent material 350 may have multiple layers 358 that provide one or more performance benefits (e.g., an EMC shield layer, other performance layer). As such, in addition to providing EMC shielding, the transparent material may provide additional performance features (e.g., sound, fire, FEMA, attack resistance, windstorm, or the like abatement, or provide energy harvesting, video display, or other like features).

In some embodiments, when the door assembly 1 provides power transfer, data transfer, and/or energy harvesting, the circuits for any of the forgoing may be included on the surface of the door 50 and/or be located within door 50 (e.g., interior of the door, covered and/or hidden by a surface material that provides aesthetics, or the like). Moreover, the circuits may extend through the hinges of the door 50, into the door frame 20, and then through the wall 10. The circuits may be operatively coupled to the door through the use of printing (e.g., 3D printed, laser printing, or the like), applied in a coating, applied with an adhesive, or the like. In some embodiments the circuit may be used to provide a fire notification (e.g., when the circuit is burned through a fire alarm is triggered). In some embodiments of the invention, wireless communication with the circuits may be used to receive data from and/or transfer data to the circuits.

FIG. 18 illustrates a process for installing the EMC shielded door assembly 1. As illustrated in block 210 of FIG. 18, the door frame 20 is installed within an opening 8 around a wall 10 within a structure (e.g., a room within a building, the building and the outside, or the like). For example, the hinge side frame 26 (e.g., two if using a double door), the lock side frame 28 (e.g., if using a single door), the door mullion 48 (e.g., if using a double door), and the upper door frame 24 are installed using the frame connectors 25. As discussed herein, in some embodiments, the door frame 20 has the oversized door stop that has a door stop face 32 with a width that is greater than ⅝, ⅚, ⅞, 15/16, 31/32, 63/64, or the like inches, and more particularly has a 1-inch width. Additionally, or alternatively the door frame includes the retainer stop 420 previously described herein. Moreover, the threshold 40 (if being used) is also installed between the side door frames 26, 28 adjacent the floor. In some embodiments, the threshold 40 may be welded to the door frame 26, 28 (e.g., the frame strike, hinge jams, or the like).

Block 220 of FIG. 18 illustrates that the EMC seals 100 are installed to the door frame 20 and/or the door 50. The installer may wipe the door frame 20 and/or door 50 (e.g., in particular, the surfaces to which the seals are to be applied) with alcohol or other cleaner. This will aid in providing proper adhesion of the EMC seals 100 (e.g., the structural adhesive tape) to the door frame 20 and/or door 50 edges and/or surfaces. After the door frame 20 is clean, the installer may remove any protective liners from the backside of an EMC seal 100 (e.g., finger stock seal 110, gasket seals 130, or the like) to expose the adhesive strip. In some embodiments the EMC gasket seals 130 and retainer stop 420 or retainer strip 480 may be operatively coupled to the door frame 20 as previously described in herein, such as through fasteners (e.g., such as screws, bolts, rivets, or the like), tape, adhesives (e.g., structural adhesives, or the like), clips, and/or other types of seal connectors 102. Alternatively, or additionally the composite gasket seal 131 can be oversized to create an interference fit for retention to the door frame 20.

In some embodiments, starting at the top right or left corner the door frame sides 26, 28, the finger stock seal 110 is placed with the adhesive leg (e.g., the first leg 112) on the door frame 20 surface, such as the door stop face 32. The finger stock seal 110 is located such that the closed portion (e.g., point of the "V-shaped" portion) faces inward toward the door opening with the open portion of the finger stock seal 110 (e.g., opposite the point of the "V-shaped" portion) facing the door frame rabbet 31. Moreover, the start of the finger stock seal 110 may begin at the top of the jamb of the door frame sides 26, 28 below the upper door frame portion 24 (e.g., below the visible seam between the upper door frame portion 24 and the door frame sides 26, 28). Furthermore, the installer may check that the hat portion of the finder seal (e.g., the point of the V-shaped portion) is almost flush with the stop soffit 33, which provides enough space to allow the end of the third leg 116 (e.g., with or without the fourth leg 118, such as the hook 118, or the like) to move toward the jamb rabbet 31 of the door frame 20 when the finger stock seal 110 is compressed by the door 50. Alternatively, in some embodiments, the side frame EMC gasket seals 131 are placed with adhesive tape within the retainer stop 420. For example, the one or more side frame primary EMC gasket seals 510 and the one or more side frame secondary EMC gasket seals 560 may be installed together or separately. The installer may check that the one or more secondary EMC gasket seals 560 are touching the one or more primary EMC gasket seals 510, as described herein. In some embodiments the EMC gasket seals 130 and retainer stop 420 or retainer strip 480 may be operatively coupled to the door frame 20 as previously described herein, such as through fasteners (e.g., such as screws, bolts, rivets, or the like), tape, adhesives (e.g., structural adhesives, or the like), clips, and/or other types of seal connectors 102. Alternatively, or additionally the composite gasket seal 131 can be oversized to create an interference fit for retention to the door frame 20.

FIG. 18 further illustrates in block 230 that the EMC seal 100 is installed to the upper door frame portion 24 (e.g., the header portion). For example, the finger stock seal 110 may be installed by starting at the right or left corner of the door header frame 24, with the point of the "V-shaped" seal facing down towards the door opening. The installer may form a "butt" joint between the EMC header seal and the EMC side seals, such as between the header finger stock seal 110 and the side frame finger stock seals 110. Again, the installer should check that the hat portion of the finder seal (e.g., the point of the V-shaped portion) is almost flush with the stop soffit 33. Alternatively, in some embodiments, the upper frame EMC gasket seals 131 are placed with adhesive tape within the retainer stop 420 at the upper portion of the door frame 20. For example, the one or more upper frame primary EMC gasket seals 510 are assembled such that they fit within the notches 520 of the side frame primary EMC gasket seals 510. It should be understood that in some embodiments (e.g., depending on the location of the notches on the gasket seals 130), the upper frame primary EMC gasket seal 510 may be installed before and/or during the installation of the side frame primary EMC gasket seals 510. The one or more upper frame secondary EMC gasket seals 560 may be installed over the one or more side frame secondary EMC gasket seals 560 (or vice versa). Alternatively, the one or more secondary EMC gasket seals 560 may utilize miter notches to install the secondary EMC gasket seal 560 around a corner of the door frame 20.

Block 240 of FIG. 18 further illustrates that when the door assembly is a double door assembly, the EMC seals 100 are installed on the mullion 48 of the double door assembly. For example, finger stock seals 110 are installed below the header finger stock seal and down to the threshold 40. The finger stock seals 110 installed on the mullion 48 have the point of the "V-shaped" seals facing toward the door opening and away from each other. In other embodiments, a single finger stock seal 110 that is similar to two finger stock seals 110 described herein may be installed (e.g., two V-shaped or triangular shaped seals that are connected at the first legs 112, or the like). Additionally, or alternatively, EMC gasket seals 130 may be installed on the mullion 48 in the same or similar way as previously described herein. Additionally, or alternatively, the astragal assembly 470 may be installed to the double doors 50 as previously described herein.

FIG. 18 further illustrates in block 250 that EMC elements 180 may be used on the door frame 20 and/or the threshold 40. For example, EMC tape 182 may be utilized in the door assembly 1. For example, once the door frame 20 has been properly installed into the door opening 8 and secured, EMC tape 182 (e.g., copper tape, or the like) may be placed around the door frame 20 perimeter. For example, the EMC tape 182 may extend over the edge of the door frame and overlap the adjacent wall 10, on at least one (in some embodiments) or both sides of the door frame 20 (e.g., external and internal sides of the door assembly 1). For example, the EMC tape 182 may be approximately 2 inches wide and be utilized such that ¾ to 1 inch of tape covers the edge of the door frame 20 and 1 to 1¼ inches of tape cover the wall 10. Where the ends of the tape meet (e.g., where the door frame sides 26, 28 meet the upper door frame 24, or the like) the end of the tape joints should overlap to ensure no gaps are present. Furthermore, the installer should press the EMC tape 184 firmly into both surfaces (e.g., on the door frame 20, the wall 10, or the like) to provide maximum contact and adhesion. In some embodiments, a plastic tool (e.g., approximately the size and shape of a credit card, a credit card or similar card, or other the like tool) may be used to assist with the EMC tape 182 installation and smoothing on the frame 20 and wall 10 surface. Additionally, or alternatively, EMC caulk 182 may be used to fill in any holes, gaps, or the like between the door frame 20 components, the threshold 40, the wall and/or other components in the door assembly 1.

Block 260 in FIG. 18 illustrates that the EMC seal 100 is also installed to the bottom edge 68 of the door 50 and/or to the threshold 40. For example, the EMC seal 100 at the bottom edge 68 of the door 50 and/or at the threshold 40 may be same as the EMC seals 100 discussed with respect to blocks 220 and 230. However, in some embodiments, the EMC seal 100 used on the bottom edge 68 of the door 50 and/or threshold 40 may be a composite finger stock seal 120, as described herein. The composite finger stock seal 120 may be utilized in order to maintain the shape of the finger stock seal 120 when the door is open and/or to provide improved contact between the bottom edge 68 of the door 50 and/or the threshold 40. That is, a gasket seal 130 within the finger stock seal 110 of the composite finger stock seal 120 aids in returning the finger stock seal 120 to its uncompressed form when the door is open so that when the door 50 is closed the composite finger stock seal 120 properly covers the space between the bottom edge 68 of the door 50 and the threshold 40, and maintains the EMC circuit between the bottom edge 68 of the door 50 and the threshold 40. Additionally, or alternatively, the EMC seal 100 may be installed as a door shoe assembly 440 and/or a dynamic seal assembly 460 as previously discussed herein.

Finally, as illustrated in block 260 of FIG. 18 the door 50 is installed to the door frame 30. In some embodiments, before during or after installing the door 50 to the door frame (e.g., using the cam hinges 92, or other type of hinge 90), the EMC trim 70 may be installed on the door 50. It should be understood that the door trim may be installed before the door 50 shipped, before the door 50 is operatively coupled to the door frame 20, and/or after the door 50 is installed to the door frame 20. While the door itself may provide EMC shielding, such as due to the thickness of the door 50 and/or the material of the door 50, the door 50 may require the use of EMC coatings (e.g., liquid that hardens, paint, primer, solids, films, or the like that have EMC properties, particles therein that have EMC properties, or the like) and door trim 70 that provides EMC shielding in order to create the EMC shielding circuit between the door 50, the EMC seals 100, and/or the door frame 20. That is, in some embodiments, without the use of the door trim, the EMC shielding may have an uncompleted EMC circuit that allows signals to pass between the door and the EMC seals 100. As previously discussed herein, the door 50 may be made out of material (e.g., stainless steel), which may not require the use of the door trim 70, and the door itself may maintain the EMC circuit with the EMC seals 100.

As discussed herein the door assembly 1 may be an electromagnetic compatibility (EMC) rated door system (e.g., provides electromagnetic interference (EMI), radio frequency interference (RFI), microwave, or the like shielding). The EMC shielding is used to restrict (e.g., reduce, eliminate, or the like) the passing of radio waves, electromagnetic fields, and electrostatic fields into and/or outside of the room. EMC materials for EMC shielding may include copper, silver, nickel, aluminum, stainless steel, other types of steel, or other conductive material that would maintain an EMC shielding circuit. Typical shielding materials used for an EMC coating, such as a fluid (e.g., liquid, mist, gas, or the like) having a suitable EMC shielding material, typically copper, silver, nickel, aluminum, or the like, or combinations thereof, in the form of particles suspended in the fluid. The EMC coating may be applied to a surface, and thereafter dries, to form the EMC shielding. Alternatively, the EMC shielding may be an EMC shielding barrier (e.g., fabric-wrapped foam, wire mesh, stamped metal, elastomer, adhesive, glue, resin, epoxy, tape, caulk, or the like) that may be applied to a surface or between surfaces. For example, the EMC shielding barrier may be a copper layer, copper screen, aluminum layer, or the like in order to absorb the radio and magnetic waves.

EMC shielding may be used in many different applications, such as in healthcare rooms (e.g., MRI rooms, or the like), IT/data storage facility protection, government buildings (e.g., embassies, department of state, secret service, or the like), military applications, businesses, labs, emergency call centers, sensitive electronic installations, security facilities, financial centers, RFID scanning locations, or the like. As such, EMI shielding may be used to help avoid computer crashes, protect sensitive electronic equipment, protect storage of confidential information, avoid interference from RF transmitters (e.g., from radio towers, TV broadcast, airport radar, test equipment, or the like), and/or other like applications.

Frequencies at which electromagnetic radiation of energy occurs is as follows: at very low frequencies: −30 kHz, low: 30 to 300 kHz; medium frequencies: 300 to 3,000 kHz; high frequencies: 3 to 30 MHz, very high frequencies: 30 to 300 MHz, ultrahigh frequencies: 300 to 3,000 MHz, superhigh frequencies: 3 to 30 GHz, and extremely high frequencies: 30 to 300 GHz. Typical EMC shielding shields from approximately 40 dB to 100 dB from 9 kHz to 18 GHz; however, it should be understood that EMC shielding may occur within these ranges, overlap these ranges, or fall outside of these ranges. EMC shielding protection can support IEEE 299 levels (occurring at time of filing), TEMPEST standards (occurring at the time of filing), or the like. The relative capability of a shield to screen out undesirable electric and magnetic fields and plane waves is the ratio of the signal received without the shield to the signal received inside the shield.

A room that is designed for EMC shielding typically has shielding in the walls 10, doors 50, ceiling, floor, frames 20, or the like. Moreover, the EMC shielding may be utilized, such as by forming a component from EMC material, covering a component in one or more layers (e.g., sheets, or the like) of an EMC material, coating a component with a fluid (e.g., liquid, mist, gas, or the like) that has EMC material particles suspended therein, or the like. It should be understood, breaks in the shielding reduce the effectiveness of the EMC shielding. As such, in order to use provide the EMC shielding in the present embodiments the components of the door assembly 1 incorporate the EMC shielding in one or more ways, such as in the wall 10, in the door frame 20, in the EMC seals 100, in the door 50, door trim 70, or the like and/or utilize EMC elements 180 to fill in gaps between these components.

With respect to door frames 20, door 50, wall 10, and/or floor, these components may be made from an EMC material (e.g., aluminum, steel, stainless steel, or the like), conductive non-metal (e.g., composites, hybrids, 3D printed material, or the like that provide EMC material), or non-conductive material (e.g., composites, wood, hybrids, or the like), or combinations thereof. In particular embodiments, the door frames 20, door 50, wall 10, and/or floor may include or be made from 430SS (e.g., no nickel, which can be primed, painted, or receive another coating), 304SS (e.g., includes nickel, provides corrosion resistance), 316SS (e.g., includes higher levels of nickel, provides higher levels of corrosion resistance). Moreover, the door frame 20, door 50, wall 10, and/or floor may have a painted EMC shielding coating that may be applied as a paint, liquid that hardens, a film, sheet, solid, or the like, which may be made from cooper, silver, nickel, steel, or the like metal conductive material, other type of conductive material, particles in a conductive or non-conductive material, or combinations thereof. For example, door frame 20 and/or door 50 may be made from EMC material and/or covered with a painted EMC shieling coating. It should be understood that EMC shielding material may be included on one side or both sides of the door frame 20, door 50, and/or wall 10. In order to maintain the effectiveness of the EMI shielding, the EMC seals 100 (e.g., fabric-wrapped foam, wire mesh, stamped metal, elastomer, or the like) and/or EMC elements 180 (e.g., adhesive, glue, resin, epoxy, tape, caulk, or the like) may be applied to the door frame 20, door 50, and/or wall 10, and/or the components thereof. For example, the EMC elements 180, such as an EMC caulk 184, may be used on the edges of the frame 20 (e.g., to the wall 10, or the like) to maintain the EMC circuit between the frame 20 and the wall 10. The EMC (e.g., EMI/RFI shielded) doors 50 and frames 20 may be made of stainless steel or other alternate component materials and/or layers that provide enhanced EMC shielding effectiveness.

In order to maintain the EMC shielding between the door frame 20 and the door 50 in the door assembly 1, the door 50 may have shielding on the faces 52, 54 (e.g., first face, second face, or the like) and/or formed as one or more layers within the door 50, as well as on the edges 60 of the door 50 (e.g., an upper edge 62—top edge, or the like—, a first side edge 64—a hinge edge—, a second side edge 66—a lock edge—, and a lower edge 68—a bottom edge—). The EMC shielding may be the painted EMC shielding coating; however, it could be the EMC shielding layers (e.g., copper layer, or the like) described above. Furthermore, one or more EMC seals 100 may be used between the door frame 20 and the door 50 that are made of and/or covered in an EMC material in order to improve the EMC shielding circuit between the door frame 20 and the door 50.

Different types of materials may be utilized in order to provide the EMC shielding. For example, in some embodiments paper (e.g., synthetic paper, laminated paper, or the like) that provides durability, printability, and/or EMC shielding may be utilized in the door assembly 1 (e.g., on the door 50 and/or on the door frame 20). The paper can be folded, molded, stitched, glued, perforated, stretched, or the like, which allows for all different types of installation options. Furthermore, the door assembly 1, such as in the door frame 20, door 50, and/or the EMC seals 100, may utilize a liquid applied deadener, which may provide a low-VO waterborne formula liquid, an epoxy-based liquid, liquid PVC, or the like that hardens into a coating that may be used to provide EMC shielding. Moreover, a sprayable coating may be used that hardens after being applied (e.g., within minutes, tens of minutes, hours, or the like) to provide EMC shielding. In other embodiments, adhesives may be used to operatively couple components of the door assembly 1 while maintaining EMC shielding (e.g., adhere to steel, aluminum, or other types of EMC shielding materials, and/or EMC coatings). EMC sealants may be used to provide EMC shielding. It should be understood that any of the materials discussed herein may also provide sound abatement, fire resistance, thermal performance, energy harvesting, improvements to strength and durability of the door assembly 1, or the like. Moreover, the materials, such as the EMC sealants may be weldable, corrosion resistant, and/or have other properties for certain EMC applications.

It should be understood that the embodiments of the present invention provide improved EMC shielding for the door assembly 1. However, it should be understood that alternatively, or additionally, the EMC shielding security features of the door system 1 may be replaced by, or may also provide, other security features. For example, the security features may include FEBR protection (e.g., forced entry, ballistic, blast, or the like protection), sound abatement, fire and/or smoke protection, air flow reduction, or the like, and/or combinations of any of the foregoing. For example, the door assembly 1 may include insulation to aid in reducing heat transfer, sound passage, or the like. As such, in some embodiments, a cavity formed within the door frame 20, the door 50, and the wall 10 may be filled with material, coatings, layers, or the like that provide EMC shielding, sound transmission class (STC) ratings (e.g., up to 50, 52, 54, 56, 58, 60, or the like STC rating), fire resistive (e.g., 1, 2, 3, or the like hours), insulative, or the like properties. Moreover, in some embodiments the door 50 and/or door frame 20 may protect against forced entry (FE) and/or bullet resistant (BR) (otherwise described as FEBR doors openings) by using ballistic resistant materials such as steel armor, composite BR fiberglass, Kevlar, BR composites, woven layers, or other like materials as part of the door 50 and/or door frame 20 components.

As such, the door assembly 1 may provide for EMC protection, sound abatement, thermal protection, air restriction, fire rating, or other security features, as described herein. As such, the frame 20 (e.g., on the surface, or the inside of the frame 20) and the door 50 (e.g., faces, or the inside of the door 50) may have one or more layers of material in order to provide the desired security features and/or aesthetic decorative features. For example, the frame 20 and/or the door 50 may have film, paint, coatings, a printed surface (e.g., ink, laser, or the like), fabric, or the like layers of material that provide security features and/or aesthetic decorative features.

It should be understood that the security features, may be applied to the frame 20 (e.g., a single unitary frame, the individual frame segments, or the like) and/or the door 50 as one or layers of material (e.g., as a liquid or a solid). For example, the one or more layers of material (e.g., EMC shielding, thermal, sound abatement, air restriction, or the like layer) may be applied to one or more surfaces of the frame 20, such as the jamb, faces, stops, flanges, or the like depending on the configuration and the desired security features.

The door 50 and/or door frames 20 of the present disclosure may provide outstanding resistance to and protection from a variety of physical impacts by projectiles. In particular, the fiber layers, plastics, composites, steel, or the like may be structured to provide various UL level protection from ballistic projectiles (e.g., firearm, or the like) and also protection from other projectiles such as debris or shrapnel. As such, the door assembly 1 may provide the desired FE (forced entry) and/or BR (Bullet Resistant) properties. For example, the door 12 and/or door frame 12 may have UL752 Level 1 (9 mm handgun) to UL 752 Level 10 (.50 Caliber Rifle) protection, and in particular embodiments UL752 level 1 (9 mm), UL752 level 2 (.357 Magnum), UL752 level 3 (.44 Magnum), UL752 level 4 (.30 Caliber Rifle), UL752 level 5 (7.63 Caliber Rifle) UL752 level 6 (9 mm Rifle), UL752 level 7 (5.56 mm), UL752 level 8 (7.62 mm), UL752 level 9 (0.30-06 rifle), UL752 level 10 (0.50 caliber rifle), or the like protection (e.g., as defined at the time of filing this application), or have protection that ranges between, overlaps, or falls outside of these levels of protection. Furthermore, the door 12 and/or door frame 20 may also be rated to withstand 5, 10, 15, 20, 25, 30, 40, 50, 60, or the like minutes of simulated "mob" attack, or range between, overlap, or fall outside of these levels of protection. In some embodiments of the invention, the fiber layers, such as fabric layers of basalt woven fabric, other similar material may be used to provide the protection. In some embodiments of the invention, the fiber layers may be plastic layers of UHMWPE (ultra-high-molecular-weight-polyethylene). In some embodiments of the invention, the one or more projectile resistant layers may comprise other types of materials, such as, but not limited to Kevlar or other Bullet resistant fabrics (e.g., woven fabric, non-woven fabric, knitted fabric, other fabrics, or the like) or bullet resistant plastic that provide the same or similar protection as described with respect to the fiber layers. The protective or filler layers (e.g., within the core of the door between the faces the door) and materials for the door frame 20 and/or door 20 can be added separately, or may be bonded together using structural adhesives, resins, heat, mechanical or other similar means.

Furthermore, the door frame 20 and/or door 50 may include fill material, which in some embodiments provides an insulated core to at least a portion of the door assembly 1. While the fill material may generally be described as being a polystyrene sheet or other type of structure (e.g., loose material, or the like), it should be understood that the fill material may be any type of material (e.g., lightweight, or the like), such as, but not limited to a polyisocyanurate, polyurethane, fiberglass, cellulose, mineral wool, kraft paper (e.g., structural, or the like), plastics, polycarbonates, vermiculite, perlite, cementitious foam (e.g., magnesium oxide, such as magnesium silicate), phenolic foam, bio-based, or other like material. Regardless of the fill material, it may provide structural, protective, sound transmission prevention, fire resistance or fire proofing, or the like properties. In some embodiments the fill material may also have projectile resistance (e.g., firearm, blast, weather related resistance—wind, projectile, or the like, mob attack) and/or may have other properties that provide chemical resistance, radio frequency resistance, electromagnetic resistance, or the like.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and should not be interpreted in an idealized or overly formal sense unless expressly so defined herein. Certain terminology is used herein for convenience only and is not to be taken as a limitation on the invention. For example, words such as "distal," "proximal," "upper," "top," "bottom," "lower," "left," "right," "horizontal," "vertical," "upper," and "lower", or other like terminology merely describe the configuration shown in the figures. The referenced components may be oriented in an orientation other than that shown in the drawings and the terminology, therefore, should be understood as encompassing such variations unless specified otherwise.

It will be understood that when an element is referred to as "operatively coupled" to another element, the elements can be formed integrally with each other, or may be formed separately and put together. Furthermore, "operatively coupled" to can mean the element is directly coupled to the other element, or intervening elements may be present between the elements. Furthermore, "operatively coupled" may mean that the elements are detachable from each other, or that they are permanently operatively coupled together.

When components are described as being parallel or perpendicular to other components, it should be understood that this may encompass the components being exactly parallel or perpendicular, or generally parallel or perpendicular in which the components deviate from exactly parallel or perpendicular (e.g., +/−1, 2, 4, 6, 8, 10, 15, 20, 25, or the like degrees from exactly parallel or perpendicular).

Although specific embodiments have been illustrated and described herein, those of ordinary skill in the art appreciate that any arrangement which is calculated to achieve the same purpose may be substituted for the specific embodiments shown and that the invention has other applications in other environments. This application is intended to cover any adaptations or variations of the present invention. The following claims are in no way intended to limit the scope of the invention to the specific embodiments described herein.

What is claimed is:

1. A door assembly for providing electromagnetic compatibility (EMC) shielding, the door assembly comprising:
   a door frame operatively coupled within a door opening;
   a door comprising a first face, a second face, and edges between the faces, wherein one edge is operatively coupled to the door frame; and
   a seal assembly comprising one or more EMC seals operatively coupled to the door frame or the door, wherein the one or more EMC seals at least comprise two or more EMC gasket seals, wherein the two or more EMC gasket seals comprise;
   a first EMC gasket seal comprising:
      a proximal end having a first notch extending at least partially into a first body of the first EMC gasket seal;
   a second EMC gasket seal comprising:
      at least one distal end having a second notch extending at least partially into the second EMC gasket seal; and
   wherein the first notch of the first EMS gasket seal receives a second body portion of the second EMC gasket seal, and the second notch of the second EMC gasket seal receives a first body portion of the first EMC gasket seal; and
   wherein the first EMC gasket seal and the second EMC gasket seal overlap to aid in restricting separation of the first EMC gasket seal and the second EMC gasket seal when compressed.

2. The door assembly of claim 1, wherein the two or more EMC gasket seals comprise:
   a cover, wherein the cover comprises a fabric made of an EMC material; and
   a core, wherein the core comprises a foam core;
   wherein the cover is operatively coupled over the core.

3. The door assembly of claim 2, wherein the cover is operatively coupled to the core through a heat shrink adhesive.

4. The door assembly of claim 1, wherein the two or more EMC gasket seals further comprise:

a first projection extending from a first body of the first EMC seal; and a second EMC seal comprising a second projection extending from a second body.

5. The door assembly of claim 1, wherein the two or more EMC gasket seals comprise two or more primary EMC gasket seals, and wherein the gasket seal assembly further comprises one or more secondary EMC gasket seals comprising:

a mount gasket leg; and a flexible gasket leg operatively coupled to the mount gasket leg;

wherein a mount portion of the mount gasket leg contacts a portion of the one or more primary EMC gasket seals;

wherein a flexible portion of the flexible gasket leg contacts another portion of the one or more primary EMC gasket seals when the door is closed; and wherein two points of contact are created between the one or more primary EMC gasket seals and the one or more secondary EMC gasket seals.

6. The door assembly of claim 5, wherein the one or more secondary EMC seals comprise:

a first secondary EMC seal; and a second secondary EMC seal;

wherein a portion of the first secondary EMC seal overlaps a portion of the second secondary EMC seal.

7. The door assembly of claim 5, wherein the one or more secondary EMC seals comprise:

a secondary EMC seal having a mitered notch, wherein the secondary EMC seal is bent around the mitered notch to form a continuous secondary EMC seal.

8. The door assembly of claim 1, wherein the one or more EMC seals further comprise one or more EMC finger stock seals.

9. The door assembly of claim 8, wherein the one or more EMC finger stock seals comprise at least one EMC composite seal comprising:

an EMC finger stock seal; and an inner seal located within at least a portion of the EMC finger stock seal.

10. The door assembly of claim 9, wherein the EMC composite seal is used as an EMC threshold seal between the door and a threshold.

11. The door assembly of claim 9, wherein the inner seal comprises an o-seal, an oval seal, a D-shaped seal, a square seal, or a rectangle seal.

12. The door assembly of claim 9, wherein the EMC finger stock seal comprises:

a first finger leg; and a second finger leg;

wherein the first finger leg and the second finger leg are operatively coupled at respective first ends to form a V-shaped seal.

13. The door assembly of claim 12, wherein the second finger leg comprises a plurality of fingers that create a plurality of slits between adjacent fingers, wherein the plurality of fingers are configured to flex with respect to each other.

14. The door assembly of claim 12, wherein the EMC finger stock seal further comprises:

a third finger leg extending from a second end of the second finger leg to form a triangular shaped finger stock seal with an opening formed by a second end of the third finger leg and a second end of the first finger leg.

15. The door assembly of claim 1, wherein the door assembly provides EMC shielding effectiveness of 40-100 dB per IEEE 299-2006 (9 kHz-18 GHz).

16. A seal assembly for providing electromagnetic compatibility shielding (EMC) to a door assembly, the seal assembly comprises two or more EMC gasket seals comprising:

a first EMC gasket seal comprising:

a proximal end having a first notch extending at least partially into a first body of the first EMC gasket seal;

a second EMC gasket seal comprising:

at least one distal end having a second notch extending at least partially into the second EMC gasket seal; and wherein the first notch of the first EMS gasket seal receives a second body portion of the second EMC gasket seal, and the second notch of the second EMC gasket seal receives a first body portion of the first EMC gasket seal;

wherein the two or more gasket seals comprise:

a cover, wherein the cover comprises a fabric made of an EMC material; and a core, wherein the core comprises a foam core;

wherein the cover is operatively coupled over the core; and wherein the door assembly comprising a door frame operatively coupled within a door opening, and a door comprising a first face, a second face, and edges between the faces, wherein the door is operatively coupled to the door frame, and wherein seal assembly is configured to be operatively coupled to the door frame or the door such that the first EMC gasket seal and the second EMC gasket seal overlap to aid in restricting separation of the first EMC gasket seal and the second EMC gasket seal when compressed between the door and the door frame.

17. A method of installing a door assembly that provides electromagnetic compatibility (EMC) shielding, the method comprising:

installing a door frame within a door opening;

installing a door to the door frame, wherein the door comprises a first face, a second face, and edges between the faces, wherein the door is configured to be operatively coupled to the door frame;

installing a seal assembly comprising one or more EMC seals to the door frame or the door, wherein the one or more EMC seals at least comprise two or more EMC gasket seals, wherein the two or more gasket seals comprise;

a first EMC gasket seal comprising:

a proximal end having a first notch extending at least partially into a first body of the first EMC gasket seal;

a second EMC gasket seal comprising:

at least one distal end having a second notch extending at least partially into the second EMC gasket seal; and wherein the first notch of the first EMS gasket seal receives a second body portion of the second EMC gasket seal, and the second notch of the second EMC gasket seal receives a first body portion of the first EMC gasket seal; and wherein the first EMC gasket seal and the second EMC gasket seal overlap to aid in restricting separation of the first EMC gasket seal and the second EMC gasket seal when compressed.

\* \* \* \* \*